(12) United States Patent
Hirose et al.

(10) Patent No.: US 9,349,587 B2
(45) Date of Patent: *May 24, 2016

(54) METHOD OF MANUFACTURING SEMICONDUCTOR DEVICE AND METHOD OF PROCESSING SUBSTRATE AND SUBSTRATE PROCESSING APPARATUS

(71) Applicant: Hitachi Kokusai Electric Inc., Tokyo (JP)

(72) Inventors: Yoshiro Hirose, Toyama (JP); Atsushi Sano, Toyama (JP); Kazuyuki Okuda, Toyama (JP); Kiyohiko Maeda, Toyama (JP)

(73) Assignee: Hitachi Kokusai Electric Inc., Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/044,358

(22) Filed: Oct. 2, 2013

(65) Prior Publication Data
US 2014/0038429 A1 Feb. 6, 2014

Related U.S. Application Data

(63) Continuation of application No. 13/405,750, filed on Feb. 27, 2012, now Pat. No. 8,575,042.

(30) Foreign Application Priority Data

Feb. 28, 2011 (JP) .................................. 2011-041896
Feb. 1, 2012 (JP) .................................. 2012-019713

(51) Int. Cl.
*H01L 21/31* (2006.01)
*H01L 21/02* (2006.01)
(Continued)

(52) U.S. Cl.
CPC .......... *H01L 21/0217* (2013.01); *C23C 16/345* (2013.01); *C23C 16/45534* (2013.01);
(Continued)

(58) Field of Classification Search
None
See application file for complete search history.

(56) References Cited

U.S. PATENT DOCUMENTS 7,625,609 B2 * 12/2009 Matsuura ....................... 427/579
7,632,757 B2 12/2009 Matsuura
(Continued)

FOREIGN PATENT DOCUMENTS

JP 2006-041337 A 2/2006
JP 2006-241521 A 9/2006
(Continued)

OTHER PUBLICATIONS

Japanese Office Action, JP Application No. 2012-019713, Oct. 30, 2015, 3 pages (English translation provided).

*Primary Examiner* — Reema Patel
(74) *Attorney, Agent, or Firm* — Volpe and Koenig, P.C.

(57) ABSTRACT

In a low-temperature, a silicon nitride film having a low in-film chlorine (Cl) content and a high resistance to hydrogen fluoride (HF) is formed. The formation of the silicon nitride film includes (a) supplying a monochlorosilane ($SiH_3Cl$ or MCS) gas to a substrate disposed in a processing chamber, (b) supplying a plasma-excited hydrogen-containing gas to the substrate disposed in the processing chamber, (c) supplying a plasma-excited or heat-excited nitrogen-containing gas to the substrate disposed in the processing chamber, (d) supplying at least one of a plasma-excited nitrogen gas and a plasma-excited rare gas to the substrate disposed in the processing chamber, and (e) performing a cycle including the steps (a) through (d) a predetermined number of times to form a silicon nitride film on the substrate.

19 Claims, 22 Drawing Sheets

(51) Int. Cl.
*C23C 16/34* (2006.01)
*C23C 16/455* (2006.01)
*H01L 21/311* (2006.01)

(52) U.S. Cl.
CPC ..... *C23C16/45542* (2013.01); *C23C 16/45546* (2013.01); *H01L 21/0228* (2013.01); *H01L 21/0234* (2013.01); *H01L 21/02219* (2013.01); *H01L 21/02266* (2013.01); *H01L 21/02274* (2013.01); *H01L 21/31111* (2013.01)

(56) References Cited

U.S. PATENT DOCUMENTS

| | | | |
|---|---|---|---|
| 8,329,536 B2 | 12/2012 | Noda | |
| 8,575,042 B2* | 11/2013 | Ota et al. | 438/792 |
| 2008/0274605 A1 | 11/2008 | Hoshi et al. | |
| 2009/0087964 A1* | 4/2009 | Maeda et al. | 438/482 |
| 2009/0159430 A1 | 6/2009 | Gonohe et al. | |
| 2010/0167543 A1 | 7/2010 | Kim | |
| 2010/0186898 A1 | 7/2010 | Fukushima et al. | |
| 2010/0233887 A1 | 9/2010 | Miya et al. | |
| 2010/0300357 A1 | 12/2010 | Yamamoto et al. | |
| 2010/0304047 A1* | 12/2010 | Yang | C23C 16/308 427/577 |
| 2011/0129619 A1 | 6/2011 | Matsunaga et al. | |
| 2011/0132543 A1* | 6/2011 | Yu | 156/345.35 |

FOREIGN PATENT DOCUMENTS

| | | |
|---|---|---|
| JP | 2009-152640 A | 9/2009 |
| JP | 2010-226084 A | 10/2010 |
| JP | 2011-009699 A | 1/2011 |
| JP | 2011-061037 A | 3/2011 |
| KR | 10-2007-0116923 A | 12/2007 |
| KR | 10-2010-0079200 A | 7/2010 |
| KR | 10-2011-0019445 A | 2/2011 |
| WO | 2006/088062 A1 | 8/2006 |
| WO | 2009/149167 A2 | 12/2009 |

* cited by examiner

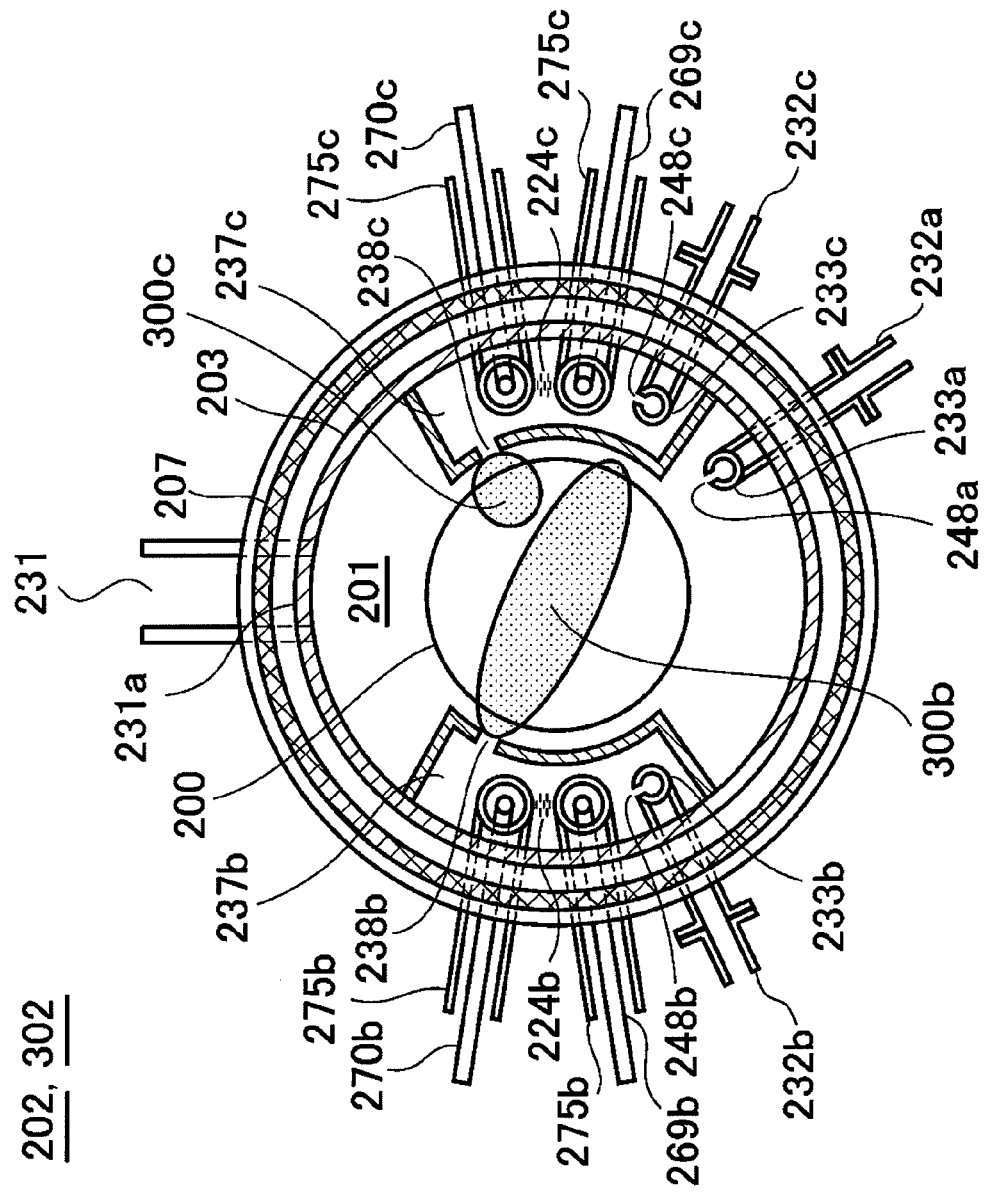

US 9,349,587 B2

METHOD OF MANUFACTURING SEMICONDUCTOR DEVICE AND METHOD OF PROCESSING SUBSTRATE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2011-041896 filed on Feb. 28, 2011 and No. 2012-019713 filed on Feb. 1, 2012 in the Japanese Patent Office, and is a continuation application of U.S. patent application Ser. No. 13/405,750 filed on Feb. 27, 2012, the entire contents of which are hereby incorporated by reference.

BACKGROUND OF THE INVENTION

1. Field of the Invention

The present invention relates to a method of manufacturing a semiconductor device including a process of forming a thin film on a substrate, a method of processing a substrate, and a substrate processing apparatus and program preferably used in the method of processing the substrate.

2. Description of the Related Art

A silicon nitride (SiN) film has a high resistance to hydrogen fluoride (HF). Thus, the silicon nitride film may be used as an etch stopper layer during the etching of a silicon oxide (SiO) film in a manufacturing process of a semiconductor device, such as a large scale integration (LSI) device, a static random access memory (SRAM) device, or a dynamic random access memory (DRAM) device. For example, in a sidewall spacer (SWS) of a tri-layer lightly doped drain (LDD) structure in which a silicon nitride film and a silicon oxide film are stacked on a sidewall of a gate, the silicon nitride film is used as an etching stopper layer during a dry etching process owing to physical strength thereof. Also, even when a contact layer configured to connect an interconnection line and a transistor is formed, the silicon nitride film is used as an etching stopper layer during a dry etching process. Furthermore, a dry etching process is frequently followed by a wet etching process using a hydrogen fluoride-containing solution during which the silicon nitride film is also used as an etching stopper layer. Thus, the silicon nitride film used as the etching stopper layer requires a high resistance to hydrogen fluoride.

In addition, to prevent an increase in deviation of resistance of a gate electrode or diffusion of a dopant, after a gate electrode is formed, a silicon nitride film needs to be formed at a low temperature. For example, after the gate electrode is formed, the formation of the silicon nitride film needs to be performed at a temperature lower than a temperature of about 760° C. at which a film is formed using a conventional low-pressure chemical vapor deposition (LPCVD) process or a temperature of about 550° C. at which a film is formed using an atomic layer deposition (ALD) process. In particular, in a process of manufacturing a semiconductor device using a nickel silicide (NiSi) film as a gate, a source, and a drain, the formation of a silicon nitride film needs to be performed at a temperature of about 400° C. or less to suppress application of a thermal load to the nickel silicide film.

SUMMARY OF THE INVENTION

The above-described silicon nitride film may be formed by supplying a silicon (Si)-containing gas and a nitrogen (N)-containing gas to a substrate heated to a predetermined film-forming temperature. However, when the film-forming temperature is adjusted to a low temperature, a chlorine (Cl) content of the silicon nitride film may be increased. In particular, when a silicon nitride film is formed using an atomic layer deposition (ALD) technique, a chlorine desorption reaction is performed using an endothermic reaction, so that as a film-forming temperature is reduced, it becomes easier for chlorine to remain in the film. Since chlorine remaining in the film easily reacts with water ($H_2O$), natural oxidation of the silicon nitride film may be affected or a resistance of the silicon nitride film to hydrogen fluoride (HF) may be reduced.

A method of improving a resistance to hydrogen fluoride by introducing carbon (C) into a silicon nitride film may also be considered. However, it has been difficult to introduce carbon into the silicon nitride film in a low-temperature region of, for example, about 400° C. or less. Also, since carbon introduced into the silicon nitride film may lead to structural defects, an insulation resistance of the silicon nitride film may be degraded. For these reasons, it has been difficult to apply the silicon nitride film into which carbon is introduced to a sidewall spacer interposed between electrodes.

It is an object of the present invention to provide a method of fabricating a semiconductor device, a method of processing a substrate, a substrate processing apparatus, and a program, which can form a silicon nitride film having a low in-film chlorine content in a low-temperature region and having a high resistance to hydrogen fluoride.

According to one aspect of the present invention, there is provided a method of manufacturing a semiconductor device, including: (a) supplying a silane gas from one or more nozzles to a substrate disposed in a processing chamber, the silane gas having one chlorine atom in its compositional formula; (b) supplying a hydrogen-containing gas plasma-excited by one or more excitation units from each of the one or more excitation units to the substrate disposed in the processing chamber; (c) supplying a nitrogen-containing gas plasma-excited or heat-excited by one or more excitation units from each of the one or more excitation units to the substrate disposed in the processing chamber; (d) supplying at least one of a nitrogen gas and a rare gas plasma-excited by one or more excitation units from each of the one or more excitation units to the substrate disposed in the processing chamber; and (e) performing a cycle including the steps (a) through (d) a predetermined number of times to form a silicon nitride film on the substrate.

According to another aspect of the present invention, there is provided a method of manufacturing a semiconductor device, including: (a) supplying a silane gas from one or more nozzles to a substrate disposed in a processing chamber, the silane gas having one chlorine atom in its compositional formula; (b) supplying a hydrogen-containing gas plasma-excited by one or more excitation units from each of the one or more excitation units to the substrate disposed in the processing chamber; (c) supplying a nitrogen-containing gas plasma-excited by one or more excitation units from each of the one or more excitation units to the substrate disposed in the processing chamber; (d) supplying at least one of a nitrogen gas and a rare gas plasma-excited by one or more excitation units from each of the one or more excitation units to the substrate disposed in the processing chamber; and (e) performing a cycle including the steps (a) through (d) a predetermined number of times to form a silicon nitride film on the substrate.

According to still another aspect of the present invention, there is provided a substrate processing apparatus including: a processing chamber configured to accommodate a substrate; a first gas supply system configured to supply a silane gas from one or more nozzles to a substrate accommodated in the processing chamber, the silane gas having one chlorine atom in its compositional formula; a second gas supply system configured to supply a nitrogen-containing gas to a substrate accommodated in the processing chamber; a third gas supply system configured to supply a hydrogen-containing gas to a substrate accommodated in the processing chamber; a fourth gas supply system configured to supply at least one of a nitrogen gas and a rare gas to a substrate accommodated in the processing chamber; one or more excitation units configured to plasma-excite or heat-excite a gas; and a controller configured to control the first gas supply system, the second gas supply system, the third gas supply system, the fourth gas supply system and the excitation unit to perform a cycle including supplying the silane gas from the one or more nozzles to a substrate accommodated in the processing chamber, supplying the hydrogen-containing gas plasma-excited by one or more excitation units from each of the one or more excitation units to the substrate accommodated in the processing chamber, supplying the nitrogen-containing gas plasma-excited or heat-excited by one or more excitation units from each of the one or more excitation units to the substrate accommodated in the processing chamber and supplying at least one of the nitrogen gas and the rare gas plasma-excited by one or more excitation units from each of the one or more excitation units to the substrate accommodated in the processing chamber to form a silicon nitride film on the substrate.

According to yet another aspect of the present invention, there is provided a non-transitory computer-readable recording medium storing a program for causing a computer to execute the steps of: (a) supplying a silane gas from one or more nozzles to a substrate disposed in a processing chamber, the silane gas having one chlorine atom in its compositional formula; (b) supplying a hydrogen-containing gas plasma-excited by one or more excitation units from each of the one or more excitation units to the substrate disposed in the processing chamber; (c) supplying a nitrogen-containing gas plasma-excited or heat-excited by one or more excitation units from each of the one or more excitation units to the substrate disposed in the processing chamber; (d) supplying at least one of a nitrogen gas and a rare gas plasma-excited by one or more excitation units from each of the one or more excitation units to the substrate disposed in the processing chamber; and (e) performing a cycle including the steps (a) through (d) a predetermined number of times to form a silicon nitride film on the substrate.

The present invention can provide a method of manufacturing a semiconductor device, a method of processing a substrate, a substrate processing apparatus, and a program by which a silicon nitride film having a low in-film chlorine (Cl) content and a high resistance to hydrogen fluoride can be formed in a low-temperature region.

BRIEF DESCRIPTION OF THE DRAWINGS

FIG. 16A shows a case where a buffer chamber is attached to and installed in a side of an exhaust port, and FIG. 16B shows a case where the buffer chamber is installed in a side spaced apart from the exhaust port.

FIG. 17A shows a case where four buffer chambers are installed, and FIG. 17B shows a case where three buffer chambers are installed.

FIG. 18 is a top sectional view of a vertical processing furnace of a substrate processing apparatus preferably used in another embodiment of the present invention, which illustrates a shape of controlling balance of the distribution of active species supplied from a plurality of buffer chambers.

DETAILED DESCRIPTION OF THE PREFERRED EMBODIMENTS

Figure 1:
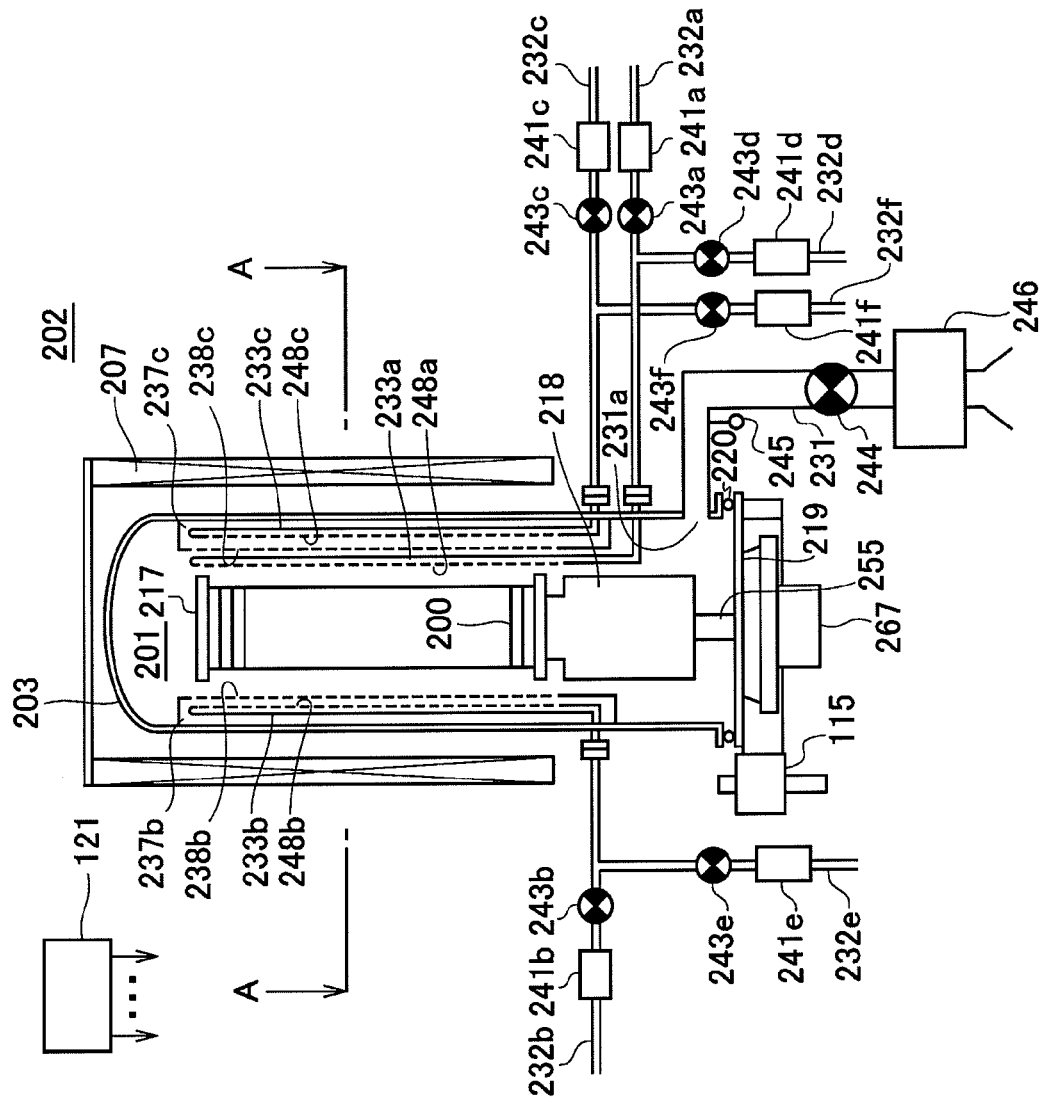
FIG. 1 is a schematic construction diagram of a vertical processing furnace of a substrate processing apparatus preferably used in a first embodiment of the present invention, which is a longitudinal sectional view of a portion of the processing furnace.

The present inventors have conducted research on a method of forming a silicon nitride ($Si_3N_4$) film on a low-temperature region. As a result, the present inventors have formed the opinion that it is possible to form a silicon nitride film having a low in-film chlorine (Cl) content and a high resistance to hydrogen fluoride (HF) on a substrate in a low-temperature region by alternately repeating a process of supplying a monochlorosilane ($SiH_3Cl$, which will be hereinafter referred to as "MCS") gas to the substrate accommodated in a processing chamber to form a silicon-containing layer on the substrate and a process of supplying a plasma-excited nitrogen ($N_2$)-containing gas from each of a plurality of excitation units to the substrate accommodated in the processing chamber to nitride the silicon-containing layer and change the silicon-containing layer into a silicon nitride layer.

The process of forming the silicon-containing layer uses MCS gas, which is a gas having a low chlorine content and a high surface absorptivity. Since MCS has a smaller number of chlorine atoms of a compositional formula (i.e., a smaller amount of chlorine per mol) than dichlorosilane ($SiH_2Cl_2$, which will be referred to as "DCS") or hexachlorodisilane ($Si_2Cl_6$, which will be referred to as "HCDS"), the amount of chlorine supplied into the processing chamber may be reduced. Thus, a ratio of chlorine combined with the silicon-containing layer (MCS-gas adsorption layer or silicon layer) to the silicon-containing layer (i.e., Si—Cl bonds) may be reduced, and a silicon-containing layer having a low chlorine content may be formed. As a result, a silicon nitride layer having a low chlorine content may be formed during the process of changing the silicon-containing layer into the silicon nitride layer.

In addition, Si—H bonds of the silicon-containing layer may be increased by reducing Si—Cl bonds of the silicon-containing layer. Since the Si—Cl bonds have a higher bonding energy than the Si—H bonds, the formation of the Si—N bonds, namely, the nitridation of the silicon-containing layer, may be precluded during the process of changing the silicon-containing layer into the silicon nitride layer. Conversely, since the Si—H bonds have a lower bonding energy than the Si—Cl bonds, the formation of the Si—N bonds, namely, the nitridation of the silicon-containing layer may be facilitated during the process of changing the silicon-containing layer into the silicon nitride layer. That is, a silicon-containing layer having small Si—Cl bonds and a low chlorine content may be formed, so that factors that hinder the nitridation of the silicon-containing layer may be reduced and the nitridation of the silicon-containing layer in step 3a may be facilitated. Also, by increasing the Si—H bonds of the silicon-containing layer, factors that facilitate the nitridation of the silicon-containing layer may be increased, and the nitridation of the silicon-containing layer may be further facilitated during the process of changing the silicon-containing layer into the silicon nitride layer. Thus, the efficiency of the nitridation of the silicon-containing layer may be increased during the process of changing the silicon-containing layer into the silicon nitride layer, and a processing time may be shortened by reducing a nitridation time.

In the process of changing the silicon-containing layer into the silicon nitride layer, a nitrogen-containing gas plasma-excited by a plurality of excitation units is supplied from each of the excitation units to nitride a silicon-containing layer. Thus, the amount of an active species (excited species) supplied to a substrate may be increased while outputting plasma of each of the excitation units at a low output power. Thus, nitriding power may be increased by suppressing plasma damage to a substrate or a silicon-containing layer, and nitridation efficiency may be increased by facilitating the nitridation of the silicon-containing layer. Thus, a nitridation time may be shortened to reduce a processing time. In addition, the silicon-containing layer may be nitrided while efficiently desorbing chlorine contained in the low chlorine-content silicon-containing layer formed in the process of forming the silicon-containing layer without applying plasma damage to the substrate or silicon-containing layer, and a silicon nitride layer having an extremely low chlorine content may be formed. Also, nitridation efficiency may be further improved by efficiently desorbing chlorine. That is, chlorine that hinders nitridation may be efficiently desorbed from the silicon-containing layer, thereby further improving nitridation efficiency.

Thus, a silicon nitride film having a low in-film chlorine content and a high resistance to hydrogen fluoride may be formed in a low-temperature region. Thus, the uniformity of film quality or film thickness may be improved in the surface of a substrate.

The present invention is performed based on the above-described opinion formed by the present inventors. Hereinafter, the embodiments of the present invention will be described with reference to the appended drawings.

First Embodiment of the Present Invention

Figure 2:
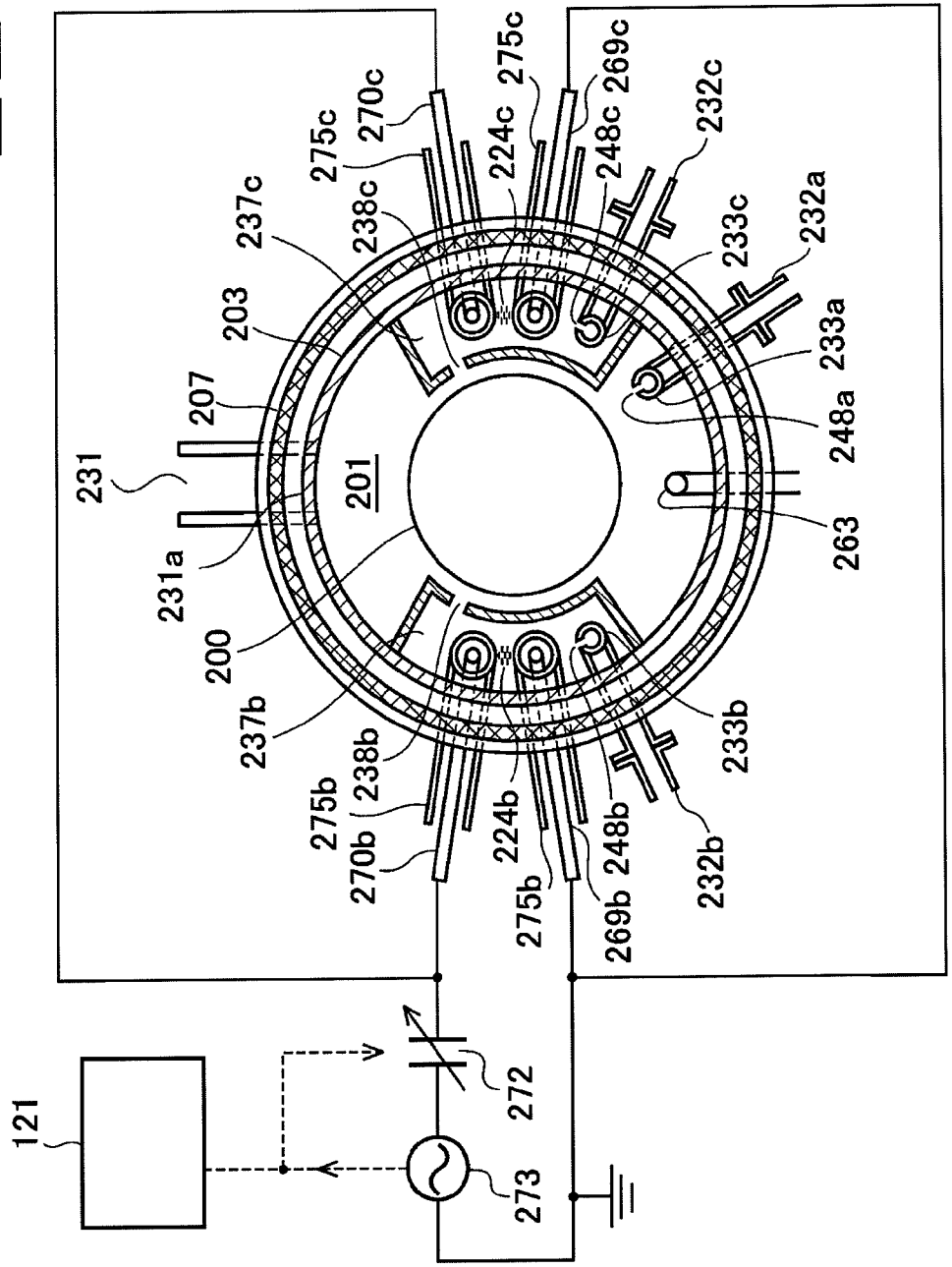
FIG. 2 is a schematic construction diagram of a vertical processing furnace preferably used in first and second embodiments of the present invention, which is a sectional view of a portion of the processing furnace, which is taken along line A-A.

FIG. 1 is a schematic construction diagram of a vertical processing furnace of a substrate processing apparatus preferably used in the present embodiment, which is a longitudinal sectional view of a portion of a processing furnace 202. Also, FIG. 2 is a schematic construction diagram of a vertical processing furnace preferably used in the present embodiment, which is a sectional view of a portion of the processing furnace 202, which is taken along line A-A of FIG. 1. Furthermore, the present invention is not limited to the substrate processing apparatus according to the present embodiment and may be preferably applied to a substrate processing apparatus including a single-wafer-type processing furnace, a hot-wall-type processing furnace, or a cold-wall-type processing furnace.

As shown in FIG. 1, the processing furnace 202 includes a heater 207 serving as a heating unit (heating mechanism). The heater 207 has a cylindrical shape and is supported by a heater base (not shown) serving as a holding plate and vertically installed. Also, the heater 207 functions as an activation mechanism (excitation unit) configured to activate (excite) gas and generate heat as will be described later.

A reaction tube 203 constituting a reaction container (processing container) is disposed concentrically with the heater 207 and installed inside the heater 207. The reaction tube 203 is formed of a heat-resistant material, for example, quartz ($SiO_2$) or silicon carbide (SiC). The reaction tube 203 has a stopped top end and a bottom end having an open cylindrical shape. A processing chamber 201 is formed in a hollow tube unit of the reaction tube 203, and wafers 200 serving as substrates may be aligned and accommodated by a boat 217 to be described later in a horizontal posture in a vertical direction in multi-stages.

A first nozzle 233a serving as a first gas introduction unit, a second nozzle 233b serving as a second gas introduction unit, and a third nozzle 233c serving as a third gas introduction unit are installed in the processing chamber 201 to penetrate a lower sidewall of the reaction tube 203. A first gas supply pipe 232a, a second gas supply pipe 232b, and a third gas supply pipe 232c are connected to the first nozzle 233a, the second nozzle 233b, and the third nozzle 233c, respectively. The three nozzles 233a, 233b, and 233c and the three gas supply pipes 232a, 232b, and 232c) are installed in the reaction tube 203 and configured to supply a plurality of kinds of gases (here, two kinds of gases) into the processing chamber 201.

In addition, a metallic manifold configured to support the reaction tube 203 is installed below the reaction tube 203, and each nozzle may be installed to penetrate a sidewall of the metallic manifold. In this case, an exhaust pipe 231 to be described later may be further installed in the metallic manifold. Also, the exhaust pipe 231 may be installed not in the metallic manifold but below the reaction tube 203. Thus, a furnace opening unit of the processing furnace 202 may be formed of a metal and nozzles may be installed in the metallic furnace opening unit.

A mass-flow controller (MFC) 241a serving as a flow-rate controller (flow-rate control unit) and a valve 243a serving as an opening/closing valve are installed in the first gas supply pipe 232a in sequential order from an upstream direction. Also, a first inert gas supply pipe 232d is connected to a downstream side lower than the valve 243a of the first gas supply pipe 232a. An MFC 241d serving as a flow-rate controller (flow-rate control unit) and a valve 243d serving as an opening/closing valve are installed in the first inert gas supply pipe 232d in sequential order from the upstream direction. Also, the above-described first nozzle 233a is connected to a front end unit of the first gas supply pipe 232a. The first nozzle 233a is installed in an erect shape in an arc-shaped space between an inner wall of the reaction tube 203 and the wafers 200 in a portion extending from a lower portion of the inner wall of the reaction tube 203 to an upper portion thereof along the stacked direction of the wafers 200 toward an upper side of the stacked direction of the wafers 200. That is, the first nozzle 233a is installed beside and along a wafer arrangement region where the wafers 200 are arranged, in a region horizontally surrounding the wafer arrangement region. The first nozzle 233a is configured with an L-shaped long nozzle. A horizontal unit of the first nozzle 233a is installed to penetrate the lower sidewall of the reaction tube 203, while a vertical unit thereof is installed in an erect shape from at least one end side of the wafer arrangement region toward the other end side thereof. A gas supply port 248a configured to supply gas is installed in a lateral surface of the first nozzle 233a. The gas supply port 248a is configured to be opened toward the center of the reaction tube 203 and capable of supplying gas toward the wafers 200. A plurality of gas supply ports 248a extend from a lower portion of the reaction tube 203 to an upper portion thereof and are installed at the same aperture pitch to have the same aperture area.

An MFC 241b serving as a flow-rate controller (flow-rate control unit) and a valve 243b serving as an opening/closing valve are installed in the second gas supply pipe 232b in sequential order from the upstream direction. Also, a second inert gas supply pipe 232e is connected to a downstream side lower than the valve 243b of the second gas supply pipe 232b. An MFC 241e serving as a flow-rate controller (flow-rate control unit) and a valve 243e serving as an opening/closing valve are installed in the second inert gas supply pipe 232e in sequential order from the upstream direction. Also, the above-described second nozzle 233b is connected to a front end unit of the second gas supply pipe 232b. The second nozzle 233b is installed in a buffer chamber 237b serving as a gas dispersion space.

The buffer chamber 237b is installed in the arc-shaped space between the inner wall of the reaction tube 203 and the wafer 200 in the portion extending from the lower portion of the inner wall of the reaction tube 203 to the upper portion thereof along the stacked direction of the wafers 200. That is, the buffer chamber 237b is installed beside and along the wafer arrangement region in the region horizontally surrounding the wafer arrangement region. A gas supply port 238b configured to supply gas is installed in an end unit of a wall of the buffer chamber 237b, which is adjacent to the wafers 200. The gas supply port 238b is configured to be opened toward the center of the reaction tube 203 and capable of supplying gas toward the wafers 200. A plurality of gas supply ports 238b extend from the lower portion of the reaction tube 203 to the upper portion thereof and are installed at the same aperture pitch to have the same aperture area.

The second nozzle 233b is installed in an erect shape in an end unit of the buffer chamber 237b, which is opposite to the end unit in which the gas supply port 238b is installed, from a lower portion of the inner wall of the reaction tube 203 to an upper portion thereof toward an upper side of the stacked direction of the wafers 200. That is, the second nozzle 233b is installed beside and along the wafer arrangement region in the region horizontally surrounding the wafer arrangement region. The second nozzle 233b is configured with an L-shaped long nozzle. A horizontal unit of the second nozzle 233b is installed to penetrate the lower sidewall of the reaction tube 203, while a vertical unit thereof is installed in an erect shape from at least one end side of the wafer arrangement region toward the other end side thereof. A gas supply port 248b configured to supply gas is installed in a lateral surface of the second nozzle 233b. The gas supply port 248b is opened toward the center of the buffer chamber 237b. Like the gas supply ports 238b of the buffer chamber 237b, a plurality of gas supply ports 248b are installed from the lower portion of the reaction tube 203 to the upper portion thereof. When a pressure difference between the inside of the buffer chamber 237b and the inside of the processing chamber 201 is small, the plurality of gas supply ports 248b may be formed at the same aperture pitch to have the same aperture area from an upstream side (lower portion) to a downstream side (upper portion). However, when the pressure difference is large, the respective gas supply ports 248b may have gradually increased aperture areas or be formed at gradually reduced aperture pitches from the upstream side toward the downstream side.

In the present embodiment, by controlling the aperture area or aperture pitch of each of the gas supply ports 248b of the second nozzle 233b from the upstream side to the downstream side as described above, even if there is a difference in flow velocity between gases, the gases are initially jetted at about the same flow rate through the respective gas supply ports 248b. Also, the gases jetted through the respective gas supply ports 248b are initially introduced into the buffer chamber 237b, and the difference in the flow velocity of the gases introduced in the buffer chamber 237b is uniformized. That is, after a particle velocity of each of the gases jetted into the buffer chamber 237b through the respective gas supply ports 248b of the second nozzle 233b is reduced in the buffer chamber 237b, each of the gases is jetted at the reduced particle velocity into the processing chamber 201 through the gas supply ports 238b of the buffer chamber 237b. Thus, when the gases jetted into the buffer chamber 237b through the respective gas supply ports 248b of the second nozzle 233b are jetted into the processing chamber 201 through the respective gas supply ports 238b of the buffer chamber 237b, the gases have a uniform flow rate and flow velocity.

An MFC 241c serving as a flow-rate controller (flow-rate control unit) and a valve 243c serving as an opening/closing valve are installed in the third gas supply pipe 232c in the sequential direction from the upstream direction. Also, a third inert gas supply pipe 232f is connected to a downstream side lower than the valve 243c of the third gas supply pipe 232c. An MFC 241f serving as a flow-rate controller (flow-rate control unit) and a valve 243f serving as an opening/closing valve are installed in the third inert gas supply pipe 232f in sequential order from the upstream direction. Also, the above-described third nozzle 233c is connected to a front end unit of the third gas supply pipe 232c. The third nozzle 233c is installed in a buffer chamber 237c serving as a gas dispersion space.

The buffer chamber 237c is installed in the arc-shaped space between the inner wall of the reaction tube 203 and the wafer 200 in the portion extending from the lower portion of the inner wall of the reaction tube 203 to the upper portion thereof along the stacked direction of the wafers 200. That is, the buffer chamber 237c is installed beside and along the wafer arrangement region in the region horizontally surrounding the wafer arrangement region. A gas supply port 238c configured to supply gas is installed in an end unit of a wall of the buffer chamber 237c, which is adjacent to the wafers 200. The gas supply port 238c is configured to be opened toward the center of the reaction tube 203 and capable of supplying gas toward the wafers 200. A plurality of gas supply ports 238c extend from the lower portion of the reaction tube 203 to the upper portion thereof and are installed at the same aperture pitch to have the same aperture area.

The third nozzle 233c is installed in an erect shape in an end unit of the buffer chamber 237c, which is opposite to the end unit in which the gas supply port 238c is installed, from the lower portion of the inner wall of the reaction tube 203 to the upper portion thereof toward the upper side of the stacked direction of the wafers 200. That is, the third nozzle 233c is installed beside and along the wafer arrangement region in the region horizontally surrounding the wafer arrangement region. The third nozzle 233c is configured with an L-shaped long nozzle. A horizontal unit of the second nozzle 233c is installed to penetrate the lower sidewall of the reaction tube 203, while a vertical unit thereof is installed in an erect shape from at least one end side of the wafer arrangement region toward the other end side thereof. A gas supply port 248c configured to supply gas is installed in a lateral surface of the third nozzle 233c. The gas supply port 248c is opened toward the center of the buffer chamber 237c. Like the gas supply ports 238c of the buffer chamber 237c, a plurality of gas supply ports 248c are installed from the lower portion of the reaction tube 203 to the upper portion thereof. When a pressure difference between the inside of the buffer chamber 237c and the inside of the processing chamber 201 is small, the plurality of gas supply ports 248c may be formed at the same aperture pitch to have the same aperture area from an upstream side (lower portion) to a downstream side (upper portion). However, when the pressure difference is large, the respective gas supply ports 248c may have gradually increased aperture areas or be formed at gradually reduced aperture pitches from the upstream side toward the downstream side.

In the present embodiment, by controlling the aperture area or aperture pitch of each of the gas supply ports 248c of the third nozzle 233c from the upstream side to the downstream side as described above, even if there is a difference in flow velocity between gases, the gases are initially jetted at about the same flow rate through the respective gas supply ports 248c. Also, the gases jetted through the respective gas supply ports 248c are initially introduced into the buffer chamber 237c, and the difference in the flow velocity of the gases introduced in the buffer chamber 237c is uniformized. That is, after a particle velocity of each of the gases jetted into the buffer chamber 237c through the respective gas supply ports 248c of the third nozzle 233c is reduced in the buffer chamber 237c, each of the gases is jetted at the reduced particle velocity into the processing chamber 201 through the gas supply ports 238c of the buffer chamber 237c. Thus, when the gases jetted into the buffer chamber 237c through the respective gas supply ports 248c of the third nozzle 233c are jetted into the processing chamber 201 through the respective gas supply ports 238c of the buffer chamber 237c, the gases have a uniform flow rate and flow velocity.

Thus, a method of supplying gases according to the present embodiment includes transferring gases via the nozzles 233a, 233b, and 233c and the buffer chambers 237b and 237c disposed in an arc-shaped space having a vertical length defined by an inner wall of the reaction tube 203 and end units of a plurality of stacked wafers 200, initially jetting gases from the vicinity of the wafer 200 into the reaction tube 203 through the gas supply ports 248a, 248b, 248c, 238b, and 238c respectively opened in the nozzles 233a, 233b, and 233c and the buffer chambers 237b and 237c, and adjusting main flow of gases in the reaction tube 203 to a direction (i.e., horizontal direction) parallel to the surface of the wafers 200. Due to the above-described configuration, gases may be uniformly supplied to the respective wafers 200, and a thickness of a thin film formed on each of the wafers 200 may be uniformized. Also, although the gases remaining after a reaction flow toward an exhaust port (i.e., an exhaust pipe 231 to be described later), a direction in which the remaining gases flow is appropriately specified by a position of the exhaust port and not limited to a vertical direction.

In addition, the two buffer chambers 237b and 237c are disposed opposite each other across the center of the wafer 200 (i.e., the center of the reaction tube 203). Specifically, from a plan view shown in FIG. 2, the two buffer chambers 237b and 237c are disposed line-symmetrically with respect to an object axis corresponding to a straight line connecting the center of the wafer 200 with the center of an exhaust port 231a to be described later installed in a sidewall of the reaction tube 203. Also, the buffer chambers 237b and 237c are disposed such that straight lines connecting respective centers of the gas supply port 238b of the buffer chamber 237b, the gas supply port 238c of the buffer chamber 237c, and the exhaust port 231a constitute an isosceles triangle. Thus, gases flowing from the two buffer chambers 237b and 237c to the wafer 200 become uniform. That is, the gases flowing from the two buffer chambers 237b and 237c to the wafer 200 are line-symmetric with respect to the object axis corresponding to the straight line connecting the center of the wafer 200 and the center of the exhaust port 231a.

A source gas containing a predetermined element (i.e., a source gas containing silicon (Si) as a predetermined element (silicon-containing gas)), for example, MCS gas, is supplied through the first gas supply pipe 232a via the MFC 241a, the valve 243a, and the first nozzle 233a into the processing chamber 201. Simultaneously, an inert gas may be supplied through the first inert gas supply pipe 232d via the MFC 241d and the valve 243d into the first gas supply pipe 232a.

A gas containing nitrogen (a nitrogen-containing gas) (i.e., a nitridation gas), for example, ammonia ($NH_3$) gas, is supplied through the second gas supply pipe 232b via the MFC 241b, the valve 243b, the second nozzle 233b, and the buffer chamber 237b into the processing chamber 201. Simultaneously, an inert gas may be supplied through the second inert gas supply pipe 232e via the MFC 241e and the valve 243e into the second gas supply pipe 232b.

A gas containing nitrogen (a nitrogen-containing gas) (i.e., a nitridation gas), for example, ammonia gas, is supplied through the third gas supply pipe 232c via the MFC 241c, the valve 243c, the third nozzle 233c, and the buffer chamber 237c into the processing chamber 201. Simultaneously, an inert gas may be supplied through the third inert gas supply pipe 232f via the MFC 241f and the valve 243f into the third gas supply pipe 232c.

When a gas is supplied through the first gas supply pipe 232a as described above, a first gas supply system (a source gas supply system (silicon-containing gas supply system)) configured to supply a source gas (MCS gas) to the wafer 200 disposed in the processing chamber 201 is mainly configured with the first gas supply pipe 232a, the MFC 241a, and the valve 243a. Also, the first nozzle 233a may be regarded as being included in the first gas supply system. Furthermore, a first inert gas supply system is mainly configured with the first inert gas supply pipe 232d, the MFC 241d, and the valve 243d. The first inert gas supply system also functions as a purge gas supply system.

In addition, when gas is supplied through the second gas supply pipe 232b and the third gas supply pipe 232c as described above, a second gas supply system (nitrogen-containing gas supply system) configured to supply a nitrogen-containing gas ($NH_3$ gas) to the wafer 200 disposed in the processing chamber 201 is mainly configured with the second gas supply pipe 232b, the third gas supply pipe 232c, the MFCs 241b and 241c, and the valves 243b and 243c. Also, the second nozzle 233b, the third nozzle 233c, and the buffer chambers 237b and 237c may be regarded as being included in the second gas supply system. Also, a second inert gas supply system is mainly configured with the second inert gas supply pipe 232e, the third inert gas supply pipe 232f, the MFCs 241e and 241f, and the valves 243e and 243f. The second inert gas supply system also functions as a purge gas supply system.

As shown in FIG. 2, each of a first rod electrode 269b, which is a first electrode having a thin and long structure, and a second rod electrode 270b, which is a second electrode, extends from a lower portion of the reaction tube 203 to an upper portion thereof and is disposed and installed in the buffer chamber 237b in a stacked direction of the wafers 200. Each of the first and second rod electrodes 269b and 270b is installed parallel to the second nozzle 233b. Each of the first and second rod electrodes 269b and 270b is covered with and protected by an electrode protection pipe 275b configured to protect each electrode from an upper portion thereof to a lower portion thereof. Any one of the first rod electrode 269b and the second rod electrode 270b is connected to a radio-frequency (RF) power source 273 via a matching device 272, and the other thereof is connected to an earth, which is a reference electric potential. As a result, plasma is generated in a plasma generation region 224b interposed between the first and second rod electrodes 269b and 270b.

Similarly, each of a first rod electrode 269c, which is a first electrode having a thin and long structure, and a second rod electrode 270c, which is a second electrode, extends from the upper portion of the reaction tube 203 to the lower portion thereof and is provided in the buffer chamber 237c in the stacked direction of the wafers 200. Each of the first and second rod electrodes 269c and 270c is installed parallel to the third nozzle 233c. Each of the first and second rod electrodes 269c and 270c is covered with and protected by an electrode protection pipe 275c, which is a protection pipe configured to protect each electrode from an upper portion thereof to a lower portion thereof. Any one of the first rod electrode 269c or the second rod electrode 270c is connected to the RF power source 273 via the matching device 272, and the other thereof is connected to the earth that is the reference electric potential. As a result, plasma is generated in a plasma generation region 224c interposed between the first and second rod electrodes 269c and 270c.

A first plasma source serving as a plasma generator (plasma generation unit) is mainly configured with the first rod electrode 269b, the second rod electrode 270b, the electrode protection pipe 275b, the matching device 272, and the RF power source 273. Also, a second plasma source serving as a plasma generator (plasma generation unit) is mainly configured with the first rod electrode 269c, the second rod electrode 270c, the electrode protection pipe 275c, the matching device 272, and the RF power source 273. Each of the first and second plasma sources functions as an activation mechanism (excitation unit) configured to activate (excite) gas and generate plasma as will be described later. A plurality of excitation units, for example, two excitation units, are installed in the substrate processing apparatus according to the present embodiment. Also, the plurality of excitation units are dispersed.

The electrode protection pipes 275b and 275c are respectively configured such that the first rod electrodes 269b and 269c and the second rod electrodes 270b and 270c can be inserted into the buffer chambers 237b and 237c with each of the first rod electrodes 269b and 269c and the second rod electrodes 270b and 270c isolated from atmospheres of the buffer chambers 237b and 237c. Here, when the insides of the electrode protection pipes 275b and 275c are the same atmosphere as the outside air (atmosphere), the first rod electrodes 269b and 269c and the second rod electrodes 270b and 270c respectively inserted into the electrode protection pipes 275b and 275c are oxidized due to heat generated by the heater 207. Thus, inert gas purge mechanisms configured to be charged with or purge an inert gas, such as nitrogen, to sufficiently reduce an oxygen concentration, are installed in the electrode protection pipes 275b and 275c to prevent oxidation of the first rod electrodes 269b and 269c or the second rod electrodes 270b and 270c.

The above-described exhaust port 231a is installed in the reaction tube 203. The exhaust pipe 231 configured to exhaust the atmosphere of the processing chamber 201 is connected to the exhaust port 231a. A vacuum pump 246 serving as a vacuum exhaust apparatus is connected to the exhaust pipe 231 via a pressure sensor 245 serving as a pressure detector (pressure detection unit) configured to detect the pressure of the processing chamber 201 and an auto-pressure controller (APC) valve 244 serving as a pressure regulator (pressure regulating unit). Also, the APC valve 244 is an opening/closing valve configured to be capable of vacuum-exhausting the processing chamber 201 or stopping the vacuum exhaust of the processing chamber 201 by opening and closing off the APC valve 244 with the vacuum pump 246 operated. The APC valve 244 is configured to be capable of adjusting an inner pressure of the processing chamber 201 by controlling a degree of opening with the vacuum pump 246 operated. The APC valve 244 is configured to operate the vacuum pump 246 and control the degree of opening of the APC valve 244 based on pressure information detected by the pressure sensor 245 such that the inside of the processing chamber 201 is vacuum-exhausted to a predetermined pressure (degree of vacuum).

An exhaust system is mainly configured with the exhaust pipe 231, the APC valve 244, the vacuum pump 246, and the pressure sensor 245.

A seal cap 219 serving as a furnace opening stopper capable of hermetically stopping a bottom-end opening of the reaction tube 203 is installed below the reaction tube 203. The seal cap 219 is configured to come in contact with the bottom end of the reaction tube 203 from a lower side of a vertical direction. The seal cap 219 is formed of, for example, a metal such as stainless, in a disk shape. An O-ring 220 serving as a seal member is installed on a top surface of the seal cap 219 and comes in contact with the lower end of the reaction tube 203. A rotation mechanism 267 is installed at a side of the seal cap 219, which is opposite to the processing chamber 201, and configured to rotate the boat 217 serving as a substrate holding mechanism. A rotation axis 255 of the rotation mechanism 267 is connected to the boat 217 through the seal cap 219. The rotation mechanism 267 is configured to rotate the boat 217 to rotate the wafers 200. The seal cap 219 is configured to vertically move up and down by a boat elevator 115 serving as an elevating mechanism vertically installed outside the reaction tube 203. The boat elevator 115 is configured to move the seal cap 219 up and down and be capable of loading and unloading the boat 217 into and from the processing chamber 201. That is, the boat elevator 115 is a transfer apparatus configured to transfer the boat 217 (i.e., the wafers 200) into and out of the processing chamber 201.

The boat 217 serving as a substrate support mechanism is formed of a heat-resistant material, for example, quartz or silicon carbide, and configured to support a plurality of wafers 200 in a horizontal posture in multi-stages with the centers of the wafers 200 aligned with one another. Also, an insulation member 218 formed of a heat-resistant material, for example, quartz or silicon carbide, is installed below the boat 217 to preclude transmission of heat from the heater 207 to a side of the seal cap 219. Also, the insulation member 218 may be configured with a plurality of insulation plates formed of a heat-resistant material, such as quartz or silicon carbide, and an insulation plate holder configured to support the insulation plates in a horizontal posture in multi-stages.

A temperature sensor 263 serving as a temperature detector is installed in the reaction tube 203. The temperature sensor 263 is configured to adjust a state of application of current to the heater 207 based on temperature information detected by the temperature sensor 263 such that the inner temperature of the processing chamber 201 has a desired temperature distribution. The temperature sensor 263 is configured in an L shape like the first nozzle 233a and installed along the inner wall of the reaction tube 203.

Figure 5:
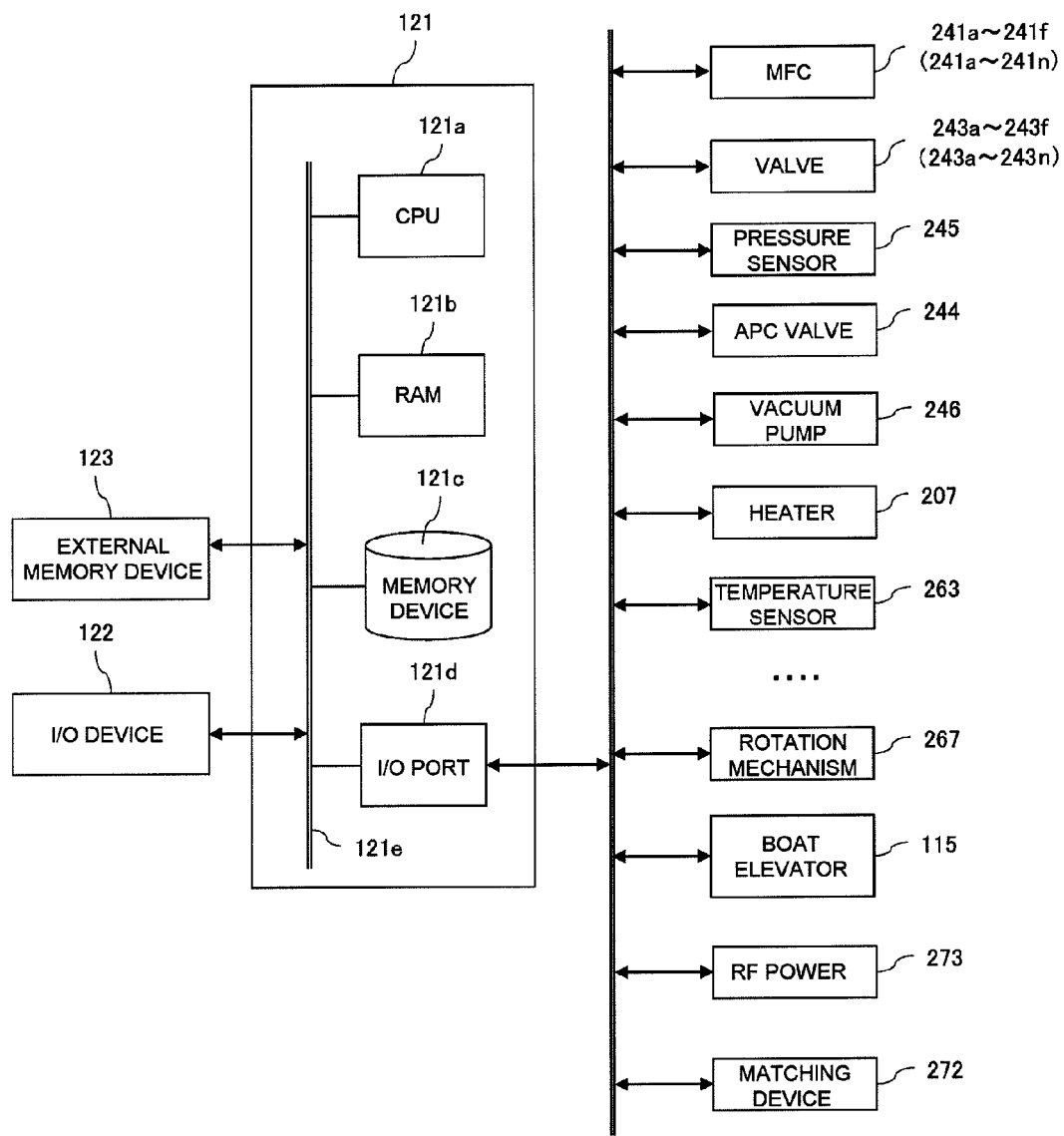
FIG. 5 is a schematic construction diagram of a controller of a substrate processing apparatus preferably used in the first and second embodiments of the present invention.

As shown in FIG. 5, a controller 121 serving as a control unit (control device) is configured with a computer including a central processing unit (CPU) 121a, a random access memory (RAM) 121b, a memory device 121c, and an input/output (I/O) port 121d. The RAM 121b, the memory device 121c, and the I/O port 121d are configured to be capable of exchanging data with the CPU 121a via an internal bus 121e. An I/O device 122 configured with, for example, a touch panel, is connected to the controller 121.

The memory device 121c is configured with, for example, a flash memory and a hard disk drive (HDD). A control program for controlling operations of the substrate processing apparatus or a process recipe in which steps or conditions of a substrate processing process to be described later are written is readably stored. Also, the process recipe is combined to allow the controller 121 to execute each of the steps in the substrate processing process to be described later and obtain predetermined results, and functions as a program.

Hereinafter, the program recipe and the control program will be generally briefly termed a program. Also, when the term "the program" is used in the present specification, only a single process recipe may be included, only a single control program may be included, or both the process recipe and the control program may be included. Also, the RAM 121b is configured as a memory area in which programs or data read by the CPU 121a are temporarily held.

The I/O port 121d is connected to the above-described MFCs 241a, 241b, 241c, 241d, 241e, and 241f, valves 243a, 243b, 243c, 243d, 243e, and 243f, pressure sensor 245, APC valve 244, vacuum pump 246, heater 207, temperature sensor 263, rotation mechanism 267, boat elevator 115, RF power source 273, and matching device 272.

The CPU 121a is configured to read a control program from the memory device 121c and execute the control program and also to read a process recipe from the memory device 121c in response to the input of a manipulation command from the I/O device 122. Also, the CPU 121a is configured to control operations of adjusting the flow rates of various gases using the MFCs 241a, 241b, 241c, 241d, 241e, and 241f, operations of opening and closing off the valves 243a, 243b, 243c, 243d, 243e, and 243f, an operation of adjusting a pressure based on the opening/closing of the APC valve 244 and the pressure sensor 245, an operation of adjusting a temperature of the heater 207 based on the temperature sensor 263, an operation of running and stopping the vacuum pump 246, an operation of controlling a rotation rate of the rotation mechanism 267, an operation of moving the boat 217 up and down using the boat elevator 115, an operation of controlling power supply from the RF power source 273, and an operation of controlling an impedance using the matching device 272.

In addition, the present invention is not limited to a case where the controller 121 is configured as an exclusive-use computer, and the controller 121 may be configured as a general-use computer. For example, the controller 121 according to the present embodiment may be configured by preparing an external memory device 123 in which the above-described program is stored (for example, a magnetic disk such as a magnetic tape, a flexible disk, or a hard disk, an optical disc such as a compact disc (CD) or a digital versatile disc (DVD), an optical magnetic disc such as a magneto-optical (MO) disc, or a semiconductor memory device such as a universal serial bus (USB) memory or a memory card) and installing the program in a general-use computer using the external memory device 123. Also, a unit for supplying a program to a computer is not limited to a case where the program is supplied to the computer via the external memory device 123. For instance, the program may be supplied using a communication unit, such as the Internet or an exclusive circuit without passing the external memory device 123. Also, the memory device 121c or the external memory device 123 is configured as a computer readable recording medium. Hereinafter, the memory device 121c and the external memory device 123 will be generally briefly termed a recording medium. In addition, when the term "the recording medium" is used in the present specification, only a single memory device 121c may be included, only a single external memory device 123 may be included, or both the memory device 121c and the external memory device 123 may be included.

Next, an example of a method of forming a nitride film as an insulating film on a substrate using the processing furnace 202 of the above-described substrate processing apparatus will be described as a process of a manufacturing process of a semiconductor device. Also, in the following description, an operation of each component constituting the substrate processing apparatus is controlled by the controller 121.

Figure 3:
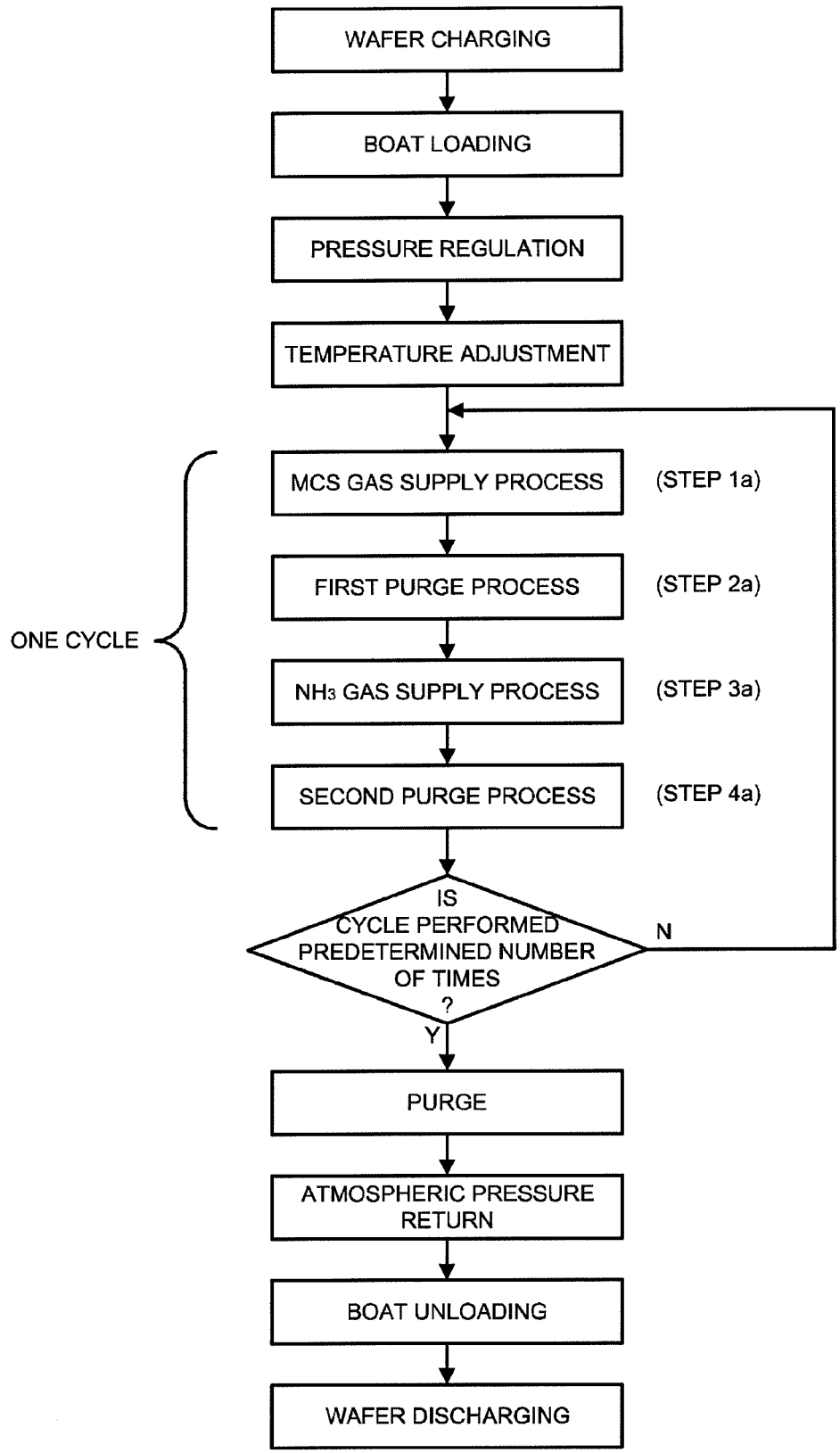
FIG. 3 is a flowchart illustrating a process of forming a film according to the first embodiment of the present invention.
Figure 4:
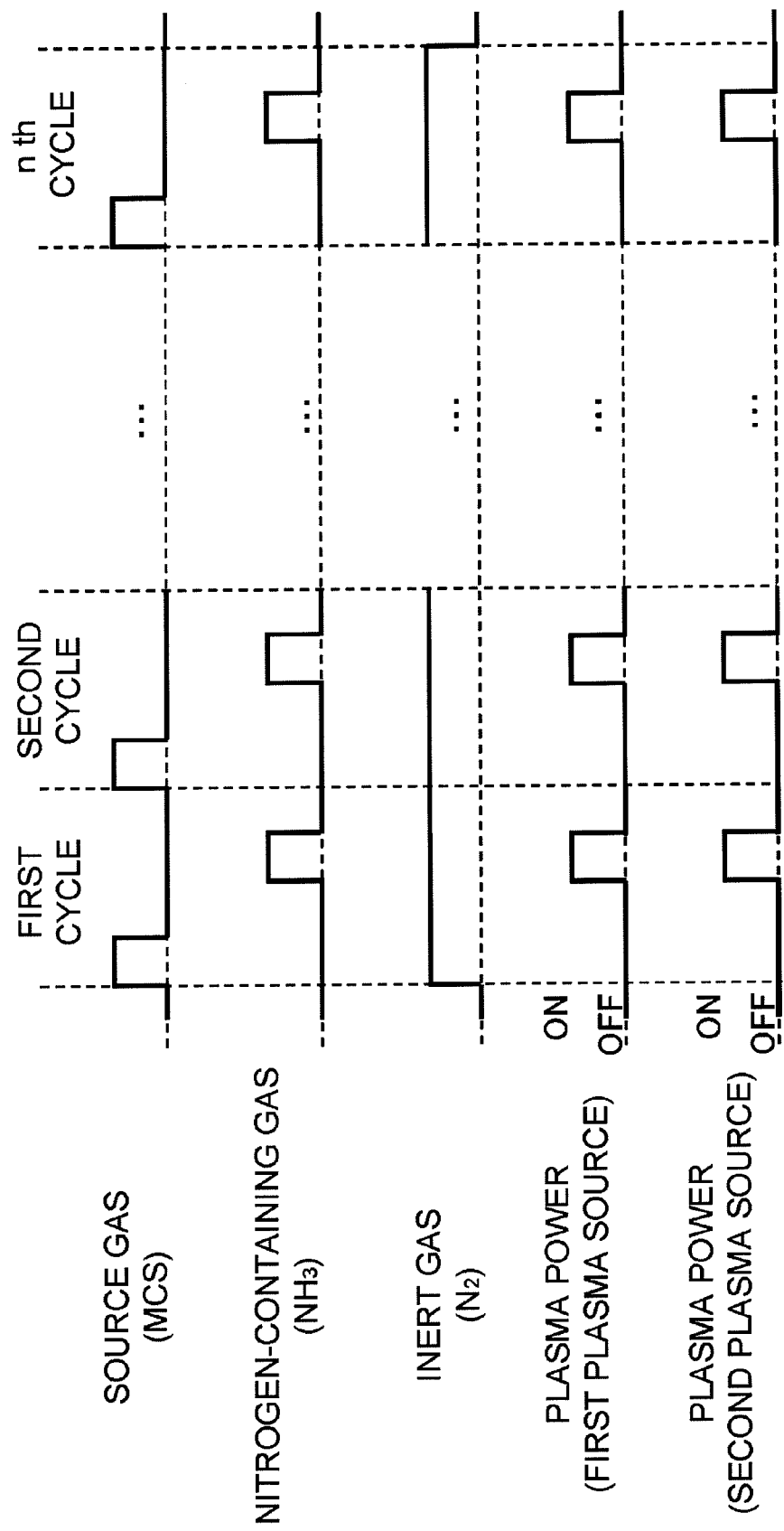
FIG. 4 is a timing diagram of the supply of gases and the supply of plasma power in a film-forming sequence according to the first embodiment of the present invention.

FIG. 3 is a flowchart illustrating a process of forming a film according to the present embodiment, and FIG. 4 is a timing diagram of the supply of gases and the supply of plasma power in a film-forming sequence according to the present embodiment. The film-forming sequence according to the present embodiment includes alternately repeating a process of supplying MCS gas as a source gas to a wafer 200 accommodated in a processing chamber 201 to form a silicon-containing layer on the wafer 200 and a process of supplying a nitrogen-containing gas plasma-excited by a plurality of excitation units from each of the plurality of excitation units to the wafer 200 disposed in the processing chamber 201 to nitride the silicon-containing layer into a silicon nitride layer to form a silicon nitride film having a predetermined thickness on the wafer 200.

Hereinafter, the film-forming sequence shown in FIGS. 3 and 4 will be described in detail. In the embodiment, an example of a process of forming a silicon nitride film ($Si_3N_4$ film, which will hereinafter briefly be referred to as a SiN film) as an insulating film on the wafer 200 according to the flowchart of FIG. 3 and the film-forming sequence of FIG. 4 using MCS gas and $NH_3$ gas as a source gas and a nitrogen-containing gas, respectively, will be described.

When a plurality of wafers 200 are charged in the boat 217 (wafer charging), as shown in FIG. 1, the boat 217 configured to support the plurality of wafers 200 is lifted up by the boat elevator 115 and loaded into the processing chamber 201 (boat loading). In this state, the seal cap 219 seals the bottom end of the reaction tube 203 via the O-ring 220.

The inside of the processing chamber 201 is vacuum-exhausted by the vacuum pump 246 and adjusted to a desired pressure (degree of vacuum). In this case, an inner pressure of the processing chamber 201 is measured by the pressure sensor 245, and the APC valve 244 is feedback-controlled based on the measured pressure information (pressure regulation). Also, the vacuum pump 246 always maintains an operated state until at least the processing of the wafer 200 is terminated. An inner temperature of the processing chamber 201 is heated by the heater 207 to a desired temperature. In this case, a state of application of current to the heater 207 is feedback-controlled based on temperature information detected by the temperature sensor 263 such that the inside of the processing chamber 201 has a desired temperature distribution (temperature adjustment). Subsequently, the rotation of the boat 217 and the wafers 200 is initiated by the rotation mechanism 267. Also, the rotation of the boat 217 and the wafers 200 due to the rotation mechanism 267 is continuously performed until the processing of the wafer 200 is completed. Afterwards, four steps to be described later are sequentially performed.

[Step 1a]

By opening the valve 243a of the first gas supply pipe 232a and the valve 243d of the first inert gas supply pipe 232d, MCS gas is supplied to the first gas supply pipe 232a, and $N_2$ gas is supplied to the first inert gas supply pipe 232d. The $N_2$ gas flows through the first inert gas supply pipe 232d, and a flow rate of the $N_2$ gas is adjusted by the MFC 241d. The MCS gas flows through the first gas supply pipe 232a, and a flow rate of the MCS gas is adjusted by the MFC 241a. The MCS gas having the adjusted flow rate is mixed with the $N_2$ gas having the adjusted flow rate in the first gas supply pipe 232a, supplied into the heated processing chamber 201 having a decompressed state through the gas supply port 248a of the first nozzle 233a, and exhausted through the exhaust pipe 231. In this case, the MCS gas is supplied to the wafers 200 (MCS gas supply process). Also, to prevent permeation of the MCS gas into the second nozzle 233b, the third nozzle 233c, and the buffer chambers 237b and 237c, the $N_2$ gas is supplied into the second inert gas supply pipe 232e and the third inert gas supply pipe 232f by opening the valves 243e and 243f. The $N_2$ gas is supplied into the processing chamber 201 via the second gas supply pipe 232b, the third gas supply pipe 232c, the second nozzle 233b, the third nozzle 233c, and the buffer chambers 237b and 237c and exhausted through the exhaust pipe 231.

In this case, an inner pressure of the processing chamber 201 is controlled in the range of less than an atmospheric pressure, for example, about 10 Pa to about 1000 Pa by appropriately adjusting the APC valve 244. A flow rate of the supplied MCS gas is controlled by the MFC 241a to be in the range of, for example, about 100 sccm to about 2000 sccm (about 0.1 slm to about 2 slm). A flow rate of the supplied $N_2$ gas is controlled by each of the MFCs 241d, 241e, and 241f to be in the range of, for example, about 100 sccm to about 2000 sccm (about 0.1 slm to about 2 slm). A time taken to expose the wafer 200 to the MCS gas is adjusted within the range of, for example, about 1 second to about 120 seconds. A temperature of the heater 207 is set such that a chemical deposition reaction occurs in the processing chamber 201 under the above-described pressure. That is, the temperature of the heater 207 is set such that a temperature of the wafer 200 is maintained at a constant temperature ranging from about 250° C. to about 630° C., preferably, about 300° C. to about 500° C.

Furthermore, when the temperature of the wafer 200 is lower than a temperature of about 300° C., it becomes difficult to decompose or adsorb MCS on the wafer 200 so that a film-forming rate may be reduced. In particular, when the temperature of the wafer 200 is lower than a temperature of about 250° C., even if MCS is decomposed or adsorbed on the wafer 200, a decomposed amount or adsorbed amount varies according to an in-surface portion or position of the wafer 200, and MCS is not uniformly decomposed or adsorbed in the surface of the wafer 200 or between the wafers 200. Also, it is difficult to cause a chlorine desorption reaction in the above-described temperature range, thereby precluding the dissociation of Si—Cl bonds or desorption of chlorine, which hinders the formation of Si—N bonds in step 3a to be described later. As a result, a film density is degraded. When the temperature of the wafer 200 is adjusted to a temperature of about 250° C. or more, the above-described problems may be solved. When the temperature of the wafer 200 is adjusted to a temperature of about 300° C. or more, a reduction in film-forming rate may be suppressed.

In addition, when a temperature of the wafer 200 exceeds a temperature of about 550° C., a gas-phase reaction becomes dominant. In particular, when the temperature of the wafer 200 exceeds a temperature of about 630° C. or less, the uniformity of film thickness is easily exacerbated, thus precluding the control of the film thickness. When the temperature of the wafer 200 is adjusted to a temperature of about 630° C., the exacerbation of the uniformity of the film thickness may be suppressed to enable the control of the film thickness. When the temperature of the wafer 200 is adjusted to a temperature of about 550° C. or less, a dominant state of the gas-phase reaction may be avoided. In particular, when the temperature of the wafer 200 is adjusted to a temperature of about 500° C., a surface reaction becomes dominant, and the uniformity of the film thickness may be easily ensured to facilitate the control of the film thickness. Also, when the temperature of the wafer 200 exceeds a temperature of about 630° C., a chlorine desorption reaction strongly occurs to reduce the remaining amount of chlorine. In contrast, in a low-temperature region having a temperature of about 630° C. or less, although the chlorine desorption reaction occurs, there is a tendency for the remaining amount of chlorine to increase more than in a high-temperature region. Thus, the present invention becomes particularly effective.

Based on the above description, the temperature of the wafer 200 may be adjusted within the range of about 250° C. to about 630° C., preferably, in the range of about 300° C. to about 500° C.

By supplying MCS gas into the processing chamber 201 under the above-described conditions (i.e., conditions where a chemical deposition reaction occurs), a silicon-containing layer having, for example, less than one atomic layer to several atomic layers is formed on a wafer 200 (surface of an under film). The silicon-containing layer may be MCS-gas adsorption layer or a silicon layer or include both. However, the silicon-containing layer is preferably a layer containing silicon and chlorine. Here, a silicon layer generally refers to not only a continuous layer formed of silicon but also a discontinuous layer or a silicon thin film obtained by overlapping the continuous layer and the discontinuous layer. Also, the continuous layer formed of silicon may be referred to as a silicon thin film. In addition, silicon forming the silicon layer includes silicon atoms of Si—Cl bonds or Si—H bonds that are incompletely cut. Furthermore, MCS-gas adsorption layer includes not only a chemisorption layer in which molecules of the MCS gas are continuous but also a chemisorption layer in which molecules of the MCS gas are discontinuous. That is, the MCS-gas adsorption layer includes a chemisorption layer having one molecular layer or less than one molecular layer that includes MCS molecules. The MCS (SiH$_3$Cl) molecules constituting the MCS-gas chemisorption layer also include partially cut Si—Cl bonds or Si—H bonds (SiH$_x$ molecules or SiH$_x$Cl molecules). That is, the MCS-gas adsorption layer includes a continuous chemisorption layer or discontinuous chemisorption layer including SiH$_3$Cl molecules and/or SiH$_x$ molecules and/or SiH$_x$Cl molecules. The less than one atomic layer refers to a discontinuously formed atomic layer, and the one atomic layer refers to a continuously formed atomic layer. Also, the less than one molecular layer refers to a discontinuously formed molecular layer, and the one molecular layer refers to a continuously formed molecular layer. In conditions under which MCS gas self-decomposes (thermally decomposes) (i.e., a pyrolysis reaction of MCS gas occurs), silicon is deposited on the wafer 200 to form a silicon layer. In conditions under which the MCS gas does not self-decompose (thermally decompose) (i.e., the pyrolysis reaction of the MCS gas does not occur), the MCS gas is adsorbed on the wafer 200 to form MCS-gas adsorption layer. As compared with a case where the MCS-gas adsorption layer is formed on the wafer 200, forming the silicon layer on the wafer 200 is more preferable to increase a film-forming rate. When the thickness of a silicon-containing layer formed on the wafer 200 exceeds several atomic layers, it becomes difficult for nitridation or a chlorine desorption process to affect the entire silicon-containing layer during step 3a described later. Also, a minimum value of the silicon-containing layer that may be formed on the wafer 200 is less than one atomic layer. Accordingly, the thickness of the silicon-containing layer preferably ranges from less than one atomic layer to several atomic layers. When the silicon-containing layer has a thickness of one atomic layer or less (i.e., one atomic layer or less than one atomic layer), effects of the nitriding or chlorine desorption process of step 3a may be relatively increased, and a time taken for the nitridation reaction of step 3a may be shortened. A time taken to form the silicon-containing layer of step 1a may be reduced. As a result, a processing time per cycle may be shortened, and the entire processing time may be shortened. That is, a film-forming rate may be increased. Furthermore, by adjusting the silicon-containing layer to a thickness of one atomic layer or less, the controllability of film-thickness uniformity may be increased.

In addition, in step 1a, the amount of chlorine supplied into the processing chamber 201 may be reduced by use of MCS gas, which has a low chlorine content and a high surface absorptivity. Thus, a ratio of chlorine bonded with a silicon-containing layer to the silicon-containing layer (i.e., Si—Cl bonds) may be reduced, and a low chlorine-content silicon-containing layer may be formed. As a result, in step 3a, a low chlorine-content SiN layer may be formed.

Furthermore, Si—H bonds of the silicon-containing layer may be increased by reducing the Si—Cl bonds of the silicon-containing layer. Since the Si—Cl bonds have a higher bonding energy than the Si—H bonds, the formation of the Si—N bonds in step 3a, namely, the nitridation of the silicon-containing layer may be precluded. Conversely, since the Si—H bonds have a lower bonding energy than the Si—Cl bonds, the formation of the Si—N bonds in step 3a, namely, the nitridation of the silicon-containing layer may be facilitated.

That is, a silicon-containing layer having small Si—Cl bonds and a low chlorine content may be formed, so that factors that hinder the nitridation of the silicon-containing layer may be reduced and the nitridation of the silicon-containing layer in step 3a may be facilitated. Also, by increasing the Si—H bonds of the silicon-containing layer, factors that facilitate the nitridation of the silicon-containing layer may be increased, and the nitridation of the silicon-containing layer in step 3a may be further facilitated. Thus, the efficiency of the nitridation of the silicon-containing layer in step 3a may be increased, and a processing time may be shortened by reducing a nitridation time.

In addition to MCS, an inorganic material or an organic material may be used as the silicon-containing raw material. The inorganic material is a chlorosilane-based material, such as hexachlorodisilane (Si$_2$Cl$_6$ or HCDS), tetrachlorosilane (SiCl$_4$ or STC), trichlorosilane (SiHCl$_3$ or TCS), or dichlorosilane (SiH$_2$Cl$_2$ or DCS), trisilane (Si$_3$H$_8$ or TS), disilane (Si$_2$H$_6$ or DS), or monosilane (SiH$_4$ or MS). The organic material is an aminosilane-based material, such as tetrakis (dimethylamino)silane (Si[N(CH$_3$)$_2$]$_4$ or 4DMAS), tris(dimethylamino)silane (Si[N(CH$_3$)$_2$]$_3$H or 3DMAS), bis(dimethylamino)silane (Si[N(C$_2$H$_5$)$_2$]$_2$H$_2$ or 2DEAS), or bis (tertiary-butylamino)silane (SiH$_2$[NH(C$_4$H$_9$)]$_2$ or BTBAS). When a chlorine-containing chlorosilane-based source is used, a source having a small number of chlorine atoms in a compositional formula is preferably used, and MCS is most preferably used. In addition to N$_2$ gas, a rare gas, such as Ar gas, helium (He) gas, neon (Ne) gas, or xenon (Xe) gas, may be used as an inert gas.

[Step 2a]

After the silicon-containing layer is formed on the wafer 200, the supply of the MCS gas is stopped by closing off the valve 243a of the first gas supply pipe 232a. In this case, the inside of the processing chamber 201 is vacuum-exhausted by the vacuum pump 246 with the APC valve 244 of the exhaust pipe 231 open, so that the remaining MCS gas, which does not react or has contributed to formation of the silicon-containing layer, is excluded from the processing chamber 201. In this case, the supply of N$_2$ gas serving as an inert gas into the processing chamber 201 is maintained with the valves 243d, 243e, and 243f open. The N$_2$ gas functions as a purge gas so that the remaining MCS gas, which does not react or has contributed to formation of the silicon-containing layer, is more effectively excluded from the processing chamber 201 (first purge process).

In this case, gases remaining in the processing chamber 201 may not be completely excluded, and the inside of the processing chamber 201 may not be completely purged. When a very small amount of gas remains in the processing chamber 201, the subsequent step 3a is not adversely affected. In this case, $N_2$ gas supplied into the processing chamber 201 does not need to be supplied at a high flow rate. For example, a purge process may be performed to such an extent as not to adversely affect step 3a by supplying $N_2$ gas in an amount equal to the capacity of the reaction tube 203 [processing chamber 201]. Thus, the inside of the processing chamber 201 may not be completely purged to shorten a purge time and improve throughput. Also, the consumption of $N_2$ gas may be suppressed to the minimum.

In this case, a temperature of the heater 207 is set such that a temperature of the wafer 200 is adjusted to a constant temperature in the range of about 250° C. to about 630° C., preferably, about 300° C. to about 500° C., as when MCS gas is supplied. A flow rate of $N_2$ gas supplied as a purge gas is adjusted within the range of, for example, about 100 sccm to about 2000 sccm (about 0.1 slm to about 2 slm). In addition to $N_2$ gas, a rare gas, such as Ar gas, He gas, Ne gas, or Xe gas, may be used as the purge gas.

[Step 3a]

After the remaining gas is removed from the processing chamber 201, $NH_3$ gas is simultaneously excited into plasma by two plasma generation units (excitation units), and the plasma-excited $NH_3$ gas is simultaneously supplied from the two plasma generation units (excitation units) into the processing chamber 201 ($NH_3$ gas supply process).

That is, $NH_3$ gas is supplied into the second gas supply pipe 232b by opening the valve 243b of the second gas supply pipe 232b. A flow rate of the $NH_3$ gas supplied into the second gas supply pipe 232b is adjusted by the MFC 241b. The $NH_3$ gas having the adjusted flow rate is supplied into the buffer chamber 237b through the gas supply port 248b of the second nozzle 233b. In this case, RF power is applied via the matching device 272 from the RF power source 273 interposed between the first and second rod electrodes 269b and 270b so that the $NH_3$ gas supplied into the buffer chamber 237b is plasma-excited, supplied as an active species through the gas supply port 238b into the processing chamber 201, and exhausted through the exhaust pipe 231. In this case, the plasma-excited $NH_3$ gas is supplied to the wafers 200. Simultaneously, $N_2$ gas may be supplied into the second inert gas supply pipe 232e by opening the valve 243e. The $N_2$ gas is supplied along with the $NH_3$ gas into the processing chamber 201 and exhausted through the exhaust pipe 231.

Simultaneously, $NH_3$ gas is supplied into the third gas supply pipe 232c by opening the valve 243c of the third gas supply pipe 232c. A flow rate of the $NH_3$ gas supplied into the third gas supply pipe 232c is adjusted by the MFC 241c. The $NH_3$ gas having the adjusted flow rate is supplied into the buffer chamber 237c through the gas supply port 248c of the third nozzle 233c. In this case, RF power is applied via the matching device 272 from the RF power source 273 interposed between the first and second rod electrodes 269c and 270c so that the $NH_3$ gas supplied into the buffer chamber 237c is plasma-excited, supplied as an active species through the gas supply port 238c into the processing chamber 201, and exhausted through the exhaust pipe 231. In this case, the plasma-excited $NH_3$ gas is supplied to the wafers 200. Simultaneously, $N_2$ gas may be supplied into the third inert gas supply pipe 232f by opening the valve 243f. The $N_2$ gas is supplied along with the $NH_3$ gas into the processing chamber 201 and exhausted through the exhaust pipe 231.

In addition, to prevent permeation of $NH_3$ gas into the first nozzle 233a, $N_2$ gas is supplied into the first inert gas supply pipe 232d by opening the valve 243d. The second gas is supplied into the processing chamber 201 via the first gas supply pipe 232a and the first nozzle 233a and exhausted through the exhaust pipe 231.

When $NH_3$ gas is plasma-excited and supplied as an active species, an inner pressure of the processing chamber 201 is controlled in the range of, for example, about 10 Pa to about 1000 Pa by appropriately adjusting the APC valve 244. A flow rate of the supplied $NH_3$ gas is controlled by each of the MFCs 241b and 241c to be in the range of, for example, about 1000 sccm to about 10000 sccm (about 1 slm to about 10 slm). A flow rate of the supplied $N_2$ gas is controlled by each of the MFCs 241e, 241f, and 241d to be in the range of, for example, about 100 sccm to about 2000 sccm (about 0.1 slm to about 2 slm). A time taken to expose the wafer 200 to the active species obtained by plasma-exciting the $NH_3$ gas, namely, a supply time (irradiation time), is adjusted within the range of, for example, about 1 second to about 120 seconds. In consideration of throughput, a temperature of the heater 207 at which the silicon-containing layer is nitrided is set at the same temperature as when MCS gas is supplied in step 1a, that is, set such that the inside of the processing chamber 201 is held at the same temperature during steps 1a and 3a. In this case, during steps 1a and 3a, the temperature of the heater 207 is set such that a temperature of the wafer 200 (i.e., an inner temperature of the processing chamber 201) is maintained at a constant temperature ranging from about 250° C. to about 630° C., preferably, about 300° C. to about 500° C. More preferably, the temperature of the heater 207 is set such that the temperature of the processing chamber 201 is held at the same temperature during steps 1a through 4a (to be described later). RF power applied from the RF power source 273 between the first rod electrodes 269b and 269c and the second rod electrodes 270b and 270c is set to be in the range of, for example, about 50 W to about 1000 W. In this case, the $NH_3$ may be heat-excited (i.e., activated due to heat) and supplied. However, when the $NH_3$ gas is thermally activated in a decompressed atmosphere, to obtain a sufficient nitriding power, an inner pressure of the processing chamber 201 needs to be adjusted to a relatively high pressure, for example, in the range of, for example, about 10 Pa to about 3000 Pa, and a temperature of the wafer 200 needs to be adjusted to a temperature of about 550° C. or more. In contrast, when the $NH_3$ gas is plasma-excited and supplied, a sufficient nitriding power may be obtained by adjusting an inner temperature of the processing chamber 201 to a temperature of, for example, about 250° C. or more. Also, when the $NH_3$ gas is plasma-excited and supplied, even if the inside of the processing chamber 201 is adjusted to room temperature, a sufficient nitriding power may be obtained. However, when the inner temperature of the processing chamber 201 is adjusted to a temperature of less than about 150° C., a reaction byproduct, such as ammonium chloride ($NH_4Cl$), adheres to the inside of the processing chamber 201 or the wafer 200. Accordingly, the inner temperature of the processing chamber 201 is preferably adjusted to a temperature of about 150° C. or more. In the present embodiment, the inner temperature of the processing chamber 201 is adjusted to a temperature of about 250° C. or more.

By supplying the $NH_3$ gas into the processing chamber 201 under the above-described conditions, $NH_3$ gas ($NH_3^*$) supplied as an active species due to plasma excitation reacts with at least a portion of the silicon-containing layer formed on the wafer 200 in step 1a. Thus, a nitriding is performed on the silicon-containing layer, and the silicon-containing layer may be changed (modified) into a SiN layer due to the nitriding.

In addition, in step 3a, RF power applied to each of a plurality of plasma generation units (excitation units) is reduced using the plurality of plasma generation units so that each of the plasma generation units can output plasma at a low output power and the amount of the active species supplied to the wafer 200 can be increased. As a result, the amount of the active species supplied to the wafer 200 may be increased while suppressing plasma damage to the wafer 200 or the silicon-containing layer.

Thus, while suppressing plasma damage to the wafers 200 or the silicon-containing layer, the amount of the active species supplied to the wafers 200 may be increased, a nitriding power may be increased, and the nitridation of the silicon-containing layer may be facilitated. That is, nitridation efficiency may be increased. Also, the silicon-containing layer may be saturated with nitride and rapidly changed into a self-limiting state (completely nitrided state), so that a nitridation time can be shortened. Thus, a processing time may be shortened. Also, the uniformity of the nitriding in the surface of the wafer 200 may be improved. That is, it becomes possible to more uniformly supply the active species to the entire surface of the wafer 200 so that, for example, the occurrence of a great difference in degree of nitridation between an outer circumference of the wafer 200 and the center of the wafer 200 may be prevented.

By use of the plurality of plasma generation units, the amount of the species supplied to the wafers 200 may be increased while suppressing plasma damage to the wafer 200 or the silicon-containing layer. Thus, chlorine contained in a low chlorine-content silicon-containing layer formed in step 1a may be efficiently desorbed. Thus, a SiN layer containing an extremely low chlorine content may be formed. Also, nitridation efficiency may be further improved by efficiently desorbing chlorine. That is, chlorine that hinders a nitriding may be efficiently desorbed from the silicon-containing layer, thereby further improving nitridation efficiency. Furthermore, chlorine desorbed from the silicon-containing layer is exhausted through the exhaust pipe 231 out of the processing chamber 201.

In addition to ammonia ($NH_3$) gas, diazine gas ($N_2H_2$), hydrazine gas ($N_2H_4$), or $N_3H_8$ gas may be used as a nitrogen-containing gas. Alternatively, an amine-based gas containing a nitrogen element may be used as the nitrogen-containing gas.

[Step 4a]

After the silicon-containing layer is changed into the SiN layer, the supply of $NH_3$ gas is stopped by closing off each of the valve 243b of the second gas supply pipe 232b and the valve 243c of the third gas supply pipe 232c. In this case, the inside of the processing chamber 201 is vacuum-exhausted by the vacuum pump 246 with the APC valve 244 of the exhaust pipe 231 open, so that the remaining $NH_3$ gas which does not react or have contributed to formation of the SiN film or byproducts are excluded from the processing chamber 201. In this case, the supply of $N_2$ gas serving as an inert gas into the processing chamber 201 is maintained with the valves 243e, 243f, and 243d open. The $N_2$ gas functions as a purge gas so that the remaining $NH_3$ gas which does not react or have contributed to formation of the SiN film or byproducts are more effectively excluded from the processing chamber 201 (second purge process).

In this case, gases remaining in the processing chamber 201 may not be completely excluded, and the inside of the processing chamber 201 may not be completely purged. When a very small amount of gas remains in the processing chamber 201, the subsequent step 1a is not adversely affected. In this case, $N_2$ gas supplied into the processing chamber 201 does not need to be supplied at a high flow rate. For example, a purge process may be performed to such an extent as not to adversely affect step 1a by supplying $N_2$ gas in an amount equal to the capacity of the reaction tube 203 (processing chamber 201). Thus, the inside of the processing chamber 201 may not be completely purged to shorten a purge time and improve throughput. Also, the consumption of $N_2$ gas may be suppressed to the minimum.

In this case, a temperature of the heater 207 is set such that a temperature of the wafer 200 is adjusted to a constant temperature in the range of about 250° C. to about 630° C., preferably, about 300° C. to about 500° C., as when $NH_3$ gas is supplied. A flow rate of $N_2$ gas supplied as a purge gas is adjusted within the range of, for example, about 100 sccm to about 2000 sccm (about 0.1 slm to about 2 slm). In addition to $N_2$ gas, a rare gas, such as Ar gas, He gas, Ne gas, or Xe gas, may be used as the purge gas.

By performing a cycle including the above-described steps 1a through 4a a predetermined number of times, preferably, plural times, a SiN film having a predetermined thickness may be formed on the wafer 200.

When the SiN film having the predetermined thickness is formed, by opening the valves 243d, 243e, and 243f, $N_2$ gas serving as an inert gas is supplied into the processing chamber 201 through each of the first inert gas supply pipe 232d, the second inert gas supply pipe 232e, and the third inert gas supply pipe 232f and exhausted through the exhaust pipe 231. The $N_2$ gas functions as a purge gas so that the inside of the processing chamber 201 can be purged with an inert gas and gases remaining in the processing chamber 201 can be exhausted from the processing chamber 201 (purge). Afterwards, an inner atmosphere of the processing chamber 201 is replaced with an inert gas, and an inner pressure of the processing chamber 201 returns to room pressure (atmospheric pressure return).

Afterwards, the seal cap 219 is moved down by the boat elevator 115. While a bottom end of the reaction tube 203 is being opened, the boat 217 is unloaded from the bottom end of the reaction tube 203 out of the reaction tube 203 with the processed wafers 200 held in the boat 217 (boat unloading). Subsequently, the processed wafers 200 are withdrawn from the boat 217 (wafer discharging).

The present embodiment has one or a plurality of the effects described below.

(a) In step 1a of the present embodiment, MCS gas is used as a gas having a low chlorine content and a high surface absorptivity. Thus, the amount of chlorine supplied into the processing chamber 201 may be reduced. Thus, a ratio of chlorine combined with a silicon containing layer to the silicon-containing layer (i.e., Si—Cl bonds) may be reduced so that a silicon-containing layer having a low chlorine content may be formed. Thus, a SiN film having a low chlorine content may be formed in step 3a. As a result, a SiN film having a low chlorine content, namely, a SiN film having a high film density, may be formed so that a resistance of the SiN film to hydrogen fluoride can be improved. Also, an insulation characteristic of the SiN film may be improved.

In addition, Si—H bonds of the silicon-containing layer may be increased by reducing Si—Cl bonds of the silicon-containing layer. Since the Si—Cl bonds have a higher bonding energy than the Si—H bonds, the formation of the Si—N bonds in step 3a, namely, the nitridation of the silicon-containing layer, may be precluded. Conversely, since the Si—H bonds have a lower bonding energy than the Si—Cl bonds, the formation of the Si—N bonds in step 3a, namely, the nitridation of the silicon-containing layer, may be facilitated.

That is, a silicon-containing layer having small Si—Cl bonds and a low chlorine content may be formed (Si—Cl bonds of a layer are reduced), so that factors that hinder the nitridation of the silicon-containing layer may be reduced and the nitridation of the silicon-containing layer in step 3a may be facilitated. Also, by increasing the Si—H bonds of the silicon-containing layer, factors that facilitate the nitridation of the silicon-containing layer may be increased, and the nitridation of the silicon-containing layer in step 3a may be further facilitated. Thus, the efficiency of the nitridation of the silicon-containing layer in step 3a may be increased, and a processing time may be shortened by reducing a nitridation time.

(b) In step 3a according to the present embodiment, $NH_3$ gas plasma-excited by a plurality of plasma generation units is simultaneously supplied from the respective plasma generation units to nitride the silicon-containing layer. RF power applied to each of a plurality of plasma generation units is reduced using the plurality of plasma generation units so that each of the plasma generation units can output plasma at a low output power and the amount of the active species supplied to the wafer 200 can be increased. As a result, the amount of the active species supplied to the wafer 200 may be increased while suppressing plasma damage to the wafer 200 or the silicon-containing layer.

When only one plasma generation unit is installed, it is necessary to increase plasma output in order to increase the amount of the active species supplied into the wafer 200. In this case, however, a plasma generation range is excessively increased so that even the wafer 200 may be exposed to plasma. Also, severe damage (plasma damage) may be applied to the wafer 200 or the SiN film formed on the wafer 200. Furthermore, the wafer 200 or the vicinity thereof may be sputtered due to plasma to generate particles, or the film quality of the SiN film may be degraded. In addition, there may be a great difference in the film quality of the SiN film formed on the wafer 200 between an outer circumference of the wafer 200 exposed to plasma and the central portion of the wafer 200 that is not exposed to plasma.

When a plurality of plasma generation units are used as in the present embodiment, the amount of the active species supplied into the wafer 200 may be increased while outputting plasma at a low output power from each of the plasma generation units, thereby preventing occurrence of the above-described problems.

(c) In the present embodiment, by use of the plurality of plasma generation units, plasma damage to the wafers 200 or the silicon-containing layer may be suppressed, the amount of the active species supplied to the wafers 200 may be increased, a nitriding power may be increased, and the nitridation of the silicon-containing layer may be facilitated. That is, nitridation efficiency may be increased. Also, the silicon-containing layer may be saturated with nitride and rapidly changed into a self-limiting state (completely nitrided state), so that a nitridation time can be shortened. Thus, a time taken to form the SiN film may be shortened, so that productivity may be improved. Also, the uniformity of the nitriding in the surface of the wafer 200 may be improved. That is, it becomes possible to more uniformly supply the active species to the entire surface of the wafer 200, thus preventing occurrence of a great difference in the film quality or film thickness of the SiN film between an outer circumference of the wafer 200 and the center of the wafer 200. As a result, it becomes possible to improve each of the film-quality uniformity and film-thickness uniformity of the SiN film in the surface of the wafer 200.

(d) In the present embodiment, by use of the plurality of plasma generation units, the amount of the species supplied to the wafers 200 may be increased while suppressing plasma damage to the wafer 200 or the silicon-containing layer. Thus, chlorine contained in the silicon-containing layer having a low chlorine content formed in step 1a may be efficiently desorbed. Thus, a SiN layer containing an extremely low chlorine content may be formed so that the chlorine content of the SiN film can be further reduced. As a result, a SiN film having an extremely low chlorine content, namely, a SiN film having an extremely high film density may be formed so that a resistance of the SiN film to hydrogen fluoride can be further improved. Also, an insulation characteristic of the SiN film may be further improved. Furthermore, nitridation efficiency may be further improved by efficiently desorbing chlorine. That is, chlorine that hinders a nitriding may be efficiently desorbed from the silicon-containing layer, thereby further improving nitridation efficiency. Also, a time taken to form the SiN film may be further reduced, thereby further enhancing productivity.

(e) The present embodiment may obtain about the same effects using the plurality of plasma generation units as in when a rotational frequency of the wafers 200 is increased (when a rotation speed is increased) during a film-forming process, and improve the uniformity of the film thickness of the SiN film in the surface of the wafer. That is, in the film-forming sequence of the present embodiment, although the intermittent supply of MCS gas or $NH_3$ gas is performed while rotating the wafer 200, there is a specific correlation between the rotational frequency of the wafer 200 and the film-thickness uniformity of the SiN film in the surface of the wafer 200. Specifically, as the rotational frequency increases (as the rotation speed increases), a region of the wafer 200 that is covered using a one-time gas supply process increases so that the thickness uniformity of the SiN film in the surface of the wafer 200 may be improved. However, since the rotational frequency of the wafer 200 has the upper limit to prevent the oscillation of the wafer 200, it may be difficult to rotate the wafer 200 at a rotational frequency of, for example, more than about 3 rpm. To overcome this drawback, the present embodiment may use two plasma generation units so that about the same effects can be obtained as when a rotational frequency is substantially doubled, and the thickness uniformity of the SiN film in the surface of the wafer can be improved. These effects are particularly increased when the SiN film is formed to a small thickness of, for example, about 50 Å or less.

(f) As described above, according to the film-forming sequence according to the present embodiment, a SiN film having an extremely low chlorine content, namely, a SiN film having an extremely high film density, may be formed in a low-temperature region of, for example, about 500° C. or less and about 400° C. or less. Thus, a resistance of the SiN film to hydrogen fluoride and an insulating characteristic of the SiN film may be improved to enhance film quality. Also, while suppressing plasma damage to the wafer 200 or the silicon-containing layer, the efficiency of nitridation of the silicon-containing layer may be increased, a nitridation time may be shortened, and a processing time may be shortened so that throughput may be improved. In addition, by improving the uniformity of the nitriding in the surface of the wafer, it becomes possible to improve each of the film-quality uniformity and film-thickness uniformity of the SiN film in the surface of the wafer. Furthermore, the occurrence of dangling bonds due to steric hindrance may be reduced during a film-forming process. Since the SiN film has a low chlorine content, natural oxidation of the SiN film may be suppressed during the transfer of the wafer 200 in the boat unloading step.

Furthermore, it was confirmed that the SiN film formed using the film-forming sequence of the present embodiment had a higher density than the SiN film formed using a typical process of alternately supplying DCS gas and $NH_3$ gas. Also, it was confirmed that the SiN film formed using the film-forming sequence of the present embodiment had a much lower dopant concentration (e.g., chlorine content) than the SiN film formed using the typical process of alternately supplying DCS gas and $NH_3$ gas. In addition, it was confirmed that in the film-forming sequence of the present embodiment, even if a silicon source devoid of chlorine atoms was used, an etch rate to hydrogen fluoride could be reduced.

Modified Example of First Embodiment

The above-described first embodiment describes an example of the process of forming the SiN film to a predetermined thickness on the wafer 200 by performing a cycle including sequentially performing steps 1a, 2a, 3a, and 4a at least once, preferably, plural times, but steps 1a and 3a may be exchanged. That is, a SiN film may be formed on the wafer to a predetermined thickness by performing a cycle including sequentially performing steps 3a, 2a, 1a, and 4a at least once, preferably, plural times.

Second Embodiment of the Present Invention

Figure 6:
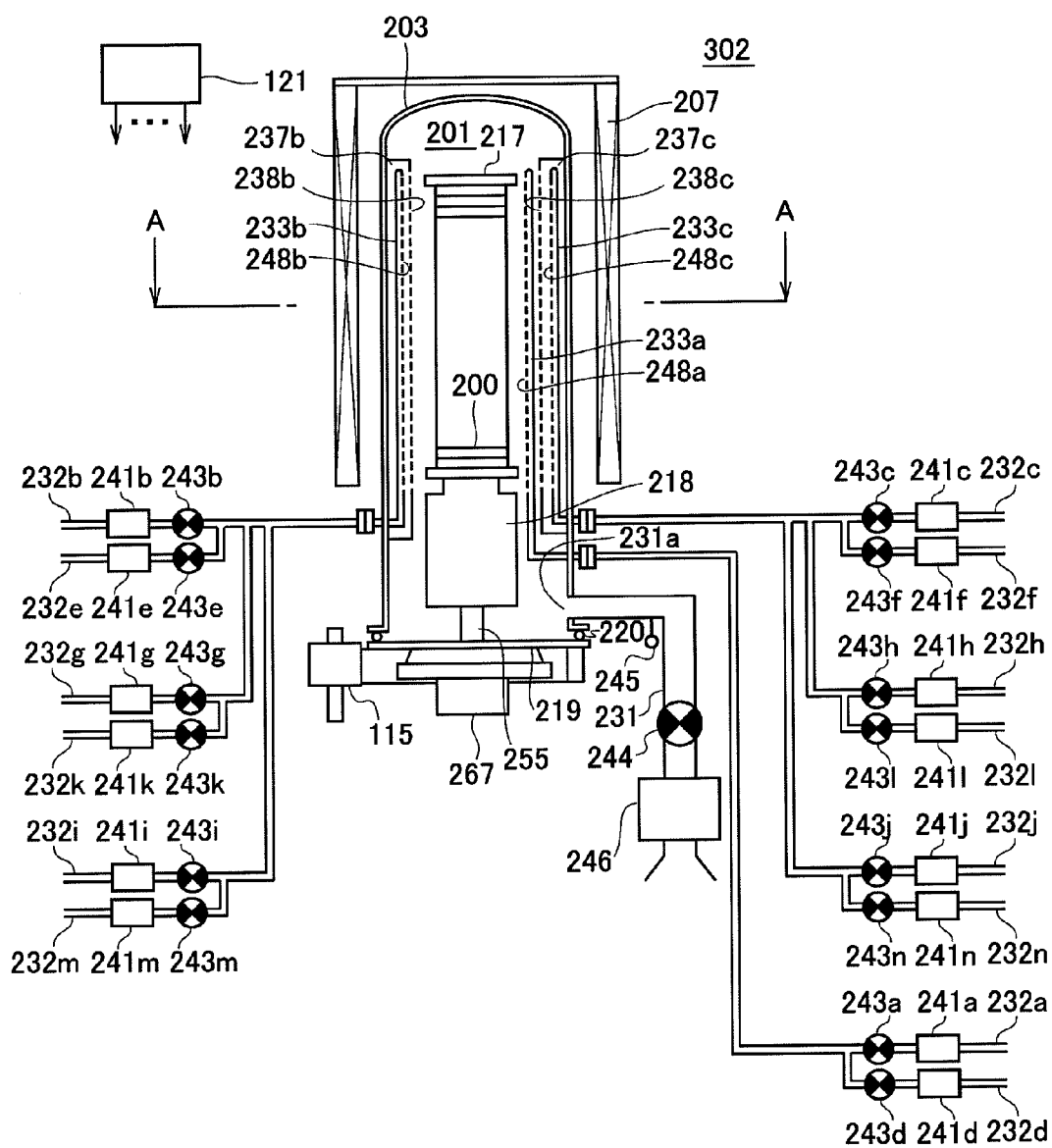
FIG. 6 is a schematic construction diagram of a vertical processing furnace of a substrate processing apparatus preferably used in the second embodiment of the present invention, which is a longitudinal sectional view of a portion of the processing furnace.

Next, a second embodiment of the present invention will be described. FIG. 6 is a schematic construction diagram of a vertical processing furnace of a substrate processing apparatus preferably used in the present embodiment, which is a longitudinal sectional view of a portion of a processing furnace 302. Also, FIG. 2 is a schematic construction diagram of a vertical processing furnace that may be preferably used in the present embodiment, which is a sectional view of the processing furnace 302 taken along line A-A of FIG. 6.

The processing furnace 302 according to the present embodiment has the same configuration as the processing furnace 202 according to the first embodiment, which is shown in FIG. 1, except that a third gas supply system (first modification gas supply system) configured to supply a hydrogen-containing gas serving as a first modification gas to a wafer 200 disposed in a processing chamber 201 and a fourth gas supply system (second modification gas supply system) configured to supply at least one of nitrogen gas and a rare gas as a second modification gas to the wafer 200 disposed in the processing chamber 201 are further installed in addition to the first and second gas supply systems. Hereinafter, only differences between the present embodiment and the first embodiment will be described. Substantially the same elements as in the first embodiment are denoted by the same reference numerals, and a description thereof will be omitted.

As shown in FIG. 6, each of a fourth gas supply pipe 232g and a sixth gas supply pipe 232i is connected to a downstream side lower than a valve 243b of a second gas supply pipe 232b (downstream side lower than a part connected to a second inert gas supply pipe 232e). Also, each of a fifth gas supply pipe 232h and a seventh gas supply pipe 232j is connected to a downstream side lower than a valve 243c of a third gas supply pipe 232c (downstream side lower than a part connected to a third inert gas supply pipe 232f).

An MFC 241g serving as a flow-rate controller (flow-rate control unit) and a valve 243g serving as an opening/closing valve are installed in the fourth gas supply pipe 232g in sequential order from an upstream direction. Also, a fourth inert gas supply pipe 232k is connected to a downstream side lower than the valve 243g of the fourth gas supply pipe 232g. An MFC 241k and a valve 243k serving as an opening/closing valve are installed in the fourth inert gas supply pipe 232k in sequential order from the upstream direction.

An MFC 241h serving as a flow-rate controller (flow-rate control unit) and a valve 243h serving as an opening/closing valve are installed in the fifth gas supply pipe 232h in sequential order from the upstream direction. Also, a fifth inert gas supply pipe 232l is connected to a downstream side lower than the valve 243h of the fifth gas supply pipe 232h. An MFC 241l serving as a flow-rate controller (flow-rate control unit) and a valve 243l serving as an opening/closing valve are installed in the fifth inert gas supply pipe 232l in sequential order from the upstream direction.

An MFC 241i serving as a flow-rate controller (flow-rate control unit) and a valve 243i serving as an opening/closing valve are installed in the sixth gas supply pipe 232i in sequential order from the upstream direction. Also, an eighth gas supply pipe 232m is connected to a downstream side lower than the valve 243i of the sixth gas supply pipe 232i. An MFC 241m serving as a flow-rate controller (flow-rate control unit) and a valve 243m serving as an opening/closing valve are installed in the eighth gas supply pipe 232m in sequential order from the upstream direction.

An MFC 241j serving as a flow-rate controller (flow-rate control unit) and a valve 243j serving an opening/closing valve are installed in the seventh gas supply pipe 232j in sequential order from the upstream direction. Also, a ninth gas supply pipe 232n is connected to a downstream side lower than the valve 243j of the seventh gas supply pipe 232j. An MFC 241n serving as a flow-rate controller (flow-rate control unit) and a valve 243n serving as an opening/closing valve are installed in the ninth gas supply pipe 232n in the sequential order from the upstream direction.

A gas containing hydrogen (H) (a hydrogen-containing gas) serving as a first modification gas, for example, hydrogen ($H_2$) gas, is supplied through the fourth gas supply pipe 232g via the MFC 241g, the valve 243g, the second gas supply pipe 232b, the second nozzle 233b, and the buffer chamber 237b into the processing chamber 201. Simultaneously, an inert gas may be supplied through the fourth inert gas supply pipe 232k via the MFC 241k, and the valve 243k into the fourth gas supply pipe 232g.

A gas containing hydrogen (H) (a hydrogen-containing gas) serving as a first modification gas, for example, hydrogen ($H_2$) gas, is supplied through the fifth gas supply pipe 232h via the MFC 241h, the valve 243h, the third gas supply pipe 232c, the third nozzle 233c, and the buffer chamber 237c into the processing chamber 201. Simultaneously, an inert gas may be supplied through the fifth inert gas supply pipe 232l via the MFC 241l and the valve 243l into the fifth gas supply pipe 232h.

A rare gas serving as a second modification gas, for example, argon (Ar) gas, is supplied through the sixth gas supply pipe 232i via the MFC 241i, the valve 243i, the second gas supply pipe 232b, the second nozzle 233b, and the buffer chamber 237b into the processing chamber 201.

A rare gas serving as a second modification gas, for example, Ar gas, is supplied through the seventh gas supply pipe 232j via the MFC 241j, the valve 243j, the third gas supply pipe 232c, the third nozzle 233c, and the buffer chamber 237c into the processing chamber 201.

A second modification gas, for example, nitrogen ($N_2$) gas, is supplied through the eighth gas supply pipe 232m via the MFC 241m, the valve 243m, the sixth gas supply pipe 232i, the second gas supply pipe 232b, the second nozzle 233b, and the buffer chamber 237b into the processing chamber 201.

A second modification gas, for example, nitrogen gas, is supplied through the ninth gas supply pipe 232n via the MFC 241n, the valve 243n, the seventh gas supply pipe 232j, the third gas supply pipe 232c, the third nozzle 233c, and the buffer chamber 237c into the processing chamber 201.

When gas is supplied through the fourth gas supply pipe 232g and the fifth gas supply pipe 232h as described above, a third gas supply system (a first modification gas supply system) configured to supply a hydrogen-containing gas to the wafer 200 disposed in the processing chamber 201 is mainly configured with the fourth gas supply pipe 232g, the fifth gas supply pipe 232h, the MFCs 241g and 241h, and the valves 243g and 243h. Also, a portion of the second gas supply pipe 232b, a portion of the third gas supply pipe 232c, the second nozzle 233b, the third nozzle 233c, and the buffer chambers 237b and 237c may be regarded as being included in the third gas supply system. Also, a third inert gas supply system is mainly configured with the fourth inert gas supply pipe 232k, the fifth inert gas supply pipe 232l, the MFCs 241k and 241l, and the valves 243k and 243l. The third inert gas supply system also functions as a purge gas supply system.

In addition, when gas is supplied through the sixth gas supply pipe 232i, the seventh gas supply pipe 232j, the eighth gas supply pipe 232m, and the ninth gas supply pipe 232n as described above, a fourth gas supply system (second modification gas supply system) configured to supply at least one of a nitrogen gas and a rare gas to the wafer 200 disposed in the processing chamber 201 is mainly configured with the sixth gas supply pipe 232i, the seventh gas supply pipe 232j, the eighth gas supply pipe 232m, the ninth gas supply pipe 232n, the MFCs 241i, 241j, 241m, and 241n, and the valves 243i, 243j, 243m, and 243n. Also, a portion of the second gas supply pipe 232b, a portion of the third gas supply pipe 232c, the second nozzle 233b, the third nozzle 233c, and the buffer chambers 237b and 237c may be regarded as being included in the fourth gas supply system. The fourth gas supply system functions as the fourth inert gas supply system and also functions as the purge gas supply system. That is, the fourth gas supply system serves as both the second modification gas supply system and the fourth inert gas supply system (purge gas supply system).

In addition, as shown in brackets of FIG. 5, an I/O port 121d of a controller 121 according to the present embodiment is also connected to the above-described MFCs 241g, 241h, 241i, 241j, 241k, 241l, 241m, and 241n and valves 243g, 243h, 243i, 243j, 243k, 243l, 243m, and 243n. Also, the CPU 121a is configured to further control operations of adjusting the flow rates of various gases using the MFCs 241g, 241h, 241i, 241j, 241k, 241l, 241m, and 241n and operations of opening and closing off the valves 243g, 243h, 243i, 243j, 243k, 243l, 243m, and 243n to follow the contents of a process recipe read from the memory device 121c. Also, the controller 121 according to the present embodiment has the same configuration as the controller 121 according to the first embodiment except for the above-described points.

Next, an example of a method of forming a nitride film as an insulating film on a substrate using the processing furnace 302 of the above-described substrate processing apparatus will be described as a process of a manufacturing process of a semiconductor device. Also, in the following description, an operation of each component constituting the substrate processing apparatus is controlled by the controller 121.

Figure 7:
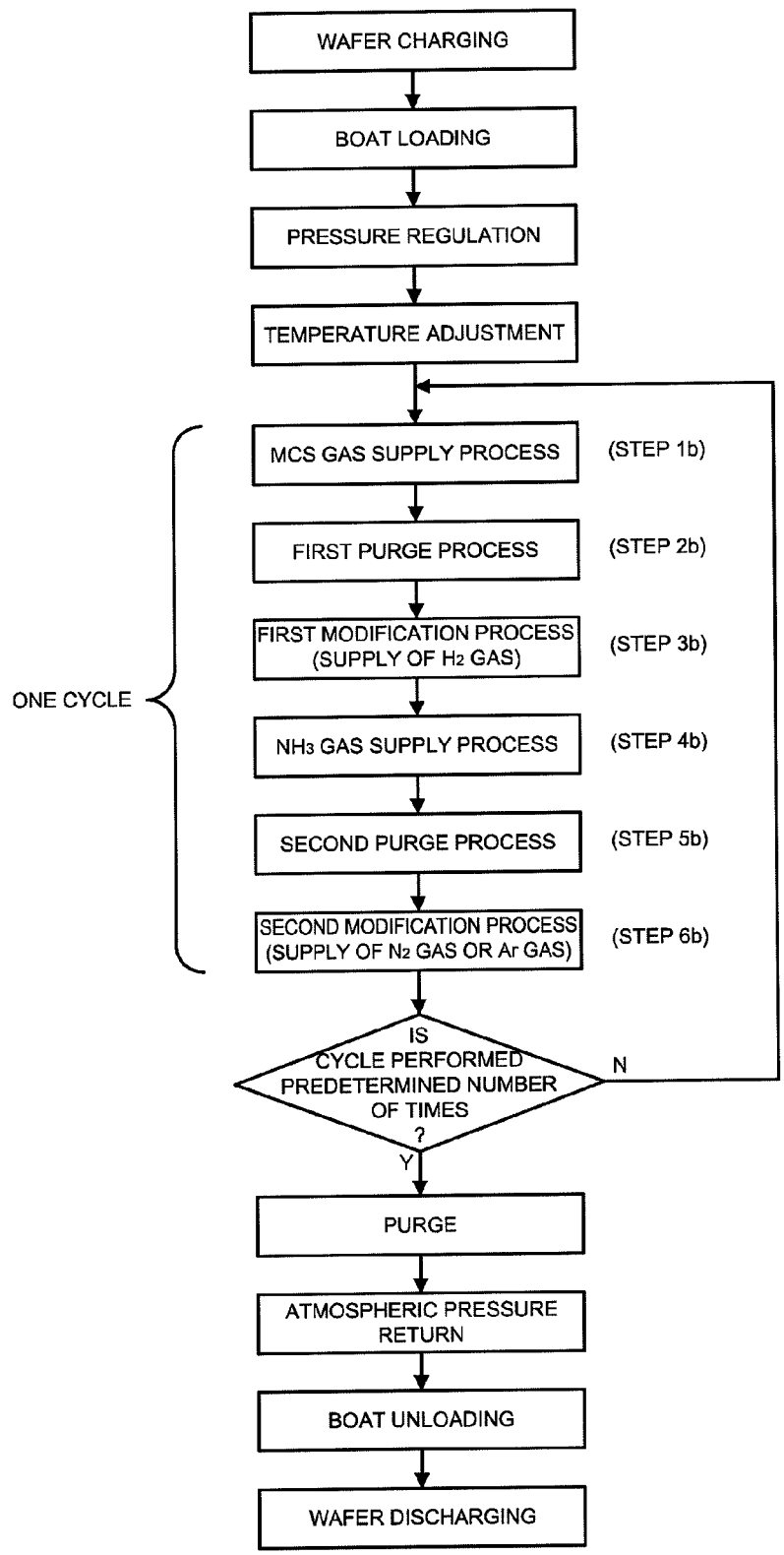
FIG. 7 is a flowchart illustrating a process of forming a film according to the second embodiment of the present invention.
Figure 8:
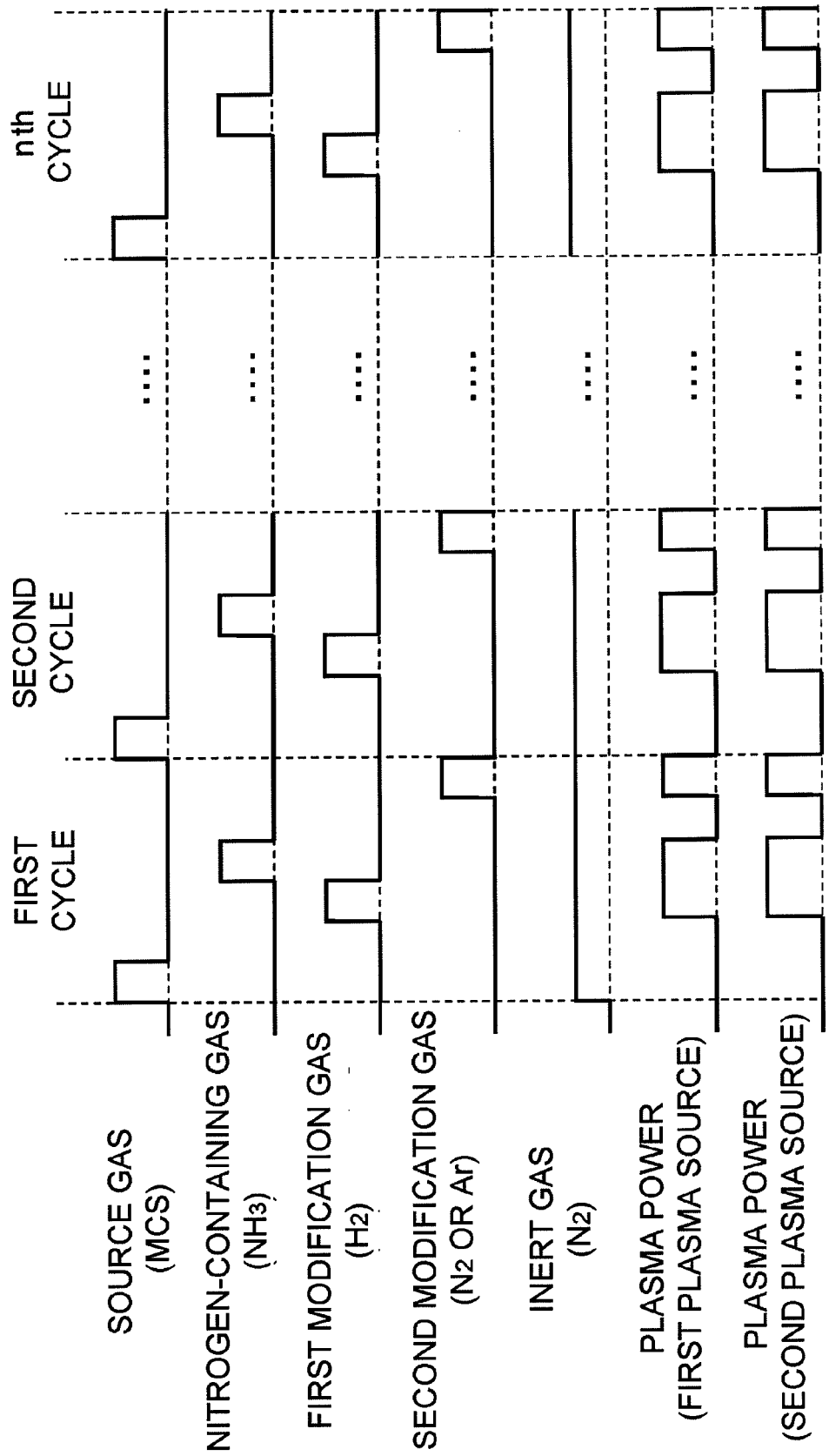
FIG. 8 is a timing diagram of the supply of gases and the supply of plasma power in a film-forming sequence according to the second embodiment of the present invention.

FIG. 7 is a flowchart illustrating a process of forming a film according to the present embodiment, and FIG. 8 is a timing diagram of the supply of gases and the supply of plasma power in a film-forming sequence according to the present embodiment. The film-forming sequence according to the present embodiment includes performing a cycle including a process of supplying MCS gas as a source gas to a wafer 200 disposed in a processing chamber 201, a process of supplying a plasma-excited hydrogen-containing gas (first modification gas) to the wafer 200 disposed in the processing chamber 201, a process of supplying a plasma-excited or heat-excited nitrogen-containing gas to the wafer 200 disposed in the processing chamber 201, and a process of supplying at least one (second modification gas) of plasma-excited nitrogen gas and a plasma-excited rare gas to the wafer 200 disposed in the processing chamber 201 to form a SiN film on the wafer 200 a predetermined number of times.

In addition, FIGS. 7 and 8 illustrate a film-forming sequence in which the process of supplying the plasma-excited hydrogen-containing gas (first modification gas) is performed during a predetermined period after the process of supplying the MCS gas, that is, during a supply stop period of the nitrogen-containing gas before the process of supplying the nitrogen-containing gas and the process of supplying at least one (second modification gas) of the plasma-excited nitrogen gas and the plasma-excited rare gas is performed during a predetermined period after the process of supplying the plasma-excited or heat-excited nitrogen-containing gas, that is, during a supply stop period of the MCS gas before the process of supplying the MCS gas.

Hereinafter, the film-forming sequence shown in FIGS. 7 and 8 will be described in detail. Here, an example of a process of forming a SiN film as an insulating film on the wafer 200 according to the flowchart of FIG. 7 and the film-forming sequence of FIG. 8 using MCS gas, $H_2$ gas, $NH_3$ gas, and Ar gas as a source gas, a hydrogen-containing gas, a nitrogen-containing gas, and a rare gas, respectively, will be described.

A wafer charging step, a boat loading step, a pressure regulating step, a temperature adjusting step, and a wafer rotation initiation step are performed in the same manner as in the first embodiment. Subsequently, the following six steps are sequentially performed.

[Step 1b]

Step 1b is performed in the same manner as step 1a of the first embodiment (MCS gas supply process). Processing conditions, caused reactions, and formed layers of step 1b are the same as those of step 1a of the first embodiment. That is, in step 1b, a silicon-containing layer is formed on the wafer 200 by supplying the MCS gas into the processing chamber 201.

In addition, as in the first embodiment, to prevent permeation of the MCS gas into the second nozzle 233b, the third nozzle 233c, and the buffer chambers 237b and 237c, by opening the valves 243e, 243f, 243k, 243l, 243m, and 243n, $N_2$ gas is supplied into the second inert gas supply pipe 232e, the third inert gas supply pipe 232f, the fourth inert gas supply pipe 232k, the fifth inert gas supply pipe 232l, the eighth gas supply pipe 232m, and the ninth gas supply pipe 232n. The $N_2$ gas is supplied into the processing chamber 201 via the second gas supply pipe 232b, the third gas supply pipe 232c, the second nozzle 233b, the third nozzle 233c, and the buffer chambers 237b and 237c and exhausted through the exhaust pipe 231. A flow rate of the supplied $N_2$ gas is controlled by each of the MFCs 241d, 241e, 241f, 241k, 241l, 241m, and 241n to be in the range of, for example, about 100 sccm to about 2000 sccm (0.1 slm to 2 μm).

[Step 2b]

Step 2b is performed in the same manner as step 2a of the first embodiment (first purge process). In step 2b, the remaining MCS gas, which does not react or has contributed to formation of the silicon-containing layer, is excluded from the processing chamber 201. In this case, the supply of $N_2$ gas serving as an inert gas into the processing chamber 201 is maintained with the valves 243d, 243e, 243f, 243k, 243l, 243m, and 243n open. A flow rate of the supplied N₂ gas serving as a purge gas is controlled to be in the range of, for example, about 100 sccm to about 2000 sccm (about 0.1 slm to about 2 slm). Also, as in the first embodiment, gases remaining in the processing chamber 201 may not be completely excluded, and the inside of the processing chamber 201 may not be completely purged.

[Step 3b]

After removing the remaining gas from the processing chamber 201, H₂ gas is simultaneously excited into plasma by two plasma generation units (excitation units), and the plasma-excited H₂ gas is simultaneously supplied from the two plasma generation units (excitation units) into the processing chamber 201 (first modification process (H₂ gas supply process)).

That is, the H₂ gas is supplied into the fourth gas supply pipe 232g by opening the valve 243g of the fourth gas supply pipe 232g. A flow rate of the H₂ gas supplied into the fourth gas supply pipe 232g is adjusted by the MFC 241g. The H₂ gas having the adjusted flow rate is supplied into the buffer chamber 237b through the gas supply port 248b of the second nozzle 233b. In this case, RF power is applied via the matching device 272 from the RF power source 273 between the first and second rod electrodes 269b and 270b so that the H₂ gas supplied into the buffer chamber 237b is plasma-excited, supplied as an active species through the gas supply port 238b into the processing chamber 201, and exhausted through the exhaust pipe 231. In this case, the plasma-excited H₂ gas is supplied to the wafers 200. Simultaneously, N₂ gas may be supplied into the fourth inert gas supply pipe 232k by opening the valve 243k. The N₂ gas is supplied along with the H₂ gas into the processing chamber 201 and exhausted through the exhaust pipe 231.

Simultaneously, H₂ gas is supplied into the fifth gas supply pipe 232h by opening the valve 243h of the fifth gas supply pipe 232h. A flow rate of the H₂ gas supplied into the fifth gas supply pipe 232h is adjusted by the MFC 241h. The H₂ gas having the adjusted flow rate is supplied into the buffer chamber 237c through the gas supply port 248c of the third nozzle 233c. In this case, RF power is applied via the matching device 272 from the RF power source 273 between the first and second rod electrodes 269c and 270c so that the H₂ gas supplied into the buffer chamber 237c is plasma-excited, supplied as an active species through the gas supply port 238c into the processing chamber 201, and exhausted through the exhaust pipe 231. In this case, the plasma-excited H₂ gas is supplied to the wafers 200. Simultaneously, N₂ gas may be supplied into the fifth inert gas supply pipe 232l by opening the valve 243l. The N₂ gas is supplied along with the H₂ gas into the processing chamber 201 and exhausted through the exhaust pipe 231.

In addition, to prevent permeation of the H₂ gas into the first nozzle 233a, the valve 243d is opened to supply N₂ gas into the first inert gas supply pipe 232d. The N₂ gas is supplied into the processing chamber 201 via the first gas supply pipe 232a and the first nozzle 233a and exhausted through the exhaust pipe 231.

When H₂ gas is plasma-excited and supplied as an active species, an inner pressure of the processing chamber 201 is controlled in the range of, for example, about 10 Pa to about 1000 Pa by appropriately adjusting the APC valve 244. A flow rate of the supplied H₂ gas is controlled by each of the MFCs 241g and 241h to be in the range of, for example, about 100 sccm to about 10000 sccm (about 0.1 slm to about 10 slm). A flow rate of the supplied N₂ gas is controlled by the MFCs 241k, 241l, and 241d to be in the range of, for example, about 100 sccm to about 2000 sccm (about 0.1 slm to about 2 slm). A time taken to expose the wafer 200 to the active species obtained by plasma-exciting the H₂ gas, namely, a gas supply time (irradiation time), is adjusted within the range of, for example, about 1 second to about 120 seconds. In consideration of throughput, a temperature of the heater 207 is set at the same temperature as when MCS gas is supplied in step 1b, that is, set such that the inside of the processing chamber 201 is held at the same temperature during steps 1b through 3b. In this case, during steps 1b through 3b, the temperature of the heater 207 is set such that a temperature of the wafer 200 (i.e., an inner temperature of the processing chamber 201) is maintained at a constant temperature ranging from about 250° C. to about 630° C., preferably, about 300° C. to about 500° C. More preferably, the temperature of the heater 207 is set such that the temperature of the processing chamber 201 is held at the same temperature during steps 1b through 6b (that will be described later). RF power applied from the RF power source 273 between the first and second rod electrodes 269b and 270b and between the first and second rod electrodes 269c and 270c is set to be in the range of, for example, about 50 W to about 1000 W.

By supplying the H₂ gas into the processing chamber 201 under the above-described conditions, H₂ gas (H₂*) supplied as an active species due to plasma excitation reacts with at least a portion of the silicon-containing layer formed on the wafer 200 in step 1b. Thus, impurities, such as hydrogen or chloride, may be efficiently desorbed from the silicon-containing layer. Accordingly, a silicon-containing layer having an extremely low dopant concentration may be formed. Also, the efficiency of a nitriding performed in step 4b to be described later may be improved by efficiently desorbing chlorine. That is, chlorine that hinders the nitriding may be efficiently desorbed from the silicon-containing layer, thereby improving the efficiency of the nitriding performed in step 4b to be described later. Thus, a modification process is performed on the silicon-containing layer. Also, the impurities, such as hydrogen or chlorine, which are desorbed from the silicon-containing layer, are exhausted through the exhaust pipe 231 out of the processing chamber 201.

In step 3b, RF power applied to each of a plurality of plasma generation units (excitation units) is reduced using the plurality of plasma generation units so that each of the plasma generation units (excitation units) can output plasma at a low output power and the amount of the active species supplied to the wafer 200 can be increased. As a result, the amount of the active species supplied to the wafer 200 may be increased while suppressing plasma damage to the wafer 200 or the silicon-containing layer.

Thus, the amount of an active species supplied to the wafer 200 may be increased while suppressing plasma damage to the wafer 200 or the silicon-containing layer, and the dopant concentration of the silicon-containing layer may be reduced by increasing the efficiency of the above-described removal of the impurities. As a result, a processing time may be shortened. Also, the uniformity of the dopant concentration in the surface of the wafer 200 may be improved. That is, it becomes possible to more uniformly supply the active species to the entire surface of the wafer 200 and, for example, the occurrence of a great difference in dopant concentration between an outer circumference of the wafer 200 and the center of the wafer 200 may be prevented.

[Step 4b]

Step 4b is performed in the same manner as step 3a of the first embodiment (NH₃ gas supply process). Processing conditions, caused reactions, and formed layers of step 4b are the same as those of step 3a of the first embodiment. That is, $NH_3$ gas that is plasma-excited in step 4b and supplied as an active species reacts with at least a portion of the silicon-containing layer that is formed on the wafer 200 in step 1b and whose impurities are removed in step 3b. Thus, a nitriding is performed on the silicon-containing layer, and the silicon-containing layer may be changed (modified) into a SiN layer due to the nitriding. In this case, the silicon-containing layer may be nitrided using heat-excited $NH_3$ gas as in the first embodiment.

In addition, to prevent permeation of the $NH_3$ gas into the first nozzle 233a as in the first embodiment, the valve 243d is opened to supply $N_2$ gas into the first inert gas supply pipe 232d. The $N_2$ gas is supplied into the processing chamber 201 via the first gas supply pipe 232a and the first nozzle 233a and exhausted through the exhaust pipe 231. A flow rate of the supplied $N_2$ gas is controlled by each of the MFCs 241e, 241f, and 241d to be in the range of, for example, about 100 sccm to about 2000 sccm (about 0.1 slm to about 2 slm).

[Step 5b]

Step 5b is performed in the same manner as step 4a of the first embodiment (second purge process). In step 5b, the remaining $NH_3$ gas, which does not react or have contributed to formation of the SiN film or byproducts are excluded from the processing chamber 201. In this case, the supply of $N_2$ gas serving as an inert gas into the processing chamber 201 is maintained with the valves 243e, 243f, and 243d open. A flow rate of the supplied $N_2$ gas serving as a purge gas is controlled to be in the range of, for example, about 100 sccm to about 2000 sccm (about 0.1 slm to about 2 slm). Also, as in the first embodiment, gases remaining in the processing chamber 201 may not be completely excluded, and the inside of the processing chamber 201 may not be completely purged.

[Step 6b]

After removing the remaining gas from the processing chamber 201, at least one of $N_2$ gas and Ar gas is simultaneously excited into plasma by two plasma generation units (excitation units), and at least one of the plasma-excited $N_2$ gas and the plasma-excited Ar gas is simultaneously supplied from the two plasma generation units (excitation units) into the processing chamber 201 (second modification process ($N_2$ or Ar gas supply process)). Hereinafter, each of a case where the plasma-excited $N_2$ gas is supplied and a case where $N_2$ gas is supplied will be described.

(When Plasma-Excited $N_2$ Gas is Supplied)

In this case, the $N_2$ gas is supplied into the eighth gas supply pipe 232m by opening the valve 243m of the eighth gas supply pipe 232m. A flow gas of the $N_2$ gas supplied into the eighth gas supply pipe 232m is adjusted by the MFC 241m. The $N_2$ gas having the adjusted flow rate is supplied into the buffer chamber 237b through the gas supply port 248b of the second nozzle 233b. In this case, RF power is applied via the matching device 272 from the RF power source 273 between the first and second rod electrodes 269b and 270b so that the $N_2$ gas supplied into the buffer chamber 237b is plasma-excited, supplied as an active species through the gas supply port 238b into the processing chamber 201, and exhausted through the exhaust pipe 231. In this case, the plasma-excited $N_2$ gas is supplied to the wafers 200.

Simultaneously, $N_2$ gas is supplied into the ninth gas supply pipe 232n by opening the valve 243n of the ninth gas supply pipe 232n. A flow gas of the $N_2$ gas supplied into the ninth gas supply pipe 232n is adjusted by the MFC 241n. The $N_2$ gas having the adjusted flow rate is supplied into the buffer chamber 237c through the gas supply port 248c of the third nozzle 233c. In this case, RF power is applied via the matching device 272 from the RF power source 273 between the first and second rod electrodes 269c and 270c so that the $N_2$ gas supplied into the buffer chamber 237c is plasma-excited, supplied as an active species through the gas supply port 238c into the processing chamber 201, and exhausted through the exhaust pipe 231. In this case, the plasma-excited $N_2$ gas is supplied to the wafers 200.

In addition, to prevent permeation of the plasma-excited $N_2$ gas into the first nozzle 233a, the valve 243d is opened to supply $N_2$ gas into the first inert gas supply pipe 232d. The $N_2$ gas is supplied into the processing chamber 201 via the first gas supply pipe 232a and the first nozzle 233a and exhausted through the exhaust pipe 231.

When $N_2$ gas is plasma-excited and supplied as an active species, an inner pressure of the processing chamber 201 is controlled within the range of, for example, about 10 Pa to about 1000 Pa by appropriately adjusting the APC valve 244. A flow rate of the supplied $N_2$ gas is controlled by each of the MFCs 241m and 241n to be in the range of, for example, about 100 sccm to about 10000 sccm (about 0.1 slm to about 10 slm). A flow rate of the supplied $N_2$ gas is controlled by the MFC 241d to be in the range of, for example, about 100 sccm to about 2000 sccm (about 0.1 slim to about 2 slm). A time taken to expose the wafer 200 to the active species obtained by plasma-exciting the $N_2$ gas, namely, a gas supply time (irradiation time), is adjusted within the range of, for example, about 1 second to about 120 seconds. In consideration of throughput, a temperature of the heater 207 is set at the same temperature as when MCS gas is supplied in step 1b, that is, set such that the inside of the processing chamber 201 is held at the same temperature during steps 1b through 6b. In this case, during steps 1b through 6b, the temperature of the heater 207 is set such that a temperature of the wafer 200 (i.e., an inner temperature of the processing chamber 201) is maintained at a constant temperature ranging from about 250° C. to about 630° C., preferably, about 300° C. to about 500° C. RF power applied from the RF power source 273 between the first and second rod electrodes 269b and 270b and between the first and second rod electrodes 269c and 270c is set to be in the range of, for example, about 50 W to about 1000 W.

(When the Plasma-Excited Ar Gas is Supplied)

Ar gas is supplied into the sixth gas supply pipe 232i by opening the valve 243i of the sixth gas supply pipe 232i. A flow gas of the Ar gas supplied into the sixth gas supply pipe 232i is adjusted by the MFC 241i. The Ar gas having the adjusted flow rate is supplied into the buffer chamber 237b through the gas supply port 248b of the second nozzle 233b. In this case, RF power is applied via the matching device 272 from the RF power source 273 between the first and second rod electrodes 269b and 270b so that the Ar gas supplied into the buffer chamber 237b is plasma-excited, supplied as an active species through the gas supply port 238b into the processing chamber 201, and exhausted through the exhaust pipe 231. In this case, the plasma-excited Ar gas is supplied to the wafers 200. Simultaneously, the valve 243m may be opened to supply $N_2$ gas into the eighth gas supply pipe 232m. That is, a mixture of the Ar gas and the $N_2$ gas may be plasma-excited and supplied to the wafers 200.

Simultaneously, Ar gas is supplied into the seventh gas supply pipe 232j by opening the valve 243j of the seventh gas supply pipe 232j. A flow rate of the Ar gas supplied into the seventh gas supply pipe 232j is adjusted by the MFC 241j. The Ar gas having the adjusted flow rate is supplied into the buffer chamber 237c through the gas supply port 248c of the third nozzle 233c. In this case, RF power is applied via the matching device 272 from the RF power source 273 between the first and second rod electrodes 269c and 270c so that the $N_2$ and Ar gases supplied into the buffer chamber 237c are plasma-excited, supplied as an active species through the gas supply port 238c into the processing chamber 201, and exhausted through the exhaust pipe 231. In this case, the plasma-excited Ar gas is supplied to the wafers 200. Simultaneously, the valve 243n may be opened to supply the $N_2$ gas into the ninth gas supply pipe 232n. That is, a mixture of the Ar and $N_2$ gases may be plasma-excited and supplied to the wafer 200.

In addition, to prevent permeation of plasma-excited Ar gas into the first nozzle 233a, the valve 243d is opened to supply $N_2$ gas into the first inert gas supply pipe 232d. The $N_2$ gas is supplied into the processing chamber 201 via the first gas supply pipe 232a and the first nozzle 233a and exhausted through the exhaust pipe 231.

When Ar gas is plasma-excited and supplied as an active species, an inner pressure of the processing chamber 201 is controlled to a pressure of, for example, between 10 to 1000 Pa, by appropriately adjusting the APC valve 244. A flow rate of the supplied Ar gas is controlled by each of the MFCs 241i and 241j to be in the range of, for example, about 100 sccm to about 10000 sccm (about 0.1 slm to about 10 slm). A flow rate of the supplied $N_2$ gas is controlled by each of the MFCs 241d, 241m, and 241n to be in the range of, for example, about 100 sccm to about 2000 sccm (about 0.1 slm to about 2 slm). A time taken to expose the wafer 200 to the active species obtained by plasma-exciting the Ar gas, namely, a gas supply time (irradiation time), is adjusted within the range of, for example, about 1 second to about 120 seconds. In consideration of throughput, a temperature of the heater 207 is set at the same temperature as when MCS gas is supplied in step 1b, that is, set such that the inside of the processing chamber 201 is held at the same temperature during steps 1b through 6b. In this case, during steps 1b through 6b, the temperature of the heater 207 is set such that a temperature of the wafer 200 (i.e., an inner temperature of the processing chamber 201) is maintained at a constant temperature ranging from about 250° C. to about 630° C., preferably, about 300° C. to about 500° C. RF power applied from the RF power source 273 between the first and second rod electrodes 269b and 270b and between the first and second rod electrodes 269c and 270c is set to be in the range of, for example, about 50 W to about 1000 W.

By supplying $N_2$ gas or Ar gas into the processing chamber 201 under the above-described conditions, $N_2$ gas ($N_2$*) or Ar gas (Ar*) supplied as an active species reacts with at least a portion of the SiN film formed on the wafer 200 in step 4b. Thus, impurities, such as hydrogen or chloride, may be efficiently desorbed from the SiN layer. That is, hydrogen or chlorine included in the SiN layer having a low H or chlorine content that is formed by desorbing impurities in steps 3b and 4b may be desorbed more efficiently. Thus, a SiN layer having an extremely low dopant concentration may be formed. In this process, a modification process is performed on the SiN layer. Also, the impurities, such as hydrogen or chlorine, which are desorbed from the SiN layer, are exhausted through the exhaust pipe 231 out of the processing chamber 201.

In step 6b, RF power applied to each of a plurality of plasma generation units (excitation units) is reduced using the plurality of plasma generation units so that each of the plasma generation units (excitation units) can output plasma at a low output power and the amount of the active species supplied to the wafer 200 can be increased. As a result, the amount of the active species supplied to the wafer 200 may be increased while suppressing plasma damage to the wafer 200 or the silicon-containing layer.

Thus, the amount of an active species supplied to the wafer 200 may be increased while suppressing plasma damage to the wafer 200 or the SiN layer, so that the efficiency of the above-described removal of the impurities may be increased, and the dopant concentration of the SiN layer may be reduced. As a result, a processing time may be shortened. Also, the uniformity of the dopant concentration in the surface of the wafer 200 may be improved. That is, it becomes possible to more uniformly supply the active species to the entire surface of the wafer 200 and, for example, the occurrence of a great difference in dopant concentration between an outer circumference of the wafer 200 and the center of the wafer 200 may be prevented.

In addition to the Ar gas, He gas, Ne gas, or Xe gas may be used as a rare gas used as the second modification gas.

The above-described steps 1b to 6b are defined as one cycle, and a SiN film may be formed to a predetermined thickness on the wafer 200 by performing the cycle a predetermined number of times, preferably, plural times.

When the SiN film having the predetermined thickness is formed, valves 243d, 243e, 243f, 243k, 243l, 243m, and 243n are opened so that $N_2$ gas serving as an inert gas can be supplied from each of the inert gas supply systems into the processing chamber 201 and exhausted through the exhaust pipe 231 to purge the inside of the processing chamber 201 (purge). Afterwards, an atmospheric pressure return step, a boat unloading step, and a wafer discharging step are performed in the same ways as the first embodiment.

In addition to the same effects as in the first embodiment, the present embodiment has one or a plurality of the effects described below.

(a) In step 3b according to the present embodiment, a first modification process of supplying plasma-excited $H_2$ gas to a silicon-containing layer may be performed so that impurities, such as hydrogen or chlorine, which are contained in the silicon-containing layer, may be efficiently desorbed. As a result, a SiN film having a much lower dopant concentration, namely, a SiN film having a much higher film density may be formed in a low-temperature region so that a resistance of the SiN film to hydrogen fluoride may be further enhanced. Also, an insulation characteristic of the SiN film may be further improved.

(b) In step 6b according to the present embodiment, a second modification process of supplying at least one of plasma-excited $N_2$ gas and plasma-excited Ar gas to the SiN layer is performed so that impurities, such as hydrogen or chlorine, which are contained in the SiN layer, may be efficiently desorbed. As a result, a SiN film having a much lower dopant concentration, namely, a SiN film having a much lower film density, may be formed in a low-temperature region so that a resistance of the SiN film to hydrogen fluoride may be further enhanced. Also, an insulation characteristic of the SiN film may be further improved.

(c) In steps 3b and 6b according to the present embodiment, chlorine may be efficiently desorbed from the silicon-containing layer or the SiN film, thereby improving the efficiency of the nitriding performed in step 4b. That is, chlorine that hinders the nitriding may be efficiently desorbed from the silicon-containing layer or the SiN film, thereby improving the efficiency of the nitriding performed in step 4b. Thus, a time taken to form the SiN film may be shortened, thereby improving productivity.

(d) In step 3b of the present embodiment, when $H_2$ gas is used as the first modification gas, particularly, the uniformity of a wet etch rate (WER) (uniformity of an etching resistance), namely, film-quality uniformity, may be improved more than when Ar gas or $N_2$ gas is used as the first modification gas. Since the active species generated by plasma-exciting $H_2$ gas has a longer lifetime than the active species generated by plasma-exciting Ar gas or $N_2$ gas, when $H_2$ gas is used as the first modification gas, the supply of the active species to the central portion of the wafer 200 may be performed more efficiently, thereby further promoting desorption of impurities from the silicon-containing layer or the SiN layer in the central portion of the wafer 200.

(e) In step 6b of the present embodiment, by using Ar gas or $N_2$ gas as the second modification gas, particularly, the film-thickness uniformity of the SiN film in the surface of the wafer 200 may be improved more than a case where $H_2$ gas is used as the second modification gas. Since the active species generated by plasma-exciting Ar gas or $N_2$ gas is heavier than the active species generated by plasma-exciting $H_2$ gas, when Ar gas or $N_2$ gas is used as the second modification gas, a decomposition reaction or desorption reaction of components of the SiN film (silicon nitride layer) may be caused in the peripheral edge of the wafer 200 where the thickness of the SiN film is easily increased.

(f) In the present embodiment, by performing both of step 3b (first modification process) using $H_2$ gas as the first modification gas and step 6b (second modification process) using Ar gas or $N_2$ gas as the second modification gas, effects (effects obtained by the first modification process) of improvement of the film-quality uniformity of the SiN film in the surface of the wafer 200 and effects (effects obtained by the second modification process) of improvement of the film thickness of the SiN film in the surface of the wafer 200 may be obtained at the same time.

Modified Examples of Second Embodiment

The above-described second embodiment may be modified, for example, as described below. Modified examples of the second embodiment may have the same effects as the above-described film-forming sequence shown in FIGS. 7 and 8. The following modified examples may be arbitrarily combined and used.

Modified Example 1

Figure 9:
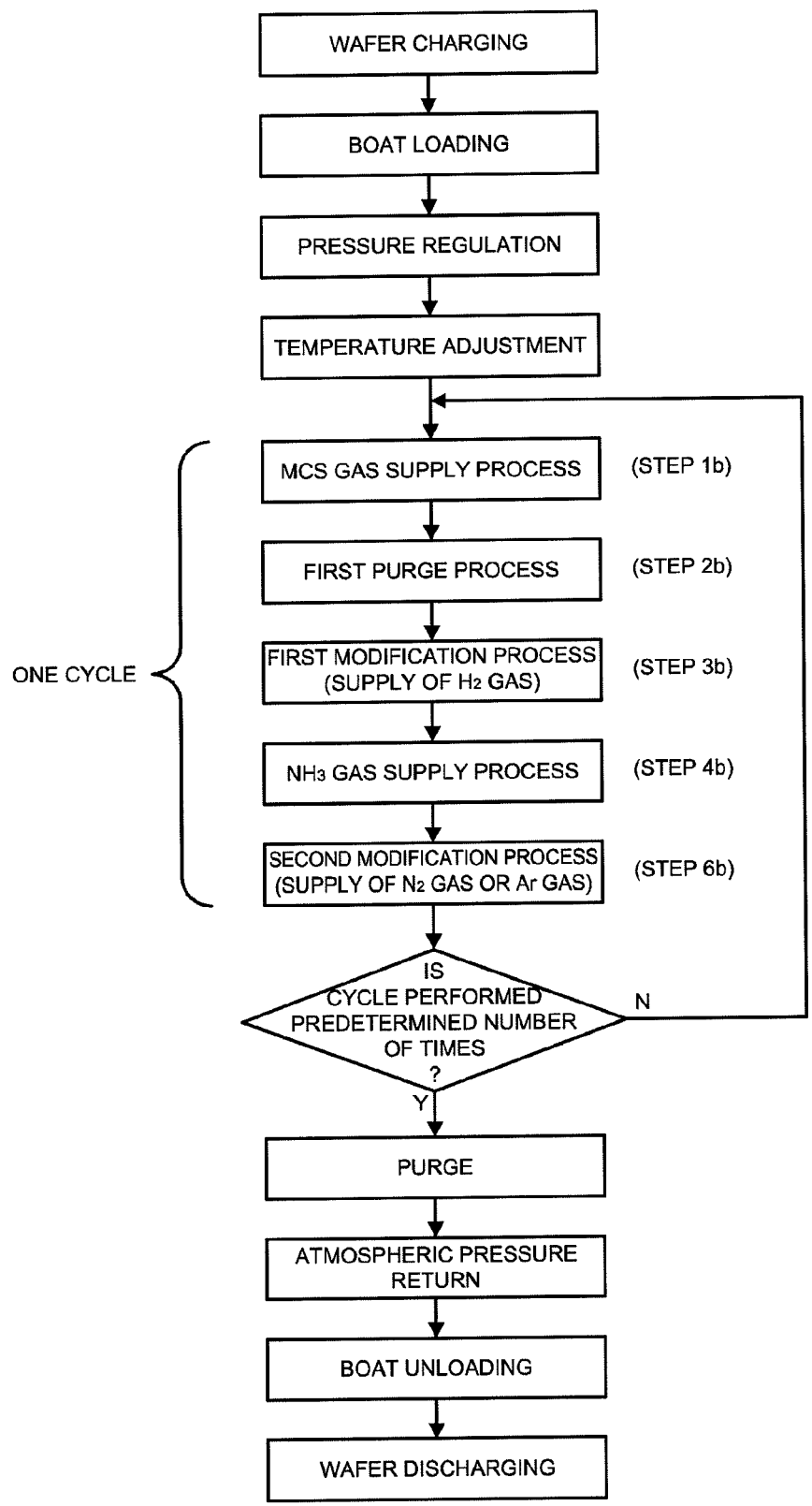
FIG. 9 is a flowchart illustrating a method of forming a film according to a modified example of the second embodiment of the present invention.
Figure 10:
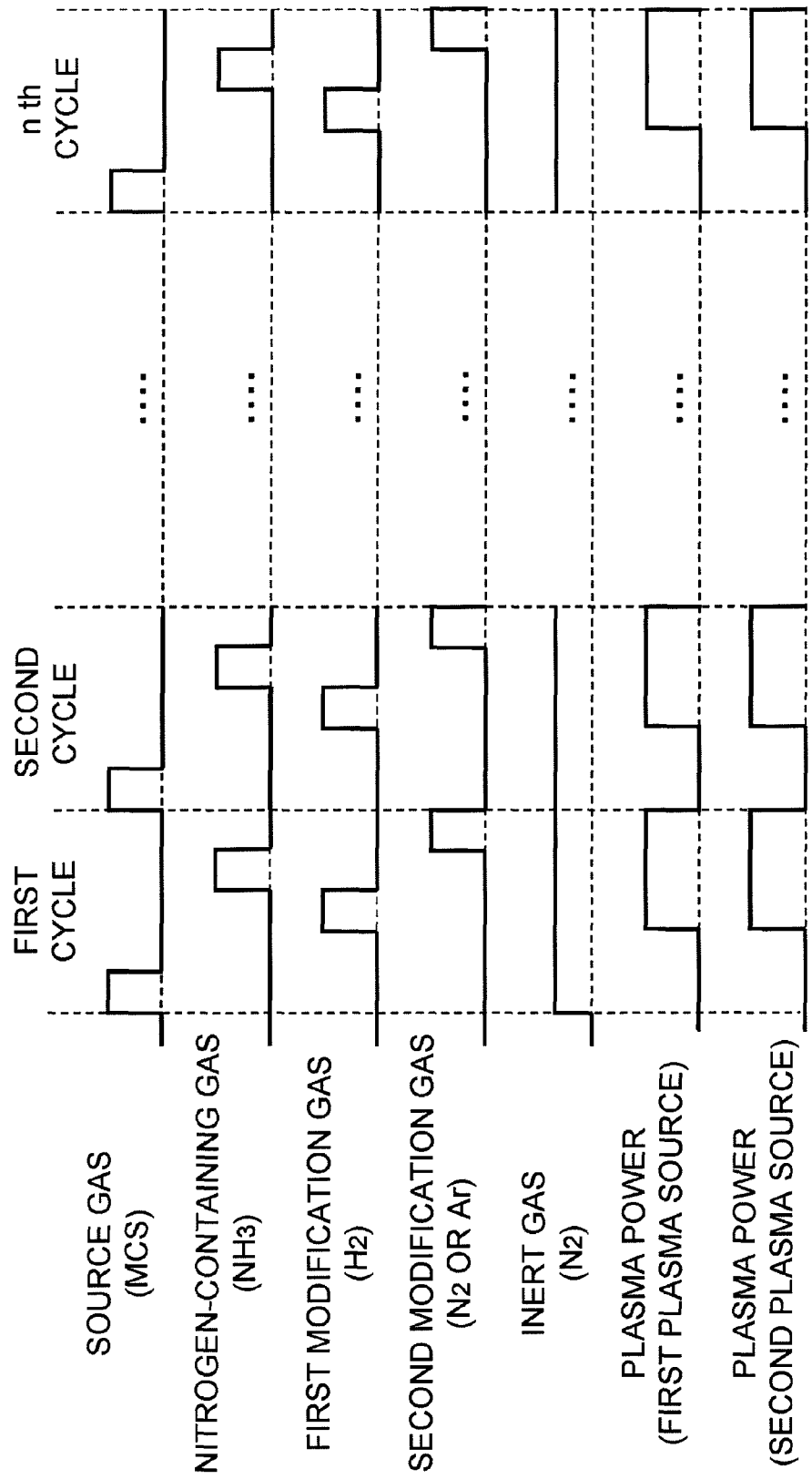
FIG. 10 is a timing diagram of the supply of gases and the supply of plasma power in a film-forming sequence according to the modified example of the second embodiment of the present invention.

For example, the above-described film-forming sequence shown in FIGS. 7 and 8 includes step 5b (second purge process) between step 4b ($NH_3$ gas supply process) and step 6b (second modification process), but the present embodiment is not limited thereto. For instance, as shown in FIGS. 9 and 10, which are respectively a flowchart of a film forming process and a timing diagram of the supply of gases and the supply of plasma power in a film-forming sequence, step 5b (second purge process) may be omitted, and step 4b ($NH_3$ gas supply process) and step 6b (second modification process) may be continuously performed. That is, a SiN film may be formed on the wafer 200 to a predetermined thickness by performing a cycle including sequentially performing steps 1b, 2b, 3b, 4b, and 6b at least once, preferably, plural times. Also, FIG. 10 illustrates an example of a method including three processes using plasma, that is, three processes (steps 3b, 4b, and 6b) of supplying plasma-excited gases, which are continuously performed.

Modified Example 2

For example, the above-described film-forming sequence shown in FIGS. 7 and 8 includes performing a cycle including sequentially performing steps 1b, 2b, 3b, 4b, 5b, and 6b at least once, preferably, plural times, but steps 3b and 6b may be exchanged. That is, a SiN film may be formed on the wafer 200 to a predetermined thickness by performing a cycle including sequentially performing steps 1b, 2b, 6b, 4b, 5b, and 3b at least once, preferably, plural times.

That is, the process (step 6b) of supplying at least one (second modification gas) of the plasma-excited nitrogen gas and the plasma-excited rare gas may be performed during a predetermined period after the process (step 1b) of supplying MCS gas (i.e., a supply stop period of the nitrogen-containing gas before the process of supplying the nitrogen-containing gas). Also, the process (step 3b) of supplying the plasma-excited hydrogen-containing gas (first modification gas) may be performed in a predetermined period after the process (step 4b) of supplying the plasma-excited or heat-excited nitrogen-containing gas (i.e., a supply stop period of MCS gas before the process of supplying the MCS gas).

In other words, the process (step 1b) of supplying the MCS gas may include forming the silicon-containing layer on the wafer 200, the process (step 6b) of supplying at least one of the plasma-excited $N_2$ gas and the plasma-excited Ar gas may include performing the first modification process on the silicon-containing layer, the process (step 4b) of supplying the plasma-excited or heat-excited $NH_3$ gas may include changing the silicon-containing layer on which the first modification process is performed into a SiN layer, and the process (step 3b) of supplying the plasma-excited $H_2$ gas may include performing a second modification process on the SiN layer. Also, the first modification process refers to an earlier modification process performed during one cycle, while the second modification process refers to a later modification process performed after the first modification process.

However, a cycle including sequentially performing steps 1b, 2b, 3b, 4b, 5b, and 6b may improve in-surface film-quality uniformity and film-thickness uniformity of the wafer 200 more than a cycle including sequentially performing steps 1b, 2b, 6b, 4b, 5b, and 3b.

Modified Example 3

For example, the above-described film-forming sequence shown in FIGS. 7 and 8 includes a cycle including sequentially performing steps 1b, 2b, 3b, 4b, 5b, and 6b at least once, preferably, plural times. However, steps 3b and 6b may be performed at a stretch at an end of each cycle, and any one of steps 3b and 6b may be performed before the other thereof. That is, a SiN film may be formed on the wafer 200 to a predetermined thickness by performing a cycle including sequentially performing steps 1b, 2b, 4b, 5b, 3b, and 6b at least once, preferably, plural times. Alternatively, a SiN film may be formed on the wafer 200 to a predetermined thickness by performing a cycle including sequentially performing steps 1b, 2b, 4b, 5b, 6b, and 3b at least once, preferably, plural times.

In other words, the process (step 1b) of supplying MCS gas may include forming the silicon-containing layer on the wafer 200, the process (step 4b) of supplying $NH_3$ gas may include changing the silicon-containing layer into a SiN layer, the process (step 3b) of supplying the plasma-excited $H_2$ gas may include performing a first modification process on the SiN layer, and the process (step 6b) of supplying at least one of the plasma-excited $N_2$ gas and the plasma-excited Ar gas may include performing a second modification process on the SiN layer.

However, a cycle including sequentially performing steps 1b, 2b, 3b, 4b, 5b, and 6b may improve in-surface film-quality uniformity and film-thickness uniformity of the wafer 200 more than when steps 3b and 6b are performed at a stretch at the end of each cycle.

Modified Example 4

The second embodiment describes an example of a method including step 4b ($NH_3$ gas supply process) including supplying $NH_3$ gas plasma-excited by a plurality of plasma generation units (excitation units), step 3b (first modification process) including supplying $H_2$ gas plasma-excited by the plurality of plasma generation units, and step 6b (second modification process) including supplying at least one of $N_2$ gas plasma-excited by the plurality of plasma generation units and Ar gas plasma-excited by the plurality of plasma generation units, but the present embodiment is not limited thereto. That is, in the second embodiment, all or at least one of the gases $NH_3$ gas, $H_2$ gas, $N_2$ gas, and Ar gas may be plasma-excited by one plasma generation unit and supplied. Thus, in the second embodiment, even if the above-described gases are plasma-excited by one plasma generation unit and supplied, effects of each of the above-described first and second modification processes may be obtained. However, when the above-described gases are plasma-excited by the plurality of plasma generation units and supplied, the effects of the first and second modification processes may be increased.

Another Embodiment of the Present Invention

While the present invention has been particularly shown and described with reference to embodiments thereof, it will be understood by those skilled in the art that the present invention is not limited to the above-described embodiments and various changes in form and details may be made therein whiteout departing from the spirit and scope of the present invention.

Figure 16A:
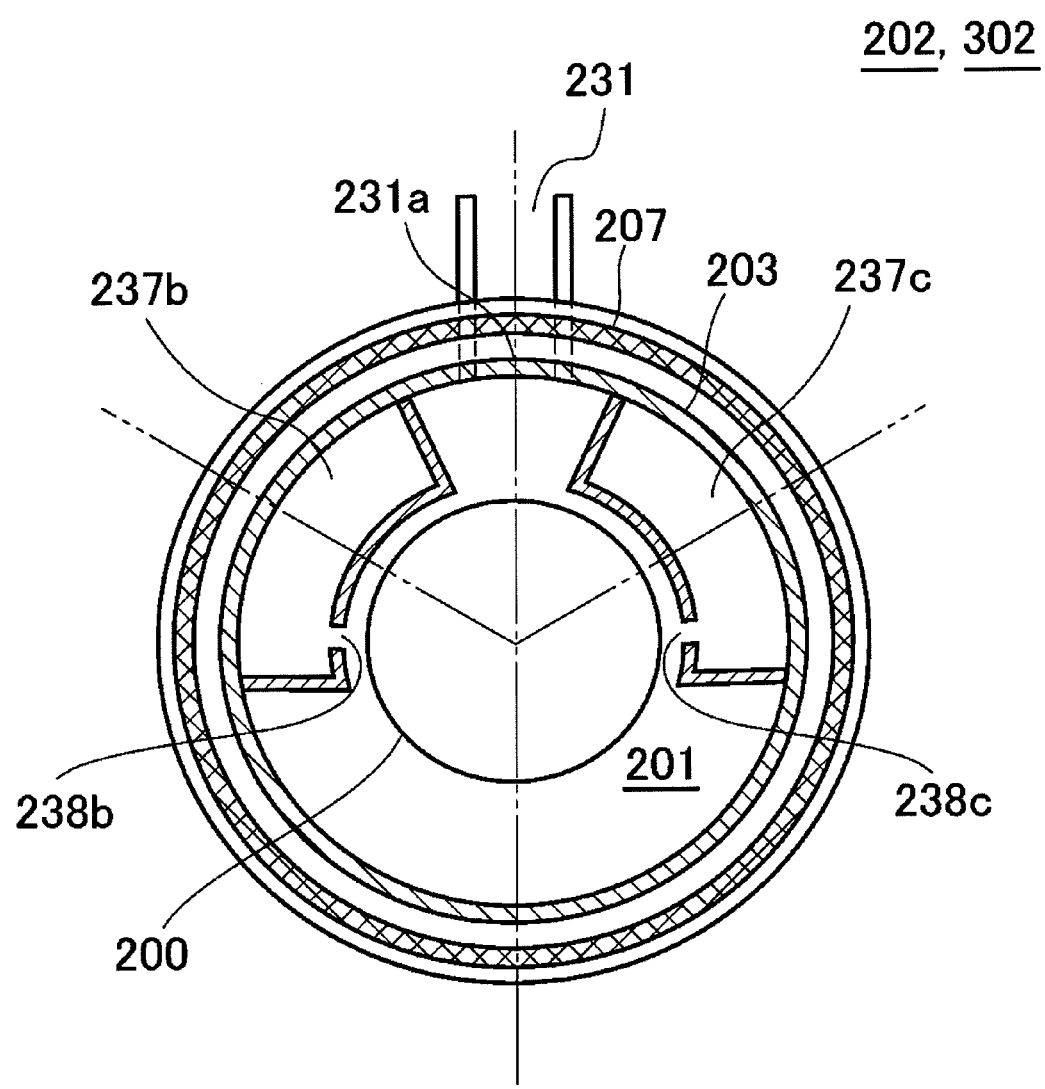
FIGS. 16A and 16B are top sectional views of a vertical processing furnace of a substrate processing apparatus preferably used in another embodiment of the present invention.
Figure 16B:
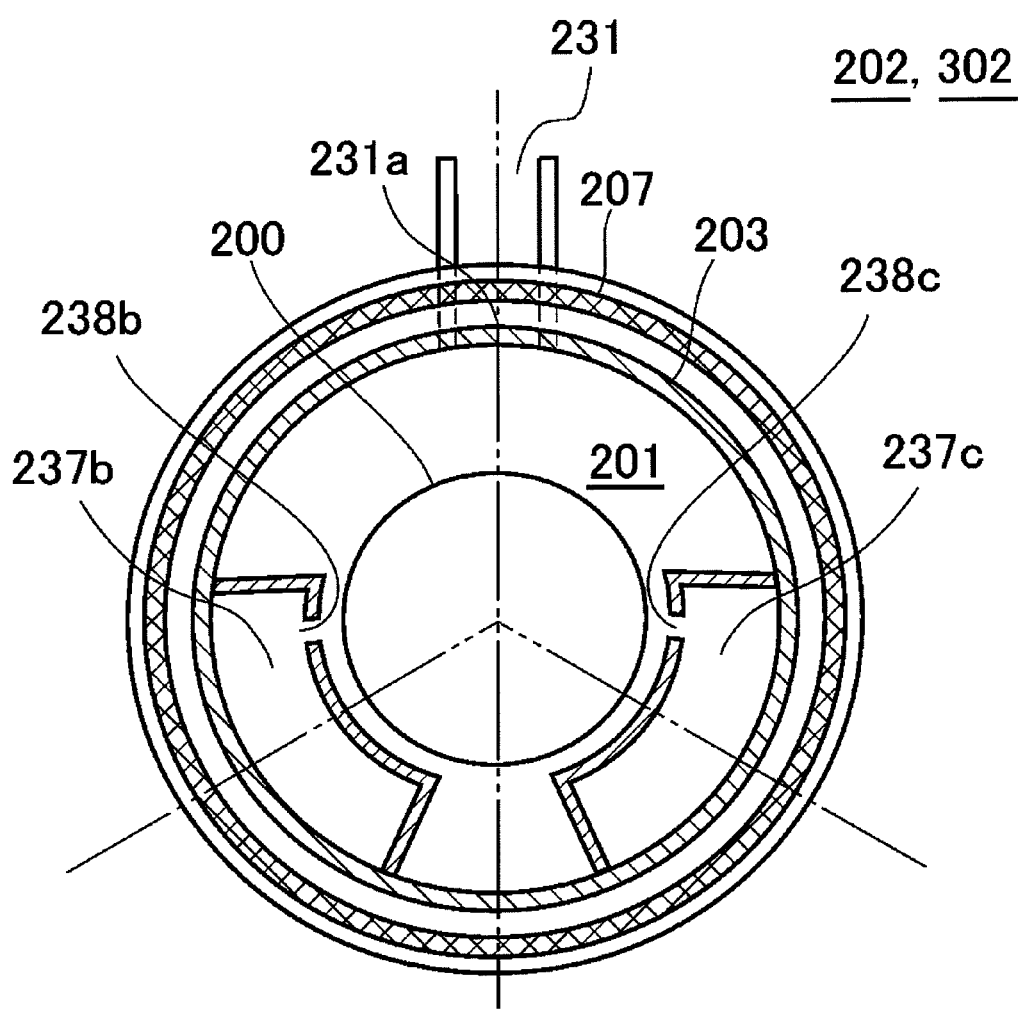

The above-described first and second embodiments describe an example case where the corresponding lateral surfaces of the two buffer chambers 237b and 237c are disposed opposite each other across the center of the wafer 200, but the present invention is not limited thereto. That is, from a plan view, the two buffer chambers 237b and 237c may be installed line-symmetrically with respect to an object axis corresponding to a straight line connecting the center of the wafer 200 (the center of the reaction tube 203) with the center of the exhaust port 231a. Alternatively, each the buffer chambers 237b and 237c may be attached to a side of the exhaust port 231a as shown in FIG. 16A or attached to a side spaced apart from the exhaust port 231a as shown in FIG. 16B. In other words, a central angle formed by a straight line connecting the center of the buffer chamber 237b and the center of the wafer 200 with a straight line connecting the center of the buffer chamber 237c and the center of the wafer 200 (a central angle with respect to an arc having the centers of the buffer chambers 237b and 237c as both ends) is not limited to 180°, but may be less than or more than 180°. Also, in any one of FIGS. 2, 16A, and 16B, the gas supply ports 238b and 238c of the buffer chambers 237b and 237c are installed line-symmetrically with respect to an object axis corresponding to a line connecting the center of the wafer 200 (the center of the reaction pipe 203) with the center of the exhaust port 231a. Also, in FIGS. 16A and 16B, the illustration of components other than the reaction tube 203, the heater 207, the wafer 200, the exhaust pipe 231, the exhaust port 231a, and the buffer chambers 237b and 237c is omitted for brevity.

Figure 17A:
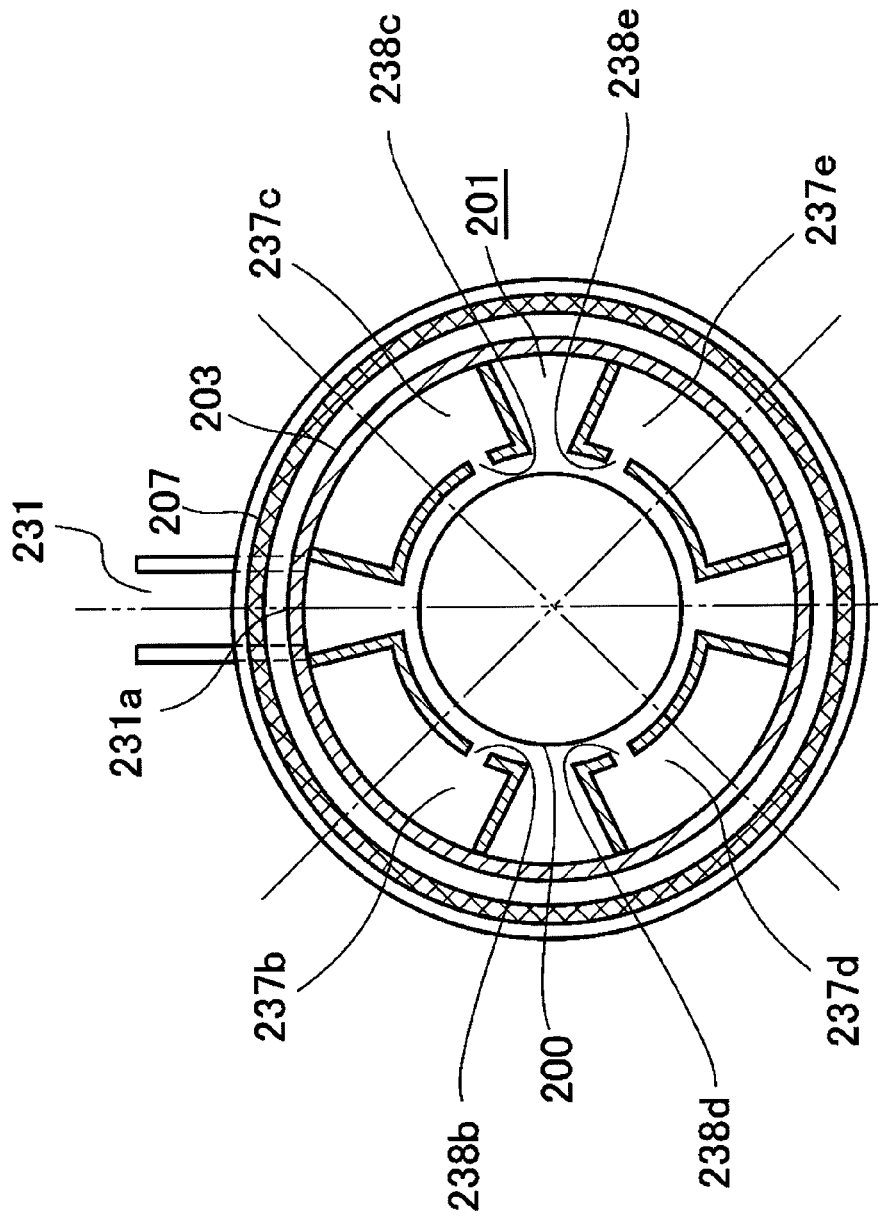
FIGS. 17A and 17B are top sectional views of a vertical processing furnace of a substrate processing apparatus preferably used in another embodiment of the present invention.
Figure 17B:
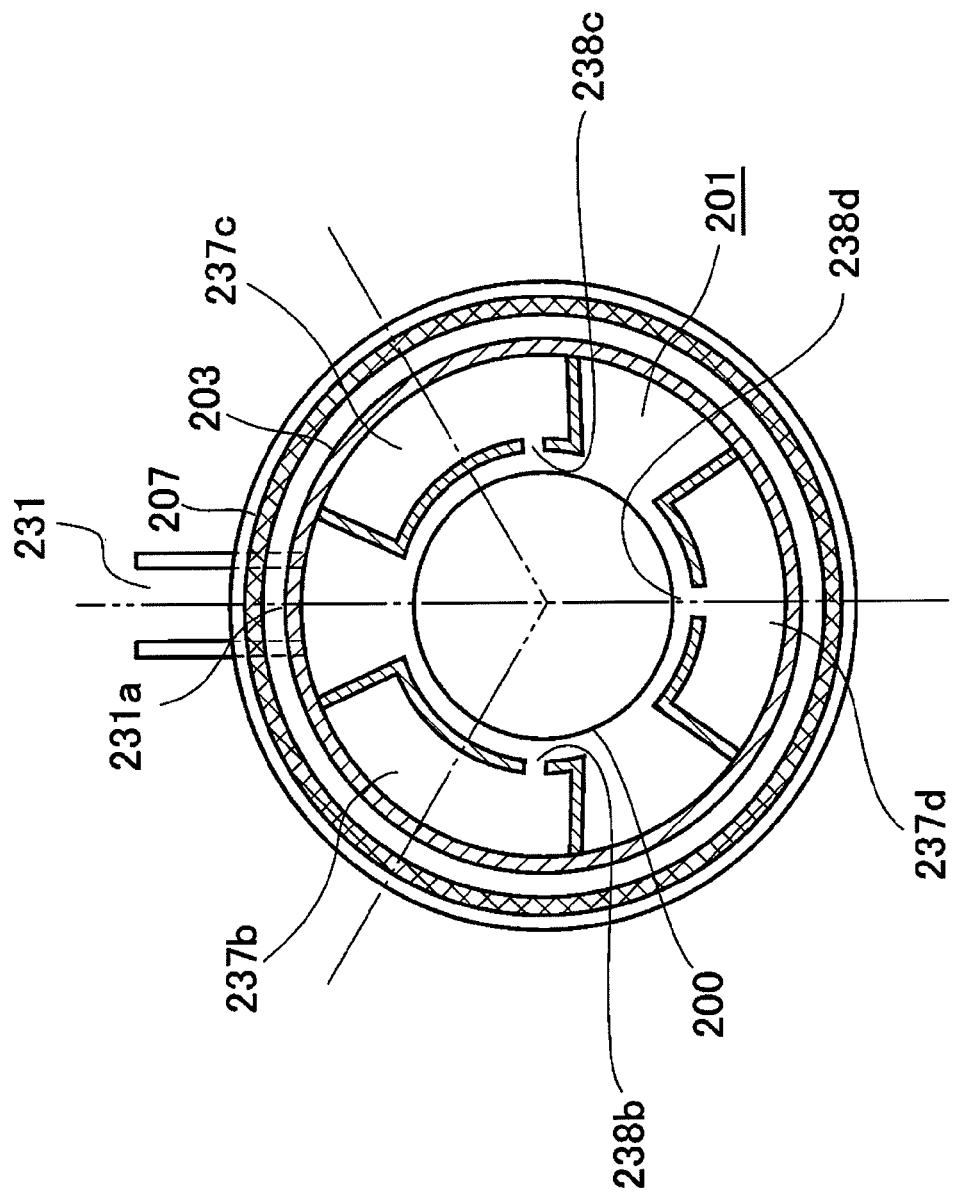

In addition, the above-described first and second embodiments describe an example case where two plasma generation units (excitation units) are installed, but three or more plasma generation units may be installed. In this case, from a plan view, a plurality of plasma generation units (excitation units) are preferably installed line-symmetrically with respect to an object axis corresponding to a straight line connecting the center of the wafer 200 (the center of the reaction tube 203) with the center of the exhaust pipe 231a. For example, when four plasma generation units (excitation units) are installed, as shown in FIG. 17A, from a plan view, the buffer chambers 237b and 237c and the buffer chambers 237d and 237e are preferably installed line-symmetrically with respect to an object axis corresponding to a straight line connecting the center of the wafer 200 with the center of the exhaust port 231a. Also, when three plasma generation units (excitation units) are installed, as shown in FIG. 17B, from the plan view, the two buffer chambers 237b and 237c are preferably installed line-symmetrically with respect to the object axis corresponding to the straight line connecting the center of the wafer 200 with the center of the exhaust port 231a. The buffer chamber 237d is preferably installed such that the center of the buffer chamber 237d is disposed on a straight line connecting the center of the wafer 200 with the center of the exhaust port 231a. Furthermore, in FIGS. 17A and 17B, the illustration of components other than the reaction tube 203, the heater 207, the wafer 200, the exhaust pipe 231, the exhaust port 231a, and the buffer chambers 237b, 237c, 237d, and 237e is omitted for brevity.

Furthermore, when three plasma generation units (excitation units) are installed, it is more preferable to dispose buffer chambers at regular intervals. For example, when four plasma generation units are installed, as shown in FIG. 17A, the buffer chambers 237b, 237c, 237d, and 237e are preferably disposed such that each of central angles with respect to the corresponding one of four arcs, which has the centers of two adjacent buffer chambers as both ends, is about 90°. Also, when three plasma generation units are installed, as shown in FIG. 17B, the buffer chambers 237b, 237c, and 237d are preferably disposed such that each of central angles with respect to the corresponding one of three arcs, which has the centers of two adjacent buffer chambers as both ends, is about 120°. Furthermore, in any one of FIGS. 17A and 17B, the gas supply ports 238b and 238c of the buffer chambers 237b and 237c are installed line-symmetrically with respect to the object axis corresponding to the straight line connecting the center of the wafer 200 with the center of the exhaust port 231a. Also, in FIG. 17A, the gas supply ports 238d and 238e of the buffer chambers 237d and 237e are installed line-symmetrically with respect to the object axis corresponding to the straight line connecting the center of the wafer 200 with the center of the exhaust port 231a. In FIG. 17B, the gas supply port 238d of the buffer chamber 237d is installed on the straight line connecting the center of the wafer 200 with the center of the exhaust port 231a. By disposing buffer chambers at regular intervals, it becomes possible to uniformly supply active species to the entire surface of the wafer 200. Thus, by improving the uniformity of a nitriding performed in the surface of the wafer 200, it becomes possible to improve each of the film-quality uniformity and film-thickness uniformity of a SiN film formed in the surface of the wafer 200.

In the above-described first and second embodiments, the balance of the distribution of the active species supplied from the plurality of plasma generation units (excitation units) may be controlled. For example, as shown in FIG. 18, the active species supplied from the buffer chamber 237b may be distributed over a wide range to reach the center of the wafer 200, and the active species supplied from the buffer chamber 237c may be unevenly distributed to reach only a peripheral edge of the wafer 200. In FIG. 18, reference numeral 300b denotes a distribution region of the active species supplied from the buffer chamber 237b, and 300c denotes a distribution region of the active species supplied from the buffer chamber 237c.

In step 3a of the first embodiment or step 4b of the second embodiment, when the distribution of the active species (plasma-excited $NH_3$ gas) supplied from the buffer chambers 237b and 237c is set as shown in FIG. 17, a nitriding or modification process (removal of impurities, such as chlorine) is performed mainly on a central portion of the wafer 200 using the active species supplied from the buffer chamber 237b, while a nitriding or modification process is performed mainly on the peripheral edge of the wafer 200 using the active species supplied from the buffer chamber 237c. When the distribution of the active species is set as described above, the uniformity of in-surface distribution of the nitriding or modification process performed on the silicon-containing layer may be improved by adjusting a ratio between nitriding powers or modifying powers (powers of removal of impurities) obtained using the active species supplied from the buffer chambers 237b and 237c. That is, when it is intended to relatively facilitate the nitridation or modification of the silicon-containing layer in the central portion of the wafer 200, the nitriding power or modifying power obtained using the active species supplied from the buffer chamber 237b may be relatively increased or the nitriding power or modifying power obtained using the active species supplied from the buffer chamber 237c may be relatively reduced. Conversely, when it is intended to relatively facilitate the nitridation or modification of the silicon-containing layer in the peripheral edge of the wafer 200, the nitriding power or modifying power obtained using the active species supplied from the buffer chamber 237c may be relatively increased or the nitriding power or modifying power obtained using the active species supplied from the buffer chamber 237b may be relatively reduced. As a result, it becomes possible to improve each of the film-quality uniformity and film-thickness uniformity of the SiN film in the surface of the wafer 200.

In addition, the distribution of the active species supplied from the buffer chambers 237b and 237c may be appropriately adjusted by, for example, RF power applied between respective electrodes disposed in the buffer chambers 237b and 237c, a flow rate of $NH_3$ gas or $N_2$ gas supplied into the buffer chambers 237b and 237c, a supply method (intermittent supply or continuous supply), and sizes and directions of the gas supply ports 238b and 238c installed in the buffer chambers 237b and 237c.

Furthermore, a ratio in nitriding power or modifying power between the active species supplied from the buffer chambers 237b and 237c may be adjusted by varying, for example, a ratio of RF power (supply power) applied between the first and second rod electrodes 269b and 270b to RF power applied between the first and second rod electrodes 269c and 270c (for example, by supplying a power of about 1 W to about 500 W between one first and second rod electrodes and supplying a power of about 500 W to about 1000 W between the other first and second rod electrodes). Also, the ratio in nitriding power or modifying power between the active species supplied from the buffer chambers 237b and 237c may be adjusted by varying a ratio of a flow rate of $NH_3$ gas or $N_2$ gas supplied into the buffer chamber 237b to a flow rate of $NH_3$ gas or $N_2$ gas supplied into the buffer chamber 237c (for example, by supplying the $NH_3$ gas at a flow rate of about 1 slm to about 5 slm in one buffer chamber and supplying the $NH_3$ gas at a rate of about 5 slm to about 10 slm in the other buffer chamber). Furthermore, the ratio in nitriding power or modifying power between the active species supplied from the buffer chambers 237b and 237c may be adjusted by varying a ratio of a time taken to supply $NH_3$ gas or $N_2$ gas into the buffer chamber 237b to a time taken to supply NH3 gas or N2 gas into the buffer chamber 237c (for example, by supplying NH3 gas for about 1 second to about 10 seconds in one buffer chamber and supplying NH3 gas for about 10 seconds to about 120 seconds in the other buffer chamber). In this case, for example, the supply of $NH_3$ gas in at least one of the buffer chambers 237b and 237c may be intermittently performed, and the supply of the active species from the buffer chamber 237b and the supply of the active species from the buffer chamber 237c may be performed asynchronously, synchronously, or partially synchronously. Also, the above-described methods may be arbitrarily combined with one another and performed.

In addition, although the control of the distribution of the above-described active species is performed only in step 3a of the first embodiment or step 4b of the second embodiment, the present invention is not limited thereto, and the control of the distribution of the above-described active species may be performed in the same manner in step 3b (first modification process) or step 6b (second modification process) of the second embodiment. When the control of the distribution of the active species is performed using each of the modification processes, in-surface uniformity of the wafer 200 may be improved due to each of the modification processes. As a result, each of the film-quality uniformity and film-thickness uniformity of the SiN film in the surface of the wafer 200 may be improved.

For example, when the control of the distribution of the active species is performed in the second embodiment, the control of the distribution of the above-described active species may be performed in all of steps 3b, 4b, and 6b or in only one or two of steps 3b, 4b, and 6b. That is, the control of the distribution of the active species may be performed in at least one of steps 3b, 4b, and 6b.

In the above-described first and second embodiments, a temperature adjusting mechanism for maintaining a retaining temperature of MCS gas at a temperature of, for example, about 30° C. may be installed in MCS gas supply source configured to supply MCS gas into the first gas supply pipe 232a or an upstream side (i.e., a gas storage or cylinder cabinet) of the first gas supply pipe 232a. MCS gas has high decomposability and may decompose at a retaining temperature of a typical special compressed gas. When monosilane ($SiH_4$) is generated due to the decomposition of the MCS gas, the uniformity of a film thickness of the SiN film may be degraded or productivity may be exacerbated. In addition, when the MCS gas is retained at an excessively low temperature, vaporizing MCS becomes difficult so that it is likely to reduce a flow rate of MCS gas supplied into the processing chamber 201. The above-described problems may be solved by installing the temperature adjusting mechanism.

Figure 19:
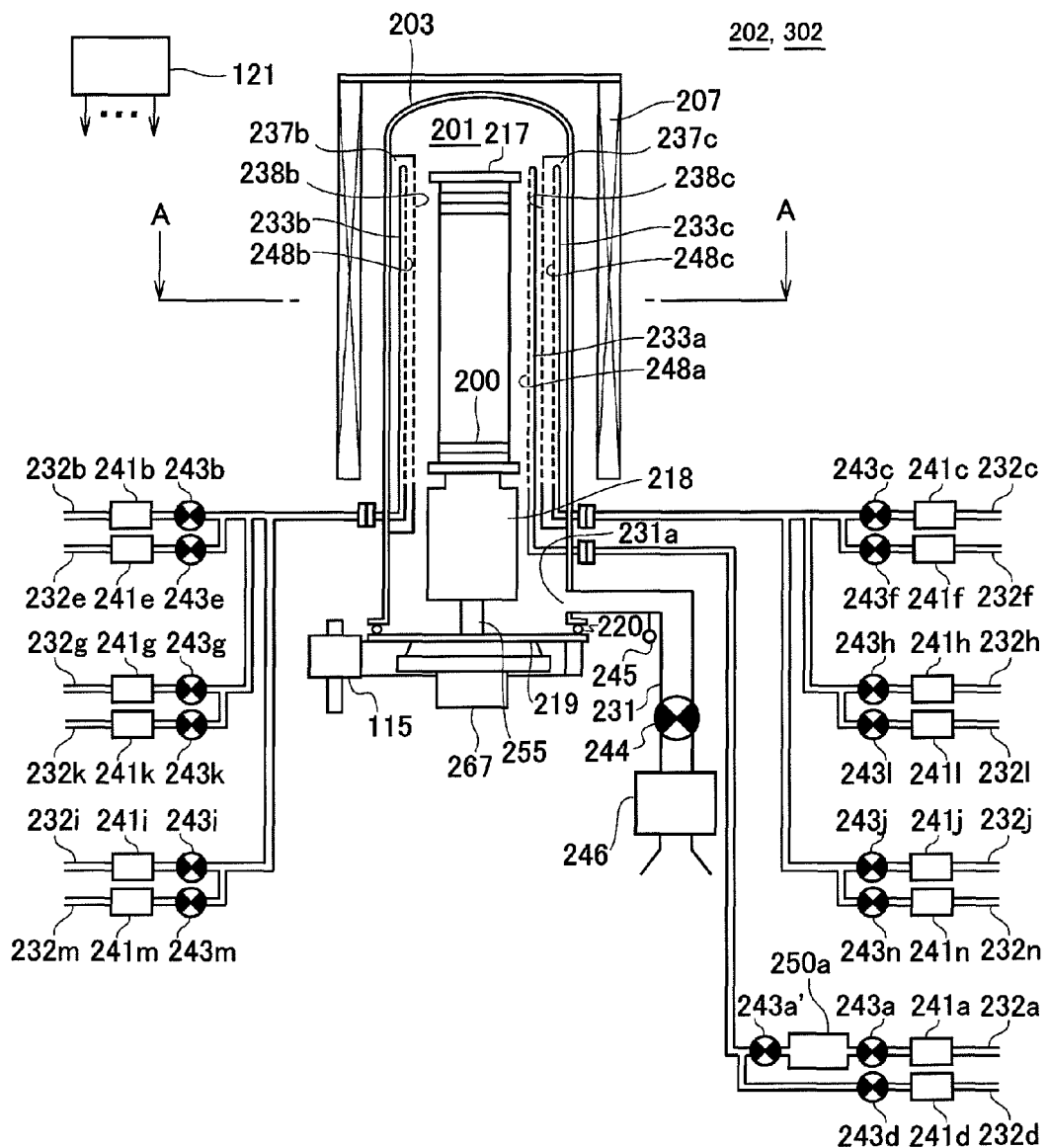
FIG. 19 is a schematic construction diagram of a vertical processing furnace of a substrate processing apparatus preferably used in another embodiment of the present invention, which is a longitudinal sectional view of a portion of a processing furnace capable of flash-supplying a monochlorosilane (MCS) gas.

For example, in the above-described first and second embodiments, when MCS gas is supplied into the processing chamber 201 (steps 1a and 1b), MCS is supplied while continuously exhausting the processing chamber 201 with the APC valve 244 open. However the present invention is not limited thereto. For instance, as shown in FIG. 19, a gas storage unit (tank) 250a is installed at a downstream side lower than the valve 243a of the first gas supply pipe 232a, and a high-pressure MCS gas stored in the gas supply storage unit 250a is supplied at a time (as a pulse type) into the decompressed processing chamber 201 with the APC valve 244 closed. Afterwards, the processing chamber 201 whose inner pressure is increased by supplying the MCS gas is maintained for a predetermined time.

To supply the MCS gas using the gas storage unit 250a at a time, initially, a valve 243a' installed at a downstream side lower than the gas storage unit 250a of the first gas supply pipe 232a is closed off, and the valve 243a installed at an upstream side of the gas storage unit 250a is opened, thereby supplying the MCS gas into the gas storage unit 250a. Also, when a predetermined amount of MCS gas is collected in the gas storage unit 250a under a predetermined pressure, the valve 243a installed at the upstream side is closed off. The MCS gas is stored in the gas storage unit 250a until an inner pressure of the gas storage unit 250a reaches, for example, about 20000 Pa or more. The amount of the MCS gas stored in the gas storage unit 250a ranges from, for example, about 100 cc to about 1000 cc. Also, an apparatus is configured such that a conductance between the gas storage unit 250a and the processing chamber 201 becomes about $1.5 \times 10^{-3}$ m$^3$/s or more. Also, in consideration of a comparison of the capacity of the processing chamber 201 and the capacity of the gas storage unit 250a required for the processing chamber 201, when the processing chamber 201 has a capacity of, for example, 100 l (liters), the gas storage unit 250a may have a capacity of about 100 cc to about 300 cc, which is preferably about $1/1000$ to $3/1000$ times the capacity of the processing chamber 201.

During the charging of the gas storage unit 250a with the MCS gas, the inside of the processing chamber 201 is exhausted by the vacuum pump 246 such that an inner pressure of the processing chamber 201 is regulated to a pressure of about 20 Pa or less. When the charging of the gas storage unit 250a with the MCS gas and the exhaust of the processing chamber 201 are finished, the exhaust of the processing chamber 201 is stopped by closing off the APC valve 244, and then the valve 243a' of the first gas supply pipe 232a is opened. Thus, the high-pressure MCS gas collected in the gas storage unit 250a is supplied at a time (as a pulse type) into the processing chamber 201. In this case, since the APC valve 244 of the exhaust pipe 231 is closed off, the inner pressure of the processing chamber 201 is rapidly increased to a pressure of, for example, about 931 Pa (7 Torr). Afterwards, an increased pressure state of the processing chamber 201 is maintained for a predetermined time (for example, about 1 second to about 10 seconds), and the wafer 200 is exposed in a high-pressure atmosphere of MCS gas to form a silicon-containing layer on the wafer 200.

Thus, when the MCS gas is supplied at a time using the gas storage unit 250a, due to a pressure difference between the inside of the gas storage unit 250a and the processing chamber 201, the MCS gas jetted into the processing chamber 201 through the first nozzle 233a is accelerated to a sound speed of, for example, 340 m/sec, and the MCS gas supplied onto the wafer 200 is accelerated to a speed of several tens of m/sec. As a result, the MCS gas is efficiently supplied to a central portion of the wafer 200. As a result, the film-thickness uniformity or film-quality uniformity of a SiN film disposed in the surface of the wafer 200 may be improved. Hereinafter, the above-described supply method will be referred to as a flash flow process.

Figure 20:
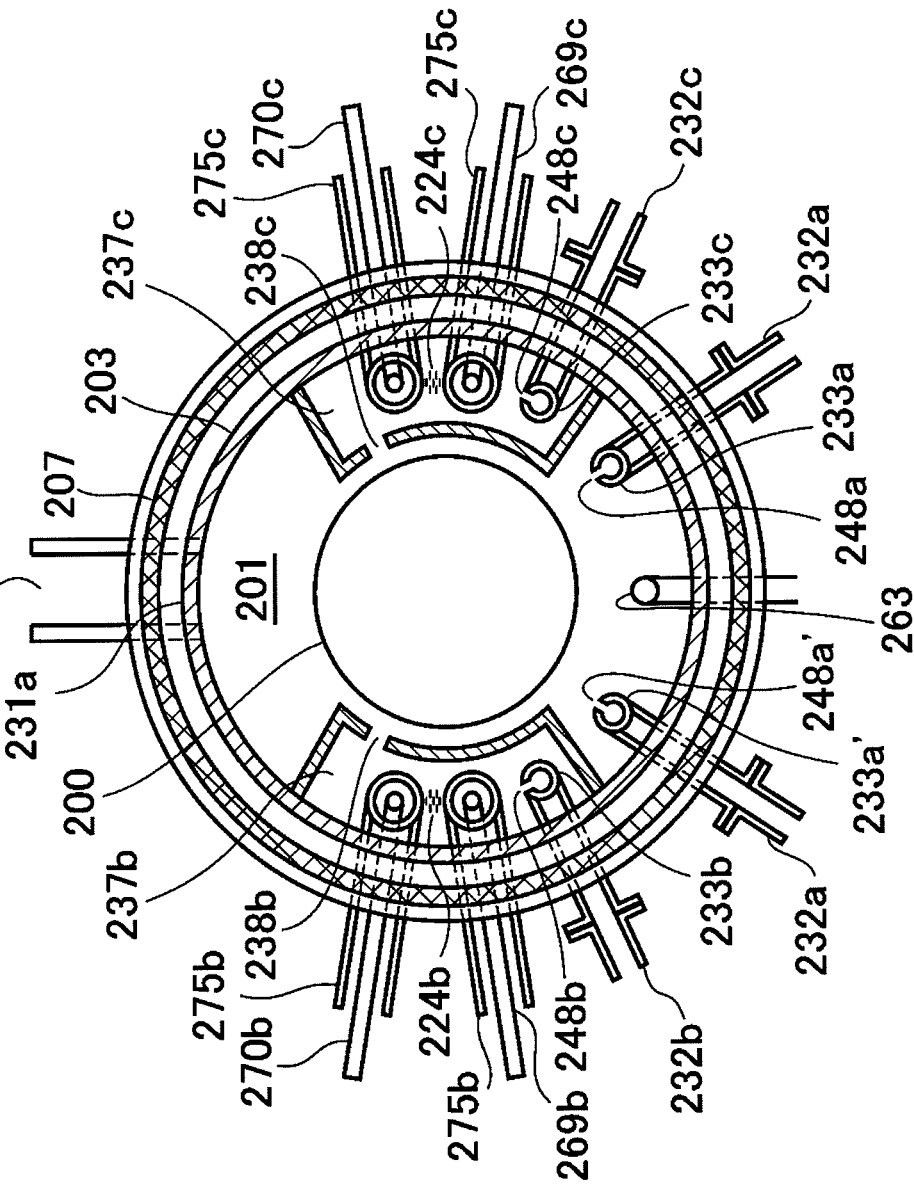
FIG. 20 is a schematic construction diagram of a vertical processing furnace of a substrate processing apparatus preferably used in another embodiment of the present invention, which is a longitudinal sectional view of a portion of a processing furnace including a plurality of nozzles configured to supply MCS gas.

Although the first and second embodiments describe an example of a method of supplying MCS gas via one nozzle 233a, the present invention is not limited thereto and the MCS gas may be supplied via a plurality of nozzles. For example, as shown in FIG. 20, a nozzle 233a' having the same shape as the nozzle 233a may be further installed as a nozzle configured to supply the MCS gas. In this case, similarly to the buffer chambers 237a and 237b, from the plan view, the nozzles 233a and 233a' are preferably installed line-symmetrically with respect to an object axis corresponding to a straight line connecting the center of the wafer 200 (the center of the reaction tube 203) with the center of the exhaust port 231a. That is, the gas supply ports 248a and 248a' of the nozzles 233a and 233a' are preferably installed line-symmetrically with respect to the object axis corresponding to the straight line connecting the center of the wafer 200 (the center of the reaction tube 203) with the center of the exhaust port 231a. Thus, the MCS gases flowing through the two nozzles 233a and 233a' to the wafer 200 become uniform. That is, the MCS gases flowing from the two nozzles 233a and 233a' to the wafer 200 are line-symmetric with respect to the object axis corresponding to the straight line connecting the center of the wafer 200 and the center of the exhaust port 231a. As a result, the MCS gas may be uniformly supplied to the surface of the wafer 200 so that it becomes possible to improve each of the film-quality uniformity and film-thickness uniformity of the SiN film in the surface of the wafer 200.

The SiN film formed in the above-described embodiment has a low in-film chlorine content, a high film density, and a high resistance to hydrogen fluoride. For this reason, the SiN film may be preferably used not only as a gate insulating film or capacitor insulating film but also as a sidewall spacer or etching stopper layer. Also, the SiN film may be preferably used as a hard mask during, for example, a shallow trench isolation (STI) process.

In addition, the foregoing embodiment describes an example of formation of a film using a batch-type substrate processing apparatus capable of processing a plurality of substrates at one time, but the present invention is not limited thereto and may be preferably applied to a case where a film is formed using a single-wafer-type substrate processing apparatus capable of processing one wafer or several wafers at one time.

Furthermore, the above-described respective embodiments or modified examples may be appropriately combined and used.

Furthermore, the present invention is realized by changing, for example, a process recipe of a conventional substrate processing apparatus. When the process recipe is changed, the process recipe according to the present invention may be installed in a conventional substrate processing apparatus via an electrical communication circuit or a recording medium in which the process recipe is recorded. Alternatively, a conventional process recipe may be changed into the process recipe according to the present invention by manipulating an input/output (I/O) device of the conventional substrate processing apparatus.

EXAMPLE

Example 1

Next, Example 1 will be described. In Example 1, a SiN film was formed on a wafer using the film-forming sequence of the above-described first embodiment, and a film-forming rate was measured. The film-forming temperature (wafer temperature) was adjusted within the range of about 100° C. to about 630° C. The remaining film-forming conditions (processing conditions of each step) were determined within the range of the processing conditions described in the above-described first embodiment. Obtained results are shown in FIG. 11.

Figure 11:
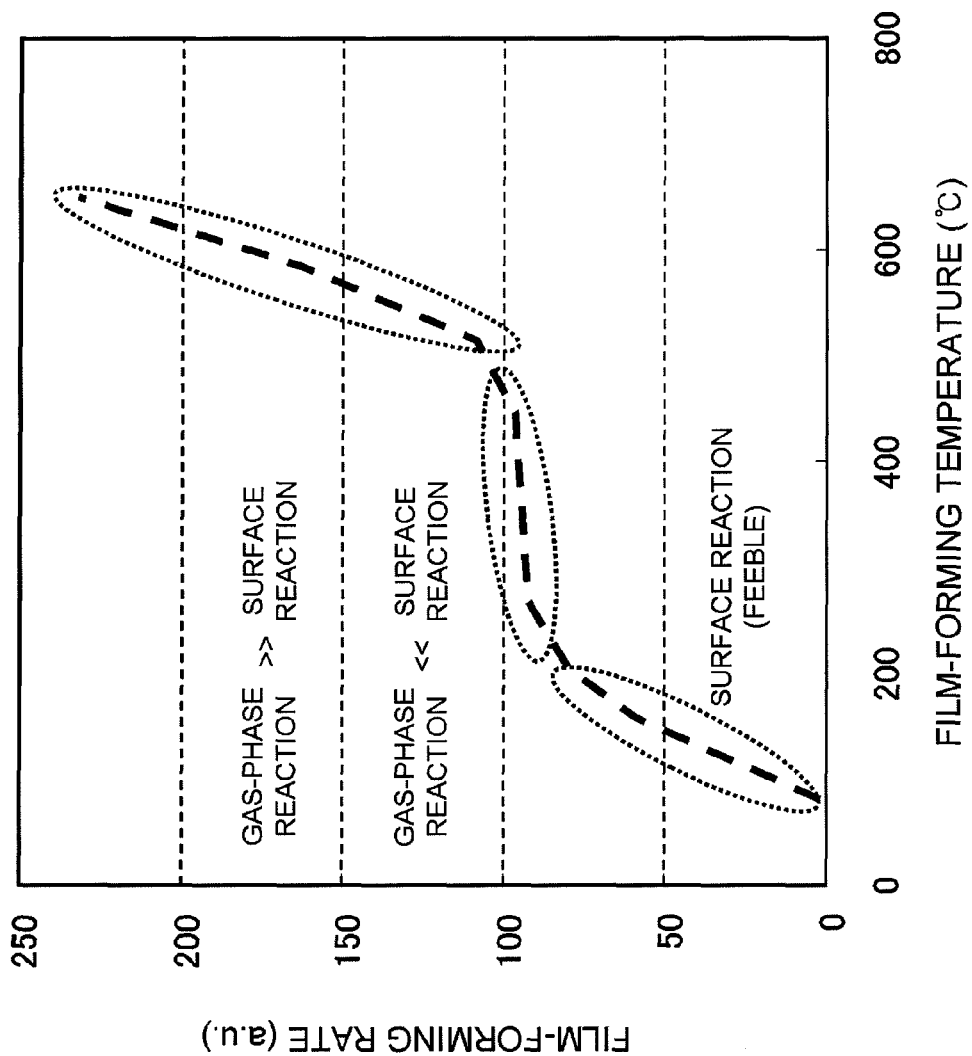
FIG. 11 shows a relationship between a film-forming temperature and film-forming rate of a silicon nitride ($Si_3N_4$) film in Example 1.

FIG. 11 shows a relationship between a film-forming temperature and film-forming rate of a SiN film. In FIG. 11, an abscissa denotes a film-forming temperature (° C.), and an ordinate denotes a film-forming rate (arbitrary unit (a.u.)). In FIG. 11, a dotted line shows a tendency read from measured values.

From FIG. 11, it can be seen that a surface reaction was dominant in a region having a film-forming temperature of about 500° C. or less and the film-forming rate was stabilized to nearly 300° C. However, it can be seen that when the film-forming temperature became less than about 300° C., it became difficult to decompose and adsorb MCS gas on a wafer so that the film-forming rate started dropping. In particular, it can be seen that when the film-forming temperature became less than about 250° C., the probability of the surface reaction was reduced so as to worsen the drop in the film-forming rate. Also, it can be seen that when the film-forming temperature exceeded about 550° C., a gas-phase reaction was dominant and the film-forming rate rapidly increased. In addition, it was confirmed that when the film-forming temperature exceeded about 630° C., the uniformity of film thickness was easily degraded and controlling the uniformity of the film thickness became difficult. From the above description, it was demonstrated that when a SiN film was formed using MCS gas according to the method of the present embodiment, it was preferable to adjust the film-forming temperature within the range of about 250° C. to about 630° C., preferably, about 300° C. to about 500° C.

Example 2

Next, Example 2 will be described. In Example 2, a SiN film was formed on a wafer using the film-forming sequence of the above-described first embodiment, and an in-film chlorine strength of the SiN film was measured. MCS gas and DCS gas were used as silicon-containing gases. The film-forming temperature (wafer temperature) was adjusted within the range of about 300° C. to about 630° C. The remaining film-forming conditions (processing conditions of each step) were determined within the range of the processing conditions described in the above-described first embodiment. Obtained results are shown in FIG. 12.

Figure 12:
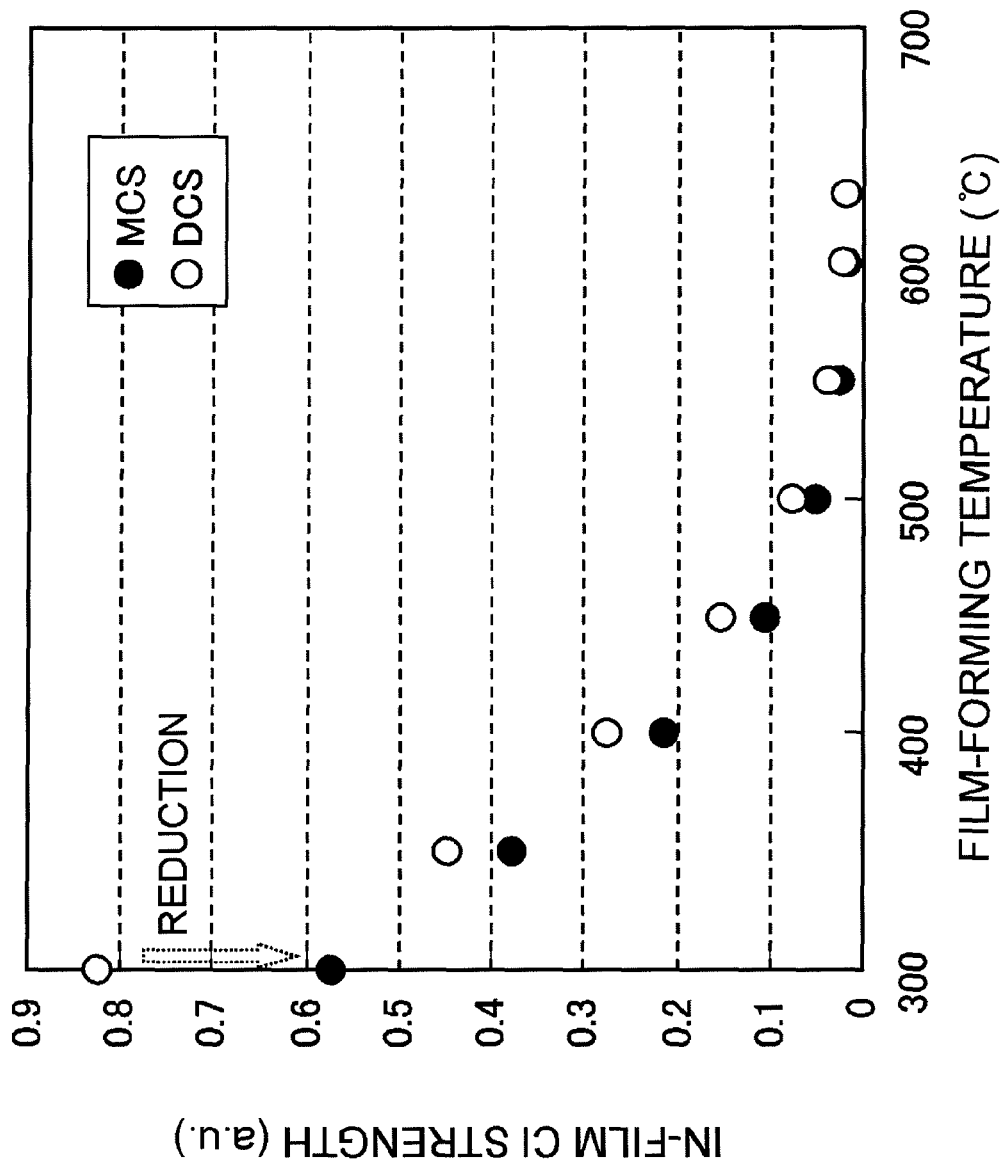
FIG. 12 shows a relationship between a film-forming temperature and in-film Cl strength of a silicon nitride film in Example 2.

FIG. 12 shows a relationship between a film-forming temperature and in-film chlorine strength of a SiN film. In FIG. 12, an abscissa denotes a temperature of a wafer, namely, a film-forming temperature (° C.), and an ordinate denotes an in-film chlorine strength (a.u.). In FIG. 12, a black circle (●) shows a case (Example) where a film was formed using MCS gas, and a white circle (○) shows a case (Comparative Example) where a film was formed using DCS gas. Also, since a tendency of an in-film chlorine content corresponds to a tendency of the in-film chlorine strength, the tendency of the in-film chlorine content may be understood based on data regarding the in-film chlorine strength.

Referring to FIG. 12, it can be seen that when a film-forming temperature was about 630° C. or less, a SiN film (Example) formed using MCS gas had a lower in-film chlorine strength than a SiN film (Comparative Example) formed using DCS gas. Also, it can be seen that this tendency became more marked as the film-forming temperature was reduced. That is, it can be seen that as the film-forming temperature decreased, a difference in in-film chlorine strength between the SiN films according to Example and Comparative Example increased. Also, it was confirmed that when the film-forming temperature exceeded about 630° C., there was no significant difference in in-film chlorine strength between the SiN films according to Example and Comparative Example. From the above description, it can be seen that a chlorine content of the SiN film could be reduced using MCS gas having a low chlorine content at a film-forming temperature of about 630° C. or less, and be further reduced with a reduction in the film-forming temperature.

Example 3

Next, Example 3 will be described.
In Example 3, a SiN film was formed on a wafer using the film-formation sequence according to the above-described first embodiment, and each of a film density and WER of the SiN film was measured. Also, when the SiN film was wet-etched, a 1% hydrogen fluoride-containing solution was used. MCS gas, DCS gas, or discipline (DS) gas was used as the silicon-containing gas. The film-formation temperature (wafer temperature) was adjusted within the range of about 350° C. and about 500° C. The remaining film-formation conditions (processing conditions of each step) were determined within the range of the processing conditions described in the above-described first embodiment. Obtained results are shown in FIGS. 13 and 14.

Figure 13:
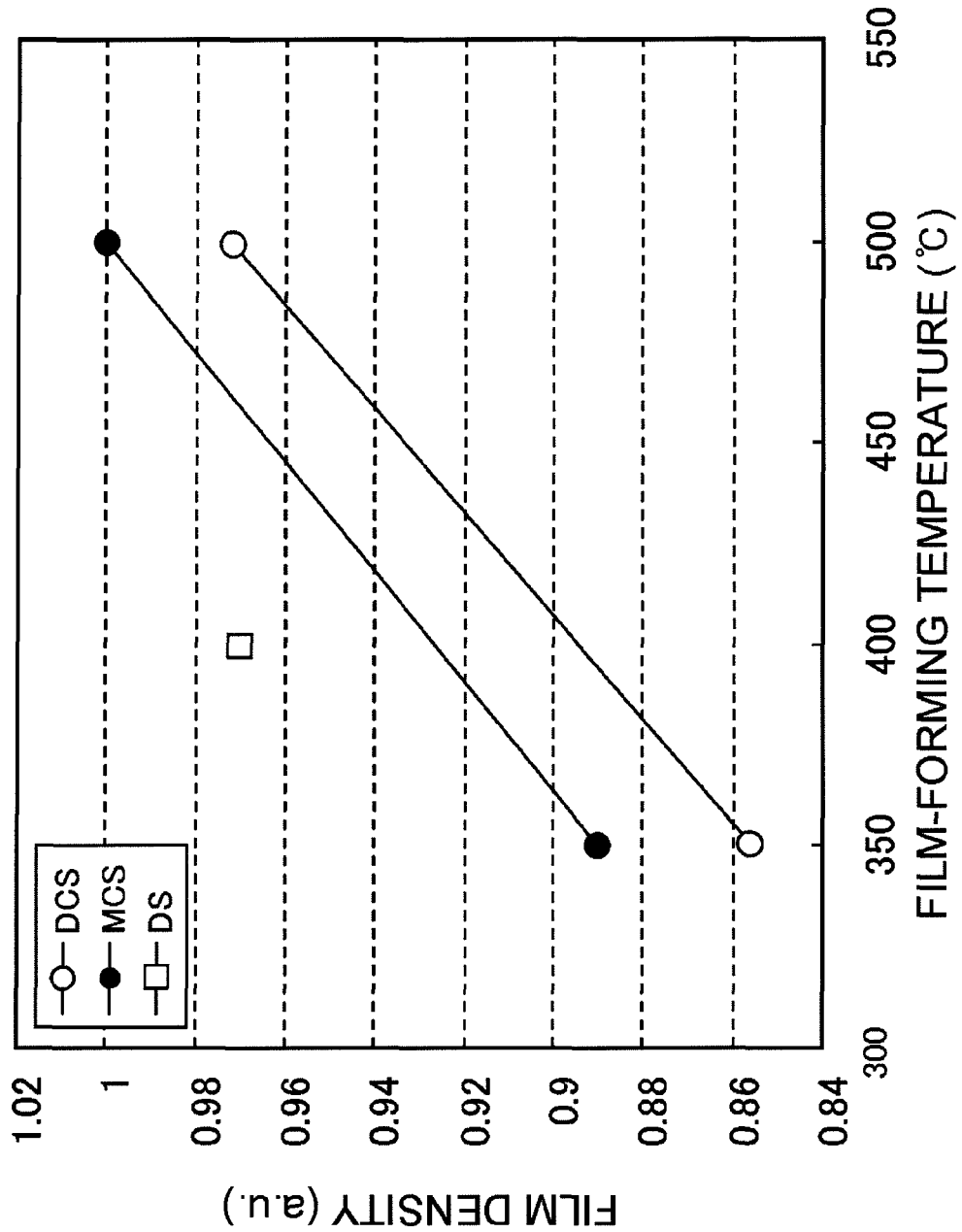
FIG. 13 shows a relationship between a film-forming temperature and film density of a silicon nitride film in Example 3.

FIG. 13 shows a relationship between a film-forming temperature and film density of a SiN film. In FIG. 13, an abscissa denotes a temperature of a wafer (i.e., a film-formation temperature (° C.)), and an ordinate denotes a film density (a.u.). In FIG. 13, a black circle (●) shows a case (Example) where a film was formed using MCS gas, a white circle (○) shows a case (Comparative Example) where a film was formed using DCS gas, and a white square (□) shows a case (Reference Example) where a film was formed using DS gas.

From FIG. 13, it can be seen that a SiN film (Example) formed using a low chlorine-content MCS gas has a higher film density (is denser) than the SiN film (Comparative Example) formed using DCS gas. Also, in consideration of the fact that the SiN film (Reference Example) formed using chlorine-free DS gas has the highest film density, it can be seen that reducing the amount of chlorine in the SiN film is effective in densifying the SiN film. In addition, it can also be seen that the SiN film may be densified by elevating the film-forming temperature.

Figure 14:
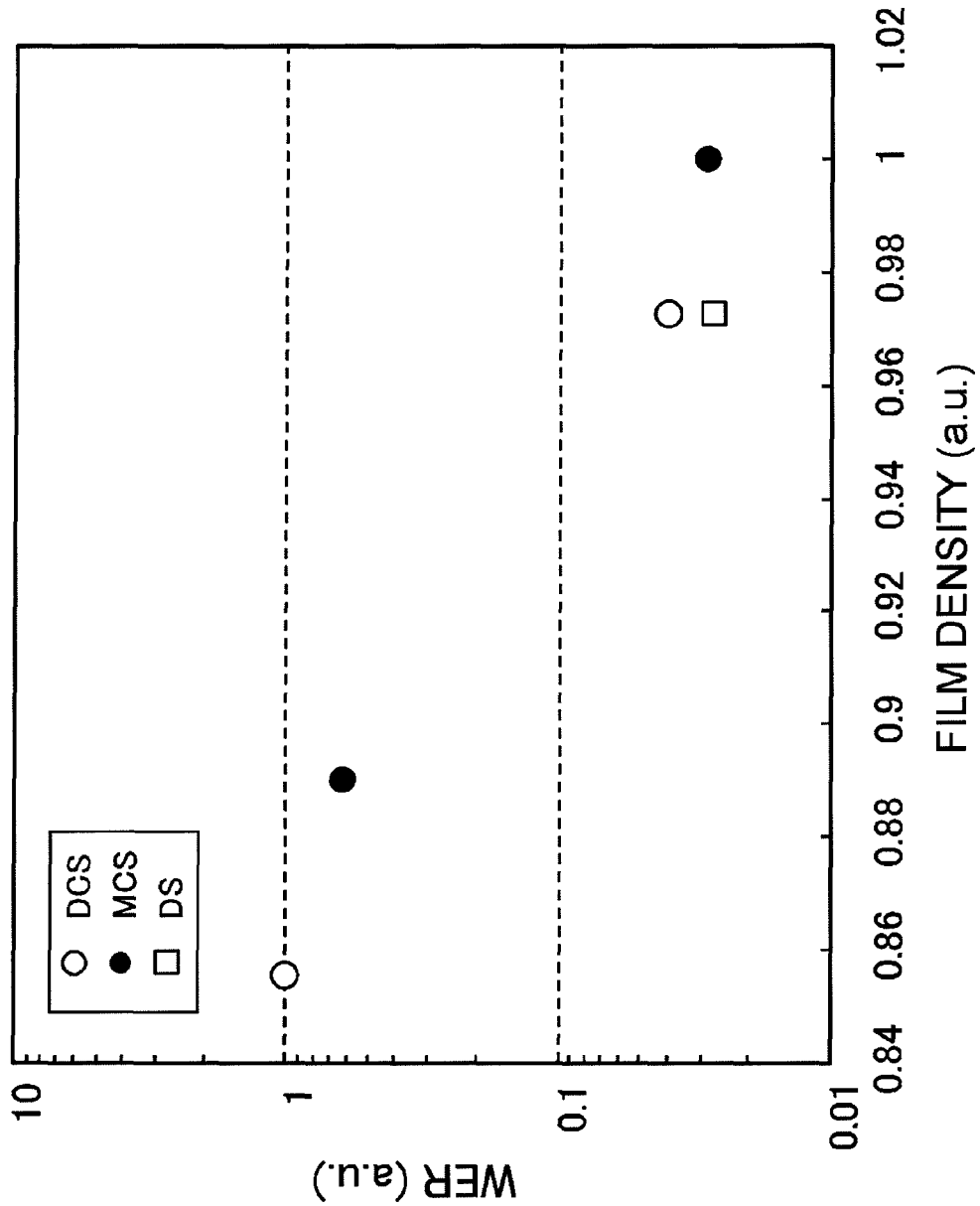
FIG. 14 shows a relationship between a film density and wet etch rate (WER) of a silicon nitride film in Example 3.

FIG. 14 shows a relationship between a film density and WER of a SiN film. In FIG. 14, an abscissa denotes a film density (a.u.), and an ordinate denotes a WER (a.u.) applied during wet etching using a 1% hydrogen fluoride-containing solution. In FIG. 14, a black circle (●) shows a case (Example) where a film is formed using MCS gas, a white circle (○) shows a case (Comparative Example) where a film is formed using DCS gas, and a white square (□) shows a case (Reference Example) where a film is formed using DS gas.

From FIG. 14, it can be seen that a WER may be reduced by increasing a film density of a SiN film. That is, by use of a low C-content silicon-containing gas, the SiN film may be densified, and a resistance of the SiN film to hydrogen fluoride may be increased.

Example 4

Next, Example 4 will now be described. In Example 4, a SiN film was formed on a wafer using a film-forming sequence according to Modified Example 1 of the second embodiment shown in FIGS. 9 and 10 in which step 5b is omitted and steps 4b and 6b are continuously performed to prepare three Samples (Samples 1 to 3). MCS gas was used as the source gas, $NH_3$ gas was used as the nitrogen-containing gas, $H_2$ gas was used as the first modification gas in the first modification process, and $N_2$ gas was used as the second modification gas in the second modification process. Also, when Samples 1 through 3 were prepared, a temperature of the wafer (film-forming temperature) was sequentially adjusted to temperatures of about 400° C., about 450° C., and about 500° C.

In addition, by use of the film-forming sequence according to the first embodiment shown in FIGS. 3 and 4, a SiN film was formed on the wafer to prepare three samples (Samples 4 through 6). Also, MCS gas was used as the source gas, and $NH_3$ gas was used as the nitrogen-containing gas. Furthermore, when Samples 4 through 6 were prepared, a temperature of the wafer (film-forming temperature) was sequentially adjusted to temperatures of about 400° C., about 450° C., and about 500° C.

In Reference Example, a SiN film was formed on a wafer using a film-forming sequence in which a cycle including a process of supplying DCS gas to the wafer accommodated in a processing chamber, a process of purging the inside of the processing chamber, a process of supplying plasma-excited $H_2$ gas to the wafer disposed in the processing chamber, a process of supplying plasma-excited $NH_3$ gas to the wafer disposed in the processing chamber, and a process of supplying plasma-excited $N_2$ gas to the wafer disposed in the processing chamber is repeated a predetermined number of times to prepare five Samples (Samples 7 to 11). Also, when Samples 7 to 11 were prepared, a temperature of the wafer (film-forming temperature) was sequentially adjusted to temperatures of about 350° C., about 400° C., about 450° C., about 500° C., and about 550° C.

In Reference Example, a SiN film was formed on a wafer using a film-forming sequence in which a cycle including a process of supplying DCS gas to the wafer accommodated in a processing chamber, a process of purging the inside of the processing chamber, a process of supplying plasma-excited $NH_3$ gas to the wafer disposed in the processing chamber, and a process of purging the inside of the processing chamber is repeated a predetermined number of times to prepare five Samples (Samples 12 to 16). Also, when Samples 12 to 16 were prepared, a temperature of the wafer (film-forming temperature) was sequentially adjusted to temperatures of about 350° C., about 400° C., about 450° C., about 500° C., and about 550° C.

In addition, all the samples were prepared using a substrate processing apparatus having two plasma generation units as shown in FIG. 6. In this case, the supply of a source gas (MCS gas or DCS gas) to the processing chamber was performed using a flash flow process. The remaining processing conditions were determined within the range of the processing conditions of each process described in the above-described embodiment.

A WER of a SiN film of each of the samples was measured. Also, the SiN film was wet etched using a 1% hydrogen fluoride-containing solution.

Figure 15:
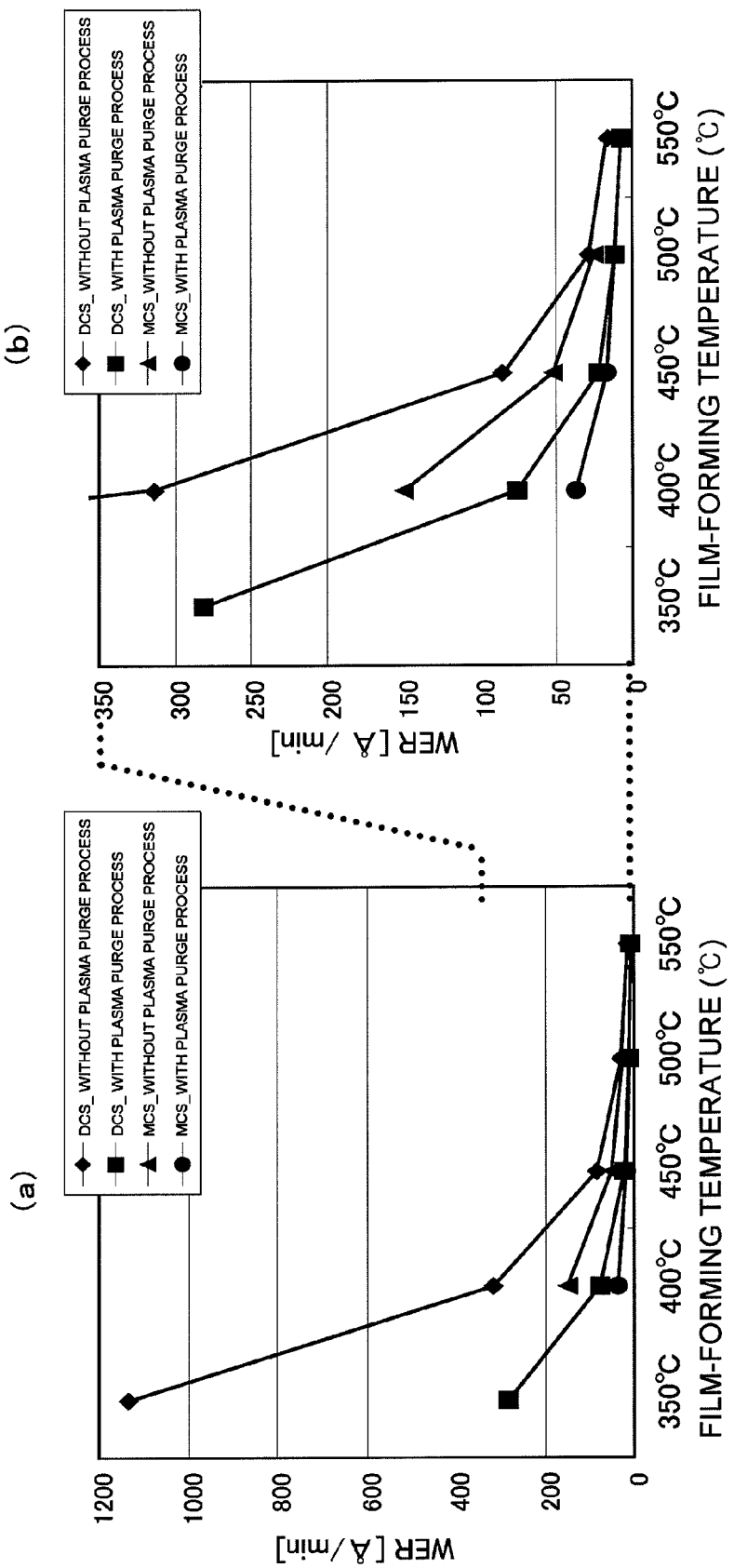
FIG. 15 shows a relationship between a film-forming temperature and WER of a silicon nitride film in Example 4.

(a) of FIG. 15 shows a relationship between a WER and film-forming temperature of a SiN film. In (a) of FIG. 15, an abscissa denotes a film-forming temperature used during the formation of a SiN film, and an ordinate denotes a WER (Å/min). Here, the WER refers to the average WER measured in the surface of a wafer. In (a) of FIG. 15, ● refers to Samples 1 through 3 (Example) in sequential order from the left, ▲ refers to Samples 4 through 6 (Example) in sequential order from the left, ■ refers to Samples 7 through 11 (Reference Example) in sequential order from the left, and ♦ refers to Samples 12 through 16 (Reference Example) in sequential order from the left. Also, (b) of FIG. 15 is a partial enlarged view of (a) of FIG. 15, which shows a case where the WER is about 350 Å/min or less.

Referring to (a) and (b) of FIG. 15, it can be seen that in a low-temperature region having a temperature of about 550° C. or less, each of SiN films of Samples 1 through 3 (Example) had a much lower WER and a much higher resistance to hydrogen fluoride, as compared with each of SiN films of Samples 4 through 6 (Example). It can be inferred that an active species (excited species) generated by plasma-exciting $H_2$ gas or $N_2$ gas using the first modification process and the second modification process may efficiently desorb impurities, such as hydrogen or chlorine, which are included in the silicon-containing layer or the SiN layer, to improve the film quality of the SiN film. Furthermore, it was confirmed that the SiN films of Samples 1 through 3 (Example) had good in-surface uniformity of WER, namely, good in-surface uniformity of film quality, and also had in-surface uniformity of film thickness.

Furthermore, referring to (a) and (b) of FIG. 15, it can be seen that in the low-temperature region having a temperature of about 550° C. or less, each of the SiN films of Samples 1 through 3 (Example) had a lower WER and a higher resistance to hydrogen fluoride, as compared with each of SiN films of Samples 7 through 16 (Reference Example). It can be inferred that a chlorine content of the SiN film may be reduced using MCS gas having a lower chlorine content than DCS gas as a source gas to improve a resistance of the SiN film to hydrogen fluoride. In addition, the effects of the MCS gas will be apparent from the fact that the SiN films of Samples 4 through 6 (Example) had lower WERs than the SiN films of Samples 12 through 16 (Reference Example).

From the above-described results, it can be seen that when MCS gas is used as a source gas, the first modification process is performed after the MCS gas supply process and before the $NH_3$ gas supply process, and the second modification process is performed after the $NH_3$ gas supply process and before the MCS gas supply process, a resistance (i.e., film quality) of the SiN film to hydrogen fluoride may be further improved. Also, when the MCS gas is used as the source gas, even if a time taken for a modification process is shortened, a SiN film having a good film quality may be formed so that film-forming productivity may be further enhanced.

<Preferred Aspects of the Present Invention>

Hereinafter, preferred aspects of the present invention will be supplementarily noted.

(Supplementary Note 1)

According to an aspect of the present invention, there is provided a method of manufacturing a semiconductor device, including: (a) supplying a monochloro-silane gas to a substrate disposed in a processing chamber; (b) supplying a plasma-excited hydrogen-containing gas to the substrate disposed in the processing chamber; (c) supplying a plasma-excited or heat-excited nitrogen-containing gas to the substrate disposed in the processing chamber; (d) supplying at least one of a plasma-excited nitrogen gas and a plasma-excited rare gas to the substrate disposed in the processing chamber; and (e) performing a cycle including the steps (a) through (d) a predetermined number of times to form a silicon nitride film on the substrate.

(Supplementary Note 2)

In the method of manufacturing a semiconductor device described in the supplementary note 1, the step (b) is performed during one of a period after the step (a) and a period after the step (c), and the step (d) is performed during one of the period after the step (a) and the period after the step (c) other than the one of the periods where the step (b) is performed.

(Supplementary Note 3)

In the method of manufacturing a semiconductor device described in the supplementary note 1, the step (b) is performed during one of a period where the nitrogen-containing gas is not supplied after the step (a) and a period where the monochloro-silane gas is not supplied after the step (c), and the step (d) is performed during one of the period where the nitrogen-containing gas is not supplied after the step (a) and the period where the monochloro-silane gas is not supplied after the step (c) other than the one of the periods where the step (b) is performed.

(Supplementary Note 4)

In the method of manufacturing a semiconductor device described in the supplementary note 1, the step (b) is performed during one of a period after the step (a) and before the step (c) and a period after the step (c) and before the step (a), and the step (d) is performed during one of the period after the step (a) and before the step (c) and the period after the step (c) and before the step (a) other than the one of the periods where the step (b) is performed.

(Supplementary Note 5)

In the method of manufacturing a semiconductor device described in the supplementary note 1, the step (a) includes forming a silicon-containing layer on the substrate, the step (b) includes subjecting the silicon-containing layer to a first modification process, the step (c) includes changing the silicon-containing layer subjected to the first modification process into a silicon nitride layer, and the step (d) includes subjecting the silicon nitride layer to a second modification process.

(Supplementary Note 6)

In the method of manufacturing a semiconductor device described in the supplementary note 1, the step (a) includes forming a silicon-containing layer on the substrate, the step (d) includes subjecting the silicon-containing layer to a first modification process, the step (c) includes changing the silicon-containing layer subjected to the first modification process into a silicon nitride layer, and the step (b) includes subjecting the silicon nitride layer to a second modification process.

(Supplementary Note 7)

In the method of manufacturing a semiconductor device described in the supplementary note 1, the step (a) includes forming a silicon-containing layer on the substrate, the step (c) includes changing the silicon-containing layer into a silicon nitride layer, the step (b) includes subjecting the silicon nitride layer to a first modification process, the step (d) includes subjecting the silicon nitride layer to a second modification process.

(Supplementary Note 8)

In the method of manufacturing a semiconductor device described in any one of the supplementary notes 1 through 7, the step (c) includes supplying the plasma-excited nitrogen-containing gas to the substrate disposed in the processing chamber.

(Supplementary Note 9)

According to another aspect of the present invention, there is provided a method of manufacturing a semiconductor device, including: (a) supplying a monochloro-silane gas to a substrate disposed in a processing chamber; (b) supplying a plasma-excited hydrogen-containing gas to the substrate disposed in the processing chamber; (c) supplying a plasma-excited nitrogen-containing gas to the substrate disposed in the processing chamber; (d) supplying at least one of a plasma-excited nitrogen gas and a plasma-excited rare gas to the substrate disposed in the processing chamber; and (e) performing a cycle including the steps (a) through (d) a predetermined number of times to form a silicon nitride film on the substrate.

(Supplementary Note 10)

In method of manufacturing a semiconductor device described in any one of the supplementary notes 1 to 9, the step (b) includes supplying the hydrogen-containing gas plasma-excited by a plurality of excitation units from each of the plurality of excitation units to the substrate disposed in the processing chamber.

(Supplementary Note 11)

In the method of manufacturing a semiconductor device described in any one of the supplementary notes 1 to 10, the step (d) includes supplying at least one of the nitrogen gas and the rare gas plasma-excited by a plurality of excitation units from each of the plurality of excitation units to the substrate disposed in the processing chamber.

(Supplementary Note 12)

In the method of manufacturing a semiconductor device described in any one of the supplementary notes 1 to 11, the step (c) includes supplying the nitrogen-containing gas plasma-excited or heat-excited by a plurality of excitation units from each of the plurality of excitation units to the substrate disposed in the processing chamber.

(Supplementary Note 13)

According to still another aspect of the present invention, there is provided a method of manufacturing a semiconductor device, including: (a) supplying a monochloro-silane gas to a substrate disposed in a processing chamber; (b) supplying a hydrogen-containing gas plasma-excited by a plurality of excitation units from each of the plurality of excitation units to the substrate disposed in the processing chamber; (c) supplying a nitrogen-containing gas plasma-excited by the plurality of excitation units from each of the plurality of excitation units to the substrate disposed in the processing chamber; (d) supplying at least one of a nitrogen gas plasma-excited by the plurality of excitation units and a rare gas plasma-excited by the plurality of excitation units from each of the plurality of excitation units to the substrate disposed in the processing chamber; and (e) performing a cycle including the steps (a) through (d) a predetermined number of times to form a silicon nitride film on the substrate.

(Supplementary Note 14)

In the method of manufacturing a semiconductor device described in any one of the supplementary notes 10 through 13, the plurality of excitation units are preferably disposed line-symmetrically with respect to an object axis corresponding to a straight line connecting the center of the substrate with the center of an exhaust port configured to exhaust the gas supplied into the processing chamber.

(Supplementary Note 15)

In the method of manufacturing a semiconductor device described in any one of the supplementary notes 10 through 13, the plurality of excitation units are preferably disposed opposite one another across the center of the substrates.

(Supplementary Note 16)

In the method of manufacturing a semiconductor device described in any one of the supplementary notes 10 through 13, preferably, the number of the plurality of excitation units is two, the two excitation units are disposed such that the two excitation units and an exhaust port configured to exhaust the gas supplied into the processing chamber constitute an isosceles triangle.

(Supplementary Note 17)

In the method of manufacturing a semiconductor device described in any one of the supplementary notes 1 through 16, the step (e) is preferably performed with the substrate rotated.

(Supplementary Note 18)

In the method of manufacturing a semiconductor device described in any one of the supplementary notes 1 through 17, the step (e) is performed with the substrate being at a temperature raging from 250° C. to 630° C.

(Supplementary Note 19)

In the method of manufacturing a semiconductor device described in any one of the supplementary notes 1 through 17, the step (e) is performed with the substrate being at a temperature raging from 300° C. to 500° C.

(Supplementary Note 20)

In the method of manufacturing a semiconductor device described in any one of the supplementary notes 1 through 19, preferably, the nitrogen-containing gas includes ammonia gas, the hydrogen-containing gas includes hydrogen gas, and the rare gas includes at least one of Ar gas and helium gas.

(Supplementary Note 21)

According to yet another aspect of the present invention, there is provided a method of processing a substrate, including: (a) supplying a monochloro-silane gas to a substrate disposed in a processing chamber; (b) supplying a plasma-excited hydrogen-containing gas to the substrate disposed in the processing chamber; (c) supplying a plasma-excited or heat-excited nitrogen-containing gas to the substrate disposed in the processing chamber; (d) supplying at least one of a plasma-excited nitrogen gas and a plasma-excited rare gas to the substrate disposed in the processing chamber; and (e) performing a cycle including the steps (a) through (d) a predetermined number of times to form a silicon nitride film on the substrate.

(Supplementary Note 22)

According to yet another aspect of the present invention, there is provided a substrate processing apparatus including: a processing chamber configured to accommodate a substrate; a first gas supply system configured to supply a monochloro-silane gas to a substrate accommodated in the processing chamber; a second gas supply system configured to supply a nitrogen-containing gas to a substrate accommodated in the processing chamber; a third gas supply system configured to supply a hydrogen-containing gas to a substrate accommodated in the processing chamber; a fourth gas supply system configured to supply at least one of a nitrogen gas and a rare gas to a substrate accommodated in the processing chamber; an excitation unit configured to plasma-excite or heat-excite a gas; and a controller configured to control the first gas supply system, the second gas supply system, the third gas supply system, the fourth gas supply system and the excitation unit to perform a cycle including supplying the monochloro-silane gas to a substrate accommodated in the processing chamber, supplying the hydrogen-containing gas plasma-excited by the excitation unit to the substrate accommodated in the processing chamber, supplying the nitrogen-containing gas plasma-excited or heat-excited by the excitation unit to the substrate accommodated in the processing chamber and supplying at least one of the nitrogen gas and the rare gas plasma-excited by the excitation unit to the substrate accommodated in the processing chamber to form a silicon nitride film on the substrate.

(Supplementary Note 23)

According to yet another aspect of the present invention, there is provided a program for causing a computer to execute the steps of: (a) supplying a monochloro-silane gas to a substrate disposed in a processing chamber; (b) supplying a plasma-excited hydrogen-containing gas to the substrate disposed in the processing chamber; (c) supplying a plasma-excited or heat-excited nitrogen-containing gas to the substrate disposed in the processing chamber; (d) supplying at least one of a plasma-excited nitrogen gas and a plasma-excited rare gas to the substrate disposed in the processing chamber; and (e) performing a cycle including the steps (a) through (d) a predetermined number of times to form a silicon nitride film on the substrate.

(Supplementary Note 24)

According to yet another aspect of the present invention, there is provided a computer-readable recording medium recording a program for causing a computer to execute the steps of: (a) supplying a monochloro-silane gas to a substrate disposed in a processing chamber; (b) supplying a plasma-excited hydrogen-containing gas to the substrate disposed in the processing chamber; (c) supplying a plasma-excited or heat-excited nitrogen-containing gas to the substrate disposed in the processing chamber; (d) supplying at least one of a plasma-excited nitrogen gas and a plasma-excited rare gas to the substrate disposed in the processing chamber; and (e) performing a cycle including the steps (a) through (d) a predetermined number of times to form a silicon nitride film on the substrate.

What is claimed is:

1. A method of manufacturing a semiconductor device, comprising:
   (a) supplying monochlorosilane gas from one or more nozzles to a substrate disposed in a processing chamber;
   (b) supplying a hydrogen-containing gas plasma-excited by one or more excitation units from each of the one or more excitation units to the substrate disposed in the processing chamber;
   (c) supplying a nitrogen-containing gas plasma-excited or heat-excited by one or more excitation units from each of the one or more excitation units to the substrate disposed in the processing chamber;
   (d) supplying at least one selected from the group consisting of a $N_2$ gas plasma-excited by one or more excitation units and a rare gas plasma-excited by one or more excitation units from each of the one or more excitation units to the substrate disposed in the processing chamber; and
   (e) performing a cycle comprising the steps (a) through (d) a predetermined number of times to form a silicon nitride film on the substrate.

2. The method according to claim 1, wherein the step (b) is performed during one of a period after the step (a) and a period after the step (c), and the step (d) is performed during one of the period after the step (a) and the period after the step (c) other than the one of the periods where the step (b) is performed.

3. The method according to claim 1, wherein the step (b) is performed during one of a period where the nitrogen-containing gas is not supplied after the step (a) and a period where the monochlorosilane gas is not supplied after the step (c), and the step (d) is performed during one of the period where the nitrogen-containing gas is not supplied after the step (a) and the period where the monochlorosilane gas is not supplied after the step (c) other than the one of the periods where the step (b) is performed.

4. The method according to claim 1, wherein the step (b) is performed during one of a period after the step (a) and before the step (c) and a period after the step (c) and before the step (a), and the step (d) is performed during one of the period after the step (a) and before the step (c) and the period after the step (c) and before the step (a) other than the one of the periods where the step (b) is performed.

5. The method according to claim 1, wherein the step (a) comprises forming a silicon-containing layer on the substrate, the step (b) comprises subjecting the silicon-containing layer to a first modification process, the step (c) comprises changing the silicon-containing layer subjected to the first modification process into a silicon nitride layer, and the step (d) comprises subjecting the silicon nitride layer to a second modification process.

6. The method according to claim 1, wherein the step (a) comprises forming a silicon-containing layer on the substrate, the step (d) comprises subjecting the silicon-containing layer to a first modification process, the step (c) comprises changing the silicon-containing layer subjected to the first modification process into a silicon nitride layer, and the step (b) comprises subjecting the silicon nitride layer to a second modification process.

7. The method according to claim 1, wherein the step (a) comprises forming a silicon-containing layer on the substrate, the step (c) comprises changing the silicon-containing layer into a silicon nitride layer, the step (b) comprises subjecting the silicon nitride layer to a first modification process, the step (d) comprises subjecting the silicon nitride layer to a second modification process.

8. The method according to claim 1, wherein the step (c) comprises supplying the nitrogen-containing gas plasma-excited by one or more excitation units from each of the one or more excitation units to the substrate disposed in the processing chamber.

9. The method according to claim 1, wherein the step (a) comprises supplying the monochlorosilane gas from each of a plurality of nozzles to the substrate disposed in the processing chamber.

10. The method according to claim 1, wherein the step (b) comprises supplying the hydrogen-containing gas plasma-excited by a plurality of excitation units from each of the plurality of excitation units to the substrate disposed in the processing chamber.

11. The method according to claim 1, wherein the step (d) comprises supplying at least one selected from the group consisting of the nitrogen gas and the rare gas plasma-excited by a plurality of excitation units from each of the plurality of excitation units to the substrate disposed in the processing chamber.

12. The method according to claim 1, wherein the step (c) comprises supplying the nitrogen-containing gas plasma-excited or heat-excited by a plurality of excitation units from each of the plurality of excitation units to the substrate disposed in the processing chamber.

13. The method according to claim 1, wherein the step (e) is performed with the substrate being at a temperature ranging from 250° C. to 630° C.

14. The method according to claim 1, wherein the step (e) is performed with the substrate being at a temperature ranging from 300° C. to 500° C.

15. The method according to claim 1, wherein the step (e) is performed with the substrate rotated.

16. The method according to claim 1, wherein the nitrogen-containing gas includes ammonia gas, the hydrogen-containing gas includes hydrogen gas, and the rare gas includes at least one of argon gas and helium gas.

17. A method of manufacturing a semiconductor device, comprising:
(a) supplying monochlorosilane gas from one or more nozzles to a substrate disposed in a processing chamber;
(b) supplying a hydrogen-containing gas plasma-excited by one or more excitation units from each of the one or more excitation units to the substrate disposed in the processing chamber;
(c) supplying a nitrogen-containing gas plasma-excited by one or more excitation units from each of the one or more excitation units to the substrate disposed in the processing chamber;
(d) supplying at least one selected from the group consisting of a $N_2$ gas plasma-excited by one or more excitation units and a rare gas plasma-excited by one or more excitation units from each of the one or more excitation units to the substrate disposed in the processing chamber; and
(e) performing a cycle comprising the steps (a) through (d) a predetermined number of times to form a silicon nitride film on the substrate.

18. A substrate processing apparatus comprising:
a processing chamber configured to accommodate a substrate;
a first gas supply system configured to supply monochlorosilane gas from one or more nozzles to a substrate accommodated in the processing chamber;
a second gas supply system configured to supply a nitrogen-containing gas to a substrate accommodated in the processing chamber;
a third gas supply system configured to supply a hydrogen-containing gas to a substrate accommodated in the processing chamber;
a fourth gas supply system configured to supply at least one selected from the group consisting of a $N_2$ gas and a rare gas to a substrate accommodated in the processing chamber;
one or more excitation units configured to plasma-excite or heat-excite a gas; and
a controller configured to control the first gas supply system, the second gas supply system, the third gas supply system, the fourth gas supply system and the excitation unit to perform a cycle comprising supplying the monochlorosilane gas from the one or more nozzles to a substrate accommodated in the processing chamber, supplying the hydrogen-containing gas plasma-excited by one or more excitation units from each of the one or more excitation units to the substrate accommodated in the processing chamber, supplying the nitrogen-containing gas plasma-excited or heat-excited by one or more excitation units from each of the one or more excitation units to the substrate accommodated in the processing chamber and supplying at least one selected from the group consisting of the $N_2$ gas plasma-excited by one or more excitation units and the rare gas plasma-excited by one or more excitation units from each of the one or more excitation units to the substrate accommodated in the processing chamber to form a silicon nitride film on the substrate.

19. A non-transitory computer-readable recording medium storing a program for causing a computer to execute the steps of:
(a) supplying monochlorosilane gas from one or more nozzles to a substrate disposed in a processing chamber;
(b) supplying a hydrogen-containing gas plasma-excited by one or more excitation units from each of the one or more excitation units to the substrate disposed in the processing chamber;
(c) supplying a nitrogen-containing gas plasma-excited or heat-excited by one or more excitation units from each of the one or more excitation units to the substrate disposed in the processing chamber;
(d) supplying at least one selected from the group consisting of a $N_2$ gas-plasma-excited by one or more excitation units and a rare gas plasma-excited by one or more excitation units from each of the one or more excitation units to the substrate disposed in the processing chamber; and (e) performing a cycle comprising the steps (a) through (d) a predetermined number of times to form a silicon nitride film on the substrate.

* * * * *